(12) United States Patent
Iwato et al.

(10) Patent No.: US 7,442,490 B2
(45) Date of Patent: *Oct. 28, 2008

(54) POSITIVE RESIST COMPOSITION AND PATTERN FORMATION METHOD USING THE POSITIVE RESIST COMPOSITION

(75) Inventors: Kaoru Iwato, Haibara-gun (JP); Kunihiko Kodama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 62 days.

This patent is subject to a terminal disclaimer.

(21) Appl. No.: 11/723,144

(22) Filed: Mar. 16, 2007

(65) Prior Publication Data
US 2008/0044760 A1 Feb. 21, 2008

(30) Foreign Application Priority Data
Mar. 17, 2006 (JP) ............................. 2006-075068

(51) Int. Cl.
G03C 1/76 (2006.01)
G03C 1/492 (2006.01)
G03C 1/494 (2006.01)
G03C 5/00 (2006.01)

(52) U.S. Cl. .................... 430/270.1; 430/325; 430/326; 430/905; 430/910

(58) Field of Classification Search .............. 430/270.1, 430/325, 326, 905, 910
See application file for complete search history.

(56) References Cited

U.S. PATENT DOCUMENTS

2007/0134589 A1* 6/2007 Yamamoto et al. ........ 430/270.1
2007/0134590 A1* 6/2007 Fukuhara et al. ......... 430/270.1

FOREIGN PATENT DOCUMENTS

| EP | 1 515 186 A | 3/2005 |
| EP | 1 783 550 A | 5/2007 |
| JP | 2004-012545 A | 1/2004 |
| WO | 2004/067592 A | 8/2004 |

* cited by examiner

*Primary Examiner*—Geraldina Visconti
(74) *Attorney, Agent, or Firm*—Sughrue Mion, PLLC

(57) ABSTRACT

A positive resist composition comprising: a resin which increases solubility in an alkali developing solution by an action of an acid and comprises a repeating unit containing a lactone structure and a cyano group and a repeating unit containing a first acid-decomposable group; a resin which increases solubility in an alkali developing solution by an action of an acid and comprises a repeating unit containing a lactone structure and a cyano group and a repeating unit containing a second acid-decomposable group which is different from the first acid-decomposable group; a compound which generates an acid upon irradiation of an actinic ray or a radiation; and a solvent.

9 Claims, 1 Drawing Sheet

US 7,442,490 B2

POSITIVE RESIST COMPOSITION AND PATTERN FORMATION METHOD USING THE POSITIVE RESIST COMPOSITION

FIELD OF THE INVENTION

The present invention relates to a positive resist composition which reacts upon irradiation of an actinic ray or radiation to change its property and a pattern formation method using the positive resist composition. More particularly, it relates to a positive resist composition for use in the production process of semiconductor, for example, IC, in the production of circuit substrate for liquid crystal or thermal head, in other photofabrication processes, or in lithographic printing plates or acid-hardenable compositions and a pattern formation method using the positive resist composition.

BACKGROUND OF THE INVENTION

A chemical amplification type resist composition is a pattern formation material in which an acid is generated in the exposed area upon irradiation of an actinic ray or radiation, for example, a far ultraviolet ray, and solubility in a developing solution between the exposed area and unexposed area is differentiated by a reaction using the acid as a catalyst, whereby the pattern is formed on a substrate.

In case of using a KrF excimer laser as a light source for the exposure, since a system mainly composed of a resin having as a basic skeleton, poly(hydroxystyrene) which has a small absorption in a region of 248 nm is used, a good pattern is formed with high sensitivity and high resolution. Thus, the system is superior to a conventional naphthoquinonediazide/novolac resin system.

On the other hand, when a light source having a shorter wavelength, for example, an ArF excimer laser (193 nm) is used for the exposure, since the aromatic group-containing compound essentially has a large absorption in a region of 193 nm, the above-described chemical amplification resist composition is still insufficient.

Therefore, a resist composition for the ArF excimer laser containing a resin including an alicyclic hydrocarbon structure has been developed.

With respect to an acid-decomposable resin which is the main constituting component of the chemical amplification type resist composition, various improvements have also been made. For instance, a positive resist composition containing two kinds of acid-decomposable resins having acid-decomposable groups different from each other is described in JP-A-2004-12545 (the term "JP-A" as used herein means an "unexamined published Japanese patent application").

However, it has been further desired to satisfy all of line edge roughness (LWR), exposure latitude (EL), PEB temperature dependency and pattern collapsing in a higher order.

SUMMARY OF THE INVENTION

Therefore, an object of the invention is to provide a positive resist composition capable of satisfying all of the line edge roughness (LWR), exposure latitude (EL), PEB temperature dependency and pattern collapsing in a higher order and a pattern formation method using the positive resist composition.

The invention includes the following constructions.

(1) A positive resist composition comprising (Aa) a resin which increases solubility in an alkali developing solution by an action of an acid and comprises a repeating unit containing a lactone structure and a cyano group and a repeating unit containing a first acid-decomposable group, (Ab) a resin which increases solubility in an alkali developing solution by an action of an acid and comprises a repeating unit containing a lactone structure and a cyano group and a repeating unit containing a second acid-decomposable group which is different from the first acid-decomposable group, (B) a compound which generates an acid upon irradiation of an actinic ray or radiation, and (C) a solvent.

(2) A pattern formation method comprising a step of forming a resist film using the positive resist composition as described in (1), a step of exposing the resist film, and a step of developing the exposed resist film.

According to the invention, a positive resist composition capable of satisfying all of the line edge roughness (LWR), exposure latitude (EL), PEB temperature dependency and pattern collapsing in a higher order and a pattern formation method using the positive resist composition can be provided.

DESCRIPTION OF REFERENCE NUMERALS AND SIGNS

11: Wafer stage

DETAILED DESCRIPTION OF THE INVENTION

Figure 1:
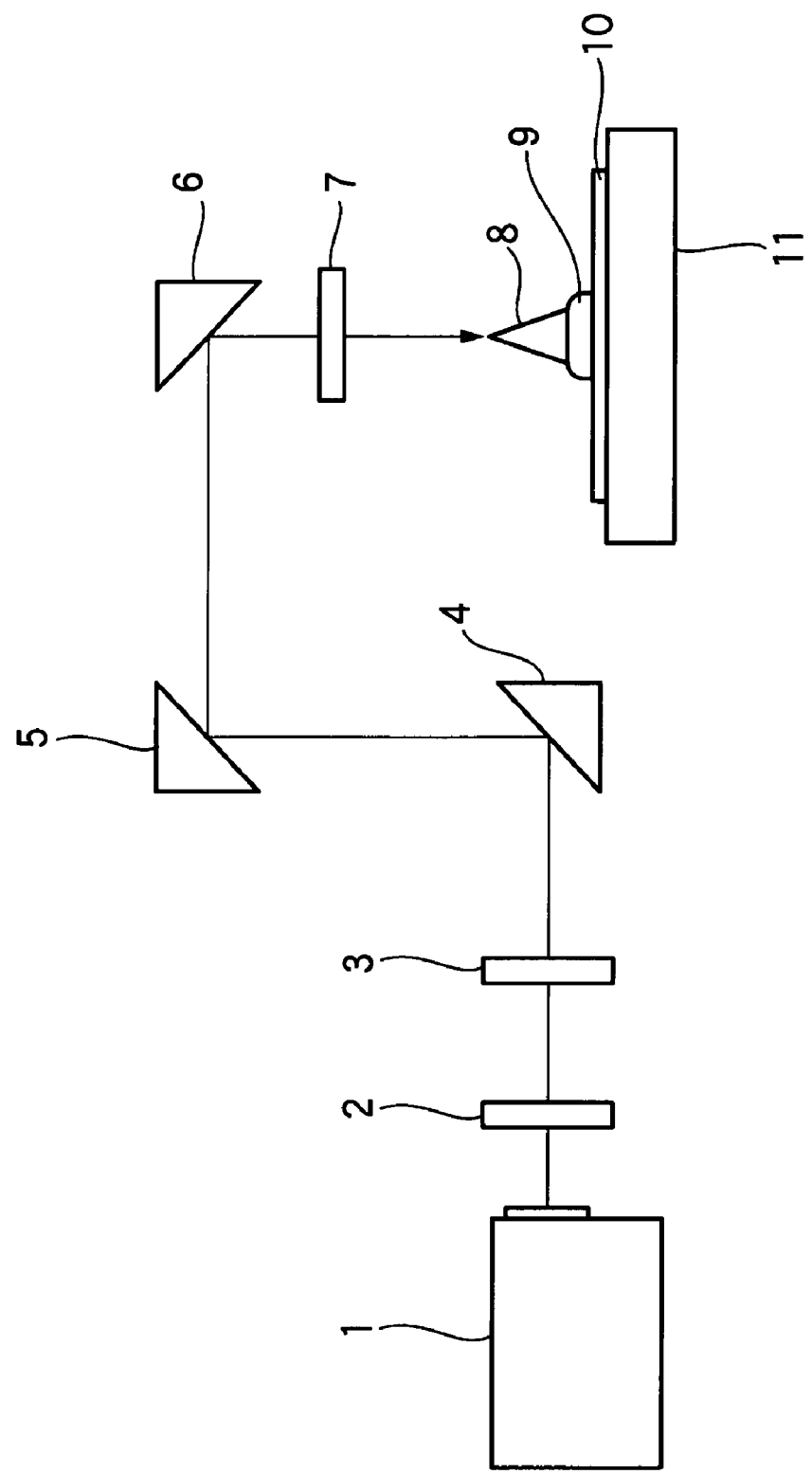
FIG. 1 is a schematic view of a two-beam interference exposure experimental apparatus.

The present invention will be described in more detail below.

With respect to the description of a group (atomic group) in the specification, the term "group", which is not particularly referred to whether it is substituted or not, means and includes both an unsubstituted group and a substituted group. For instance, the description of an "alkyl group" includes not only an alkyl group having no substituent (an unsubstituted alkyl group) but also an alkyl group having a substituent (a substituted alkyl group).

[1] (Aa) Resin which increases solubility in an alkali developing solution by an action of an acid and comprises a repeating unit containing a lactone structure and a cyano group and a repeating unit containing a first acid-decomposable group and (Ab) Resin which increases solubility in an alkali developing solution by an action of an acid and comprises a repeating unit containing a lactone structure and a cyano group and a repeating unit containing a second acid-decomposable group which is different from the first acid-decomposable group:

The positive resist composition according to the invention includes a resin (hereinafter also referred to as a "resin (Aa)") which increases solubility in an alkali developing solution by an action of an acid and comprises a repeating unit (hereinafter also referred to as a "repeating unit (A1)") containing a lactone structure and a cyano group and a repeating unit containing a first acid-decomposable group and a resin (hereinafter also referred to as a "resin (Ab)") which increases solubility in an alkali developing solution by an action of an acid and comprises a repeating unit (A1) containing a lactone structure and a cyano group and a repeating unit containing a second acid-decomposable group which is different from the first acid-decomposable group.

Hereinafter, the resin (Aa) and the resin (Ab) are collectively referred to as a "resin (A)".

The lactone structure included in the repeating unit (A1) includes, for example, 4-membered to 15-membered lactone structures. From the stand point of polarity and stability, 4-membered to 8-membered lactone structures are preferable, 5-membered to 6-membered lactone structures are more preferable and a 5-membered lactone structure is particularly preferable.

Specific examples of the lactone structure are set forth below, but the invention should not be construed as being limited thereto.

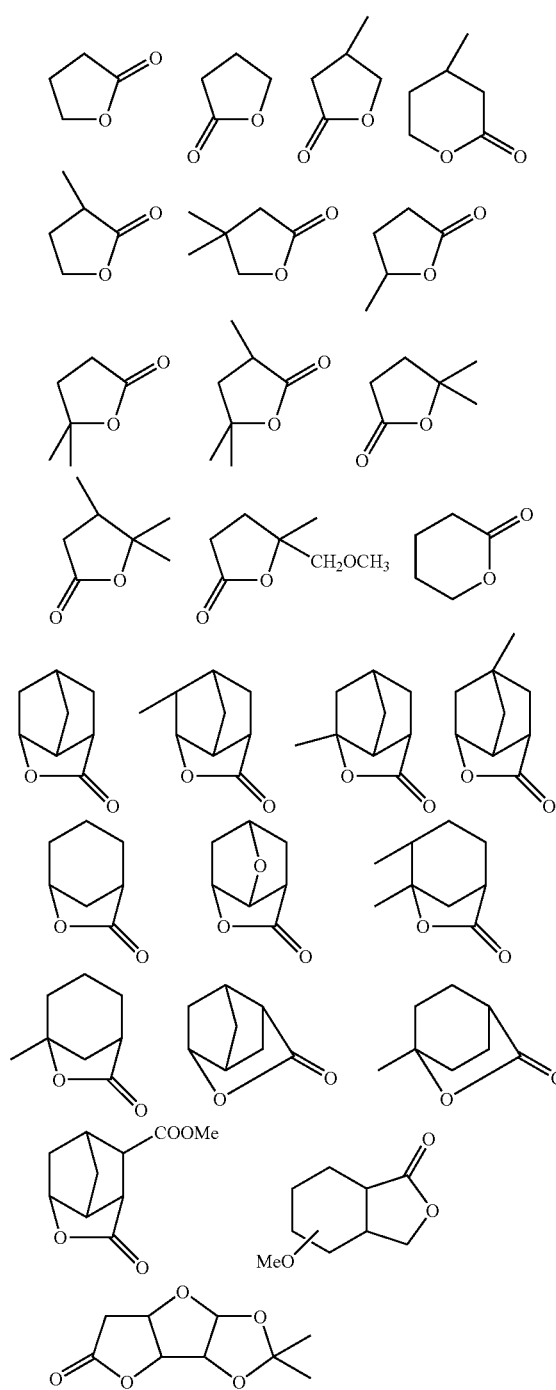

-continued

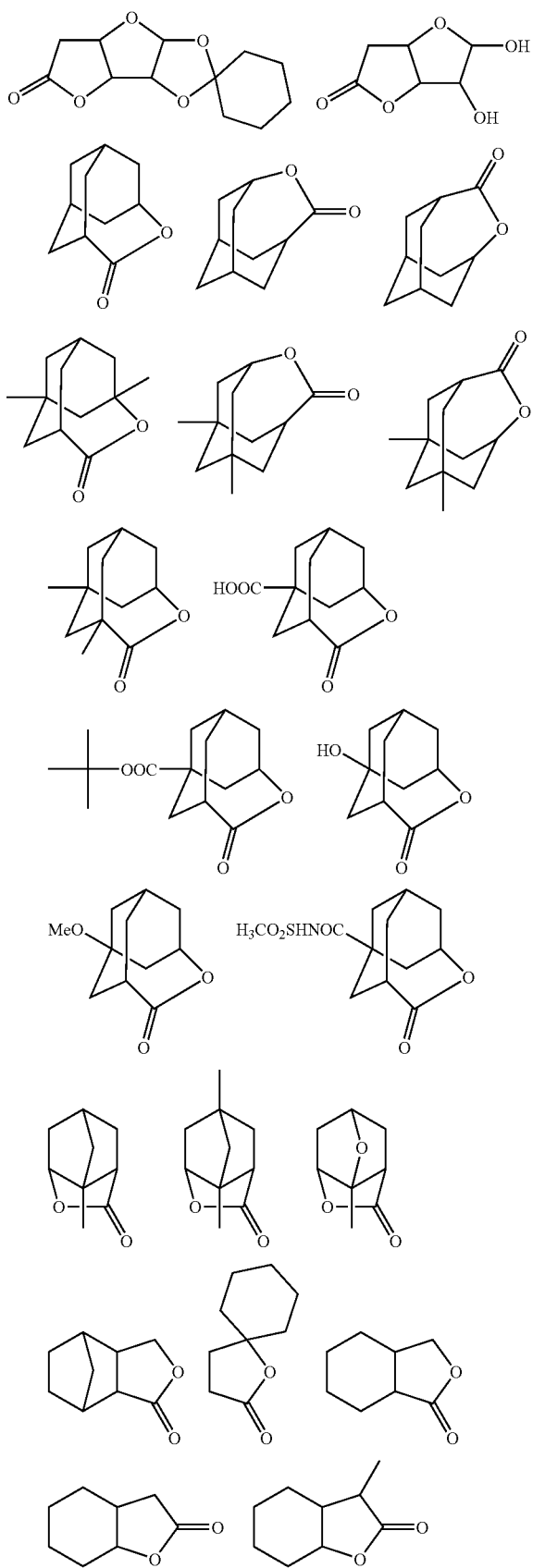

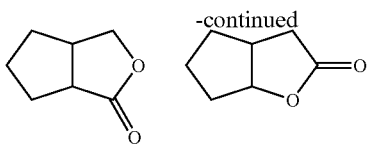

A number of the cyano group included in the repeating unit (A1) is preferably from 1 to 4, more preferably from 1 to 2.

It is also preferred that the cyano group is directly connected to the lactone ring.

As a preferable embodiment of the repeating unit (A1), a repeating unit having the structure represented by formula (A2) shown below is exemplified.

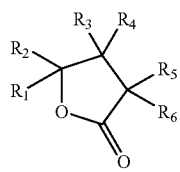

(A2)

In formula (A2), $R_1$ to $R_6$ each independently represents a hydrogen atom or a substituent, provided that at least one of $R_1$ to $R_6$ represents a cyano group or a substituent having a cyano group. Alternatively, at least two of $R_1$ to $R_6$ may be combined with each other to form a cyclic structure.

The repeating unit having the structure represented by formula (A2) contains the structure represented by formula (A2) in which at least one of hydrogen atoms in $R_1$ to $R_6$ (that is, the hydrogen atoms represented by $R_1$ to $R_6$ and hydrogen atoms included in the substituents represented by $R_1$ to $R_6$) is replaced by a bond to connect to any of the main chain or side chain of the repeating unit.

The substituent represented by any one of $R_1$ to $R_6$ is not particularly limited and includes, for example, an alkyl group, an alkenyl group, an alkynyl group, a cycloalkyl group, an aryl group, an amino group, an amido group, a ureido group, a urethane group, a hydroxy group, a carboxyl group, a halogen atom, an alkoxy group, an aryloxy group, an alkylthio group, an acyl group, an acyloxy group, an alkoxycarbonyl group and a nitro group, in addition to the cyano group. The substituent may further have a substituent. The substituents on the same carbon atom, that is, $R_1$ and $R_2$, $R_3$ and $R_4$, and $R_5$ and $R_6$ may be bonded to the same atom (for example, a carbon atom, an oxygen atom, a sulfur atom or a nitrogen atom) to form a double bond as typified by a C=C, C=O, C=S or C=N bond. Alternatively, appropriate two of $R_1$ to $R_6$ may be connected with the same atom to form a 3-membered cyclic structure or a bridged cyclic structure.

The substituent having a cyano group represented by any one of $R_1$ to $R_6$ is not particularly limited and includes the substituents described above in which a cyano group is substituted. A number of the carbon atoms included in the substituent having a cyano group is preferably 12 or less, more preferably 6 or less, exclusive of the carbon atoms of the cyano group.

It is particularly preferred that the cyano group is directly connected to the lactone ring.

As another preferable embodiment of the repeating unit (A1), a repeating unit having the structure represented by formula (A3) shown below is exemplified.

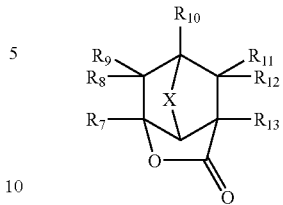

(A3)

In formula (A3), $R_7$ to $R_{13}$ each independently represents a hydrogen atom or a substituent. Alternatively, at least two of $R_7$ to $R_{13}$ may be combined with each other to form a cyclic structure.

X represents —O—, —S—, —N($R^N$)$_2$— or —(CH$_2$)$_n$—, wherein $R^N$ represents a hydrogen atom or a substituent, and n represents 1 or 2.

However, at least one of $R_7$ to $R_{13}$ and X represents a cyano group or a substituent having a cyano group.

The repeating unit having the structure represented by formula (A3) contains the structure represented by formula (A3) in which at least one of hydrogen atoms in $R_7$ to $R_{13}$ and X (that is, the hydrogen atoms represented by $R_7$ to $R_{13}$ and hydrogen atoms included in the substituents represented by $R_7$ to $R_{13}$ and X) is replaced by a bond to connect to any of the main chain or side chain of the repeating unit.

As a preferable embodiment of the repeating unit having the structure represented by formula (A2), a repeating unit having the structure represented by formula (A4) shown below is exemplified.

(A4)

In formula (A4), $R_{14}$ and $R_{15}$ each independently represents a hydrogen atom or a substituent.

$L_2$ represents a connecting group for forming a cyclic structure.

Alternatively, at least two of $R_{14}$, $R_{15}$ and $L_2$ may be combined with each other to form a cyclic structure.

However, at least one of $R_{14}$, $R_{15}$ and $L_2$ represents a cyano group or a substituent having a cyano group.

The repeating unit having the structure represented by formula (A4) contains the structure represented by formula (A4) in which at least one of hydrogen atoms in $R_{14}$, $R_{15}$ and $L_2$ (that is, the hydrogen atoms represented by $R_{14}$ and $R_{15}$ and hydrogen atoms included in the substituents represented by $R_{14}$, $R_{15}$ and $L_2$) is replaced by a bond to connect to any of the main chain or side chain of the repeating unit.

As another preferable embodiment of the repeating unit having the structure represented by formula (A2), a repeating unit having the structure represented by formula (A5) shown below is exemplified.

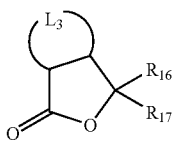

(A5)

In formula (A5), $R_{16}$ and $R_{17}$ each independently represents a hydrogen atom or a substituent.

$L_3$ represents a connecting group for forming a cyclic structure.

Alternatively, at least two of $R_{16}$, $R_{17}$ and $L_3$ may be combined with each other to form a cyclic structure.

However, at least one of $R_{16}$, $R_{17}$ and $L_3$ represents a cyano group or a substituent having a cyano group.

The repeating unit having the structure represented by formula (A5) contains the structure represented by formula (A5) in which at least one of hydrogen atoms in $R_{16}$, $R_{17}$ and $L_3$ (that is, the hydrogen atoms represented by $R_{16}$ and $R_{17}$ and hydrogen atoms included in the substituents represented by $R_{16}$, $R_{17}$ and $L_3$) is replaced by a bond to connect to any of the main chain or side chain of the repeating unit.

As another preferable embodiment of the repeating unit (A1), a repeating unit having the structure represented by formula (A6) shown below is exemplified.

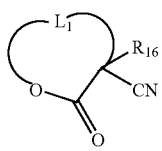

(A6)

In formula (A6), $R_{18}$ represents a hydrogen atom or a substituent.

$L_1$ represents a connecting group for forming a lactone structure by connecting the carbon atom at the 2-position of the lactone ring with the oxygen atom of the lactone ring.

Alternatively, $R_{18}$ and $L_1$ may be combined with each other to form a cyclic structure.

The repeating unit having the structure represented by formula (A6) contains the structure represented by formula (A6) in which at least one of hydrogen atoms in $R_{18}$ and $L_1$ (that is, the hydrogen atom represented by $R_{18}$ and hydrogen atoms included in the substituents represented by $R_{18}$ and $L_1$) is replaced by a bond to connect to any of the main chain or side chain of the repeating unit.

As a preferable embodiment of the repeating unit having the structure represented by formula (A6), a repeating unit having the structure represented by formula (A7) shown below is exemplified.

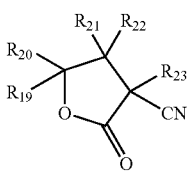

(A7)

In formula (A7), $R_{19}$ to $R_{23}$ each independently represents a hydrogen atom or a substituent. Alternatively, at least two of $R_{19}$ to $R_{23}$ may be combined with each other to form a cyclic structure.

The repeating unit having the structure represented by formula (A7) contains the structure represented by formula (A7) in which at least one of hydrogen atoms in $R_{19}$ to $R_{23}$ (that is, the hydrogen atoms represented by $R_{19}$ to $R_{23}$ and hydrogen atoms included in the substituents represented by $R_{19}$ to $R_{23}$) is replaced by a bond to connect to any of the main chain or side chain of the repeating unit.

The repeating unit having the structure represented by any one of formulae (A2) to (A7) includes, for example, a repeating unit in which the structure represented by any one of formulae (A2) to (A7) is connected to an appropriate position of the repeating unit shown below. Specifically, at least one of hydrogen atoms in the structure represented by any one of formulae (A2) to (A7) is eliminated to form a bond and the bond is connected to the repeating unit shown below by eliminating an appropriate hydrogen atom of the repeating unit.

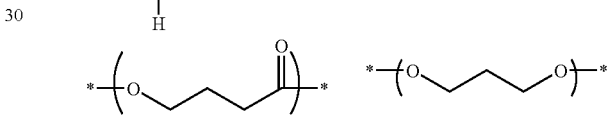

The repeating unit (A1) is preferably a repeating unit derived from an ethylenic double bond and more preferably a repeating unit derived from a (meth)acrylic acid derivative.

As a more preferable embodiment of the repeating unit having the structure represented by any one of formulae (A2) to (A7), a repeating unit represented by formula (A8) shown below is exemplified.

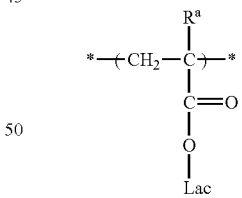

(A8)

In formula (A8), $R^a$ represents a hydrogen atom or an alkyl group having from 1 to 4 carbon atoms which may have a substituent. Lac represents any one of the structures represented by formulae (A2) to (A7).

The substituent defined in any one of formulae (A3) to (A7) is same as that defined in formula (A2).

The substituent having a cyano group defined in any one of formulae (A3) to (A7) is same as that defined in formula (A2).

The cyclic structure formed by connecting at least two substituents with each other in any one of formulae (A2) to (A7) includes, for example, a 5-membered ring and a 6-membered ring. The cyclic structure may have a substituent, for example, a cyano group.

The cyclic structures formed by $L_2$ and $L_3$ in formulae (A4) and (A5) respectively include, for example, a norbornane structure. The cyclic structure may have a substituent, for example, a cyano group.

Specific examples of the repeating unit (A1) are set forth below, but the invention should not be construed as being limited thereto. In each of the specific examples, the methyl group may be replaced by a hydrogen atom.

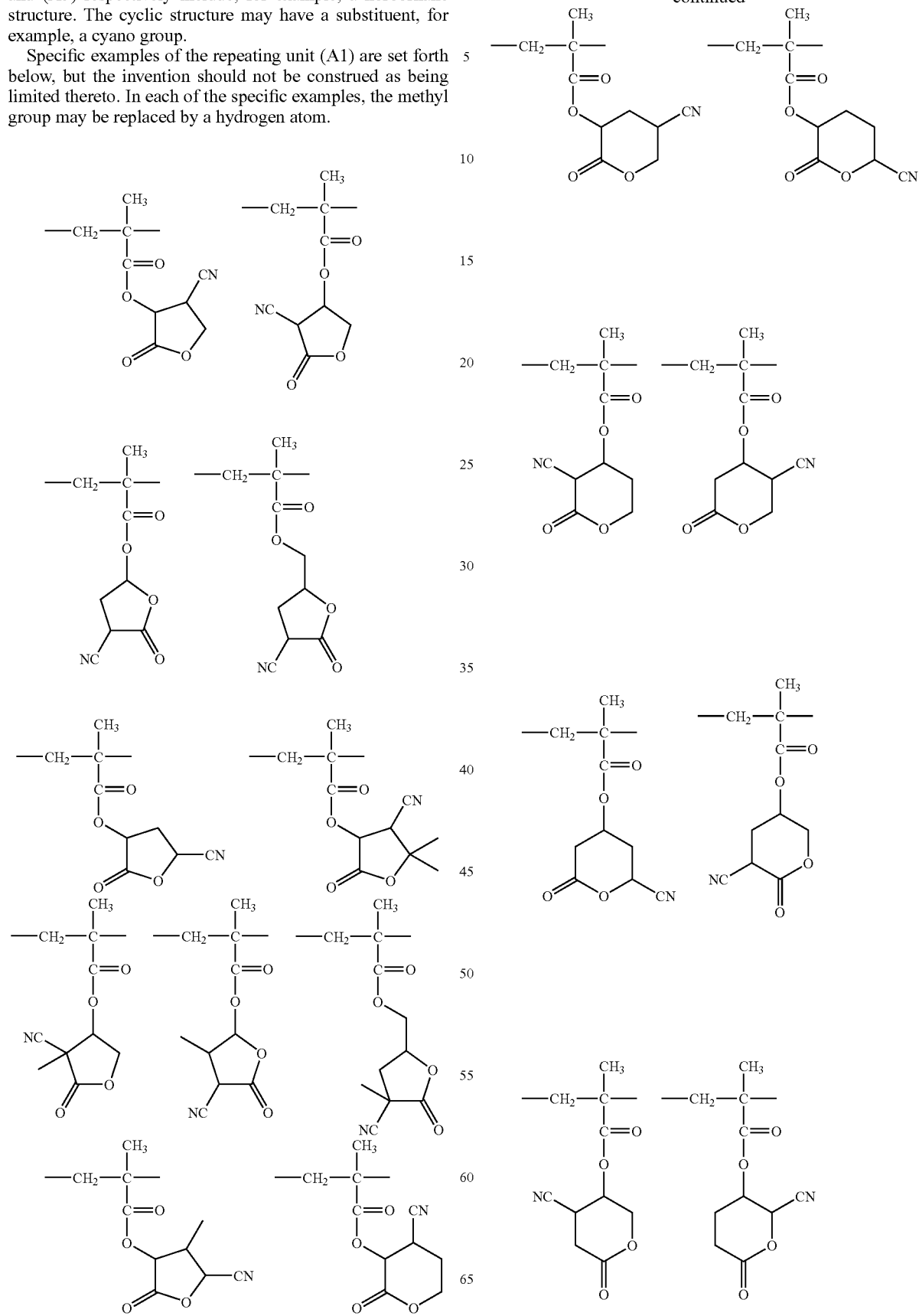

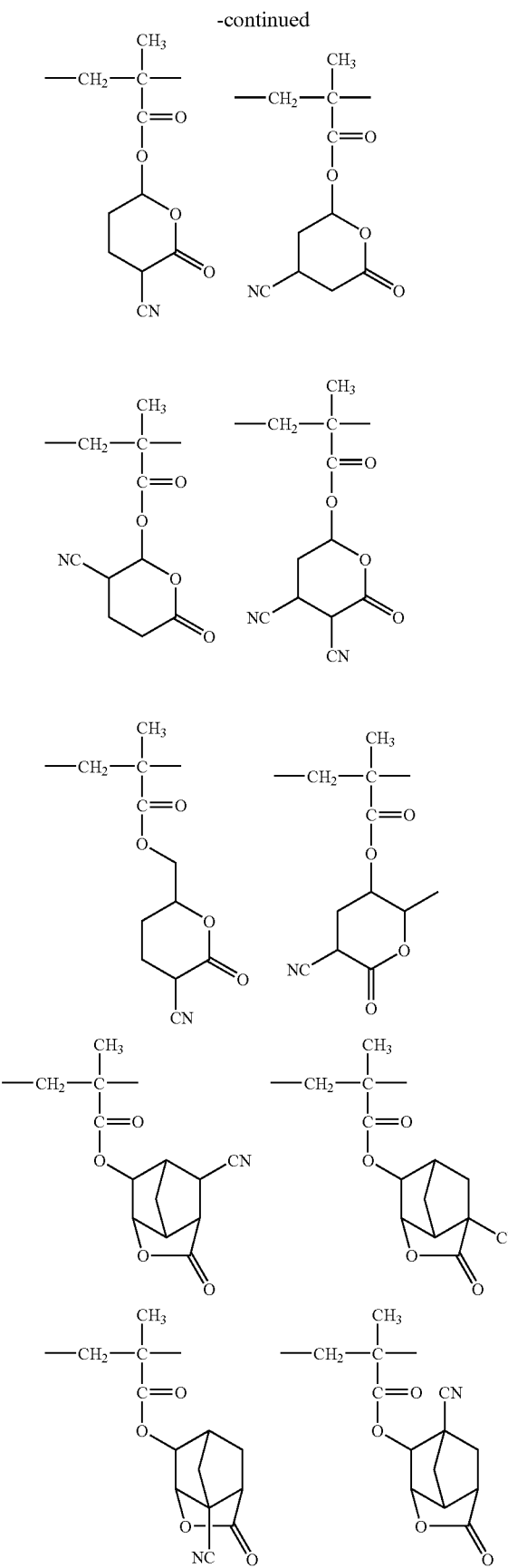
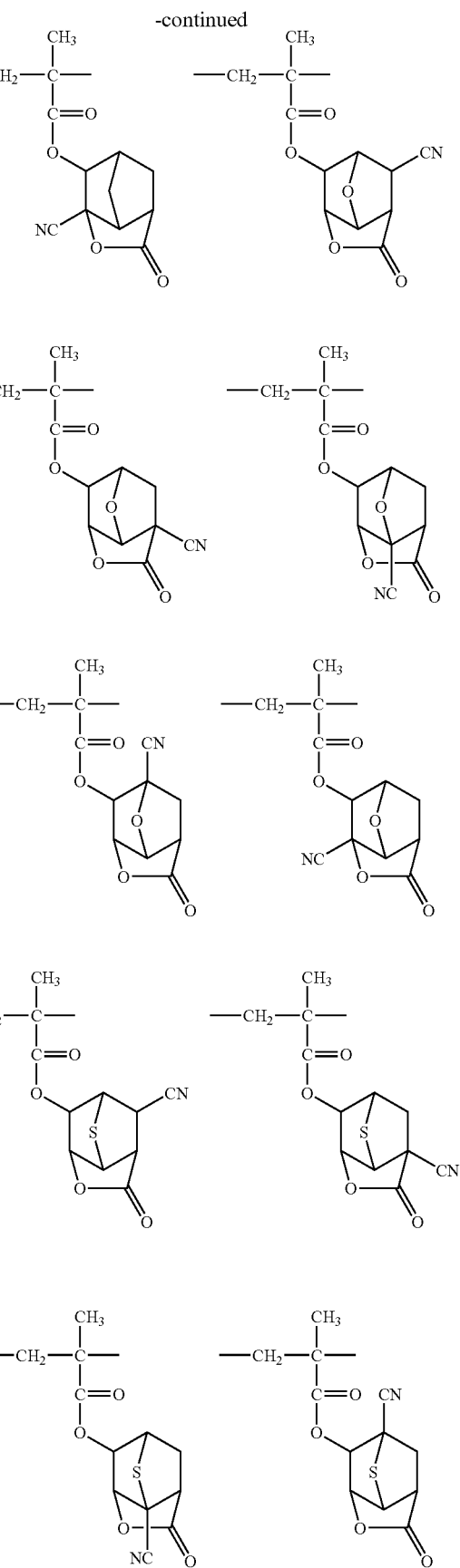

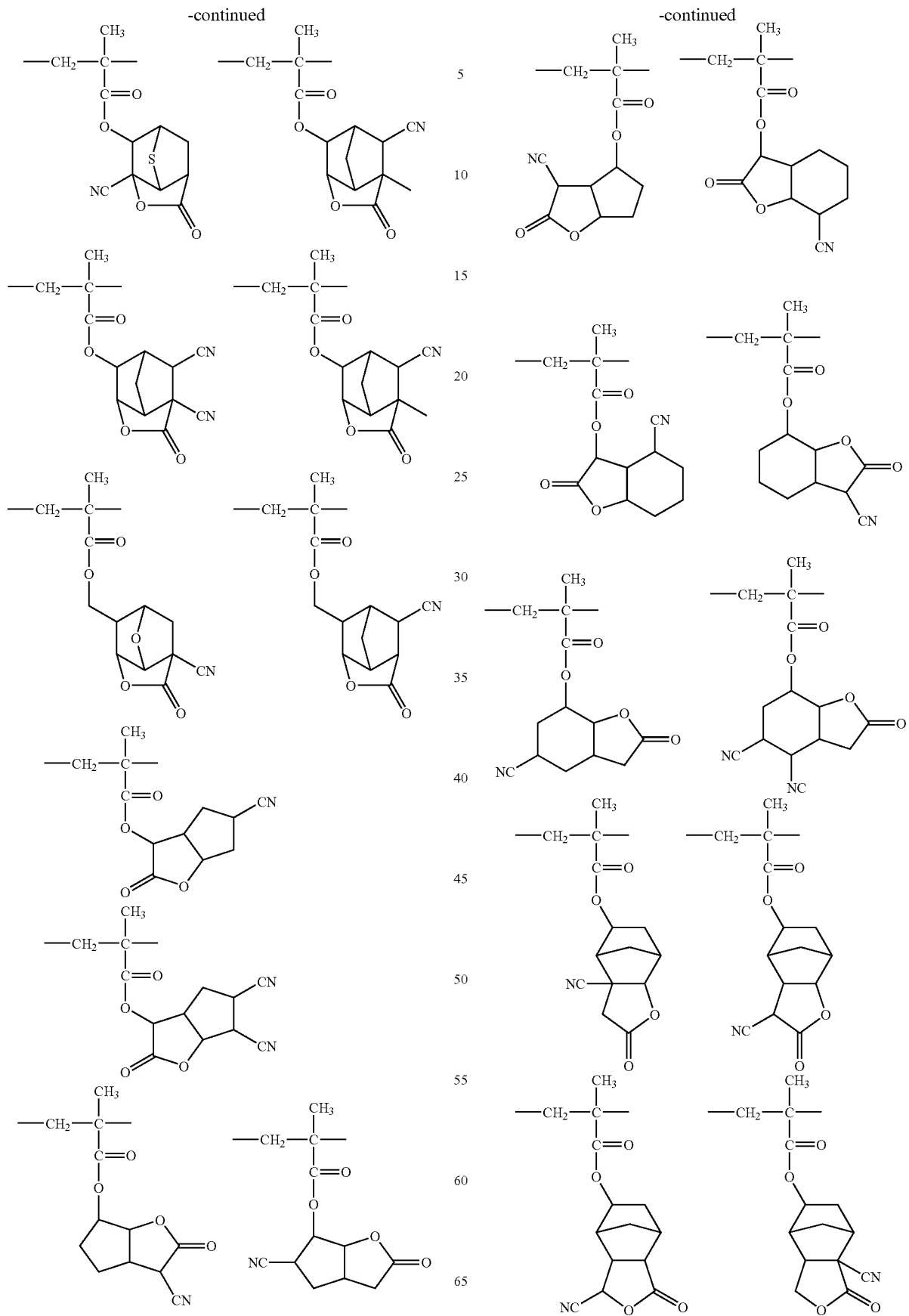

-continued
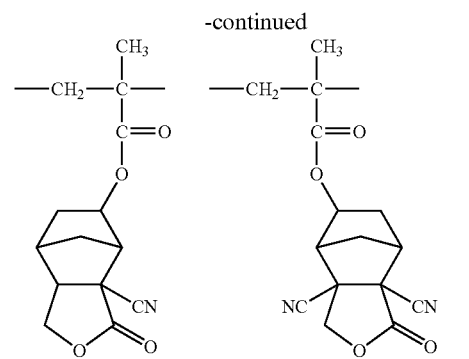
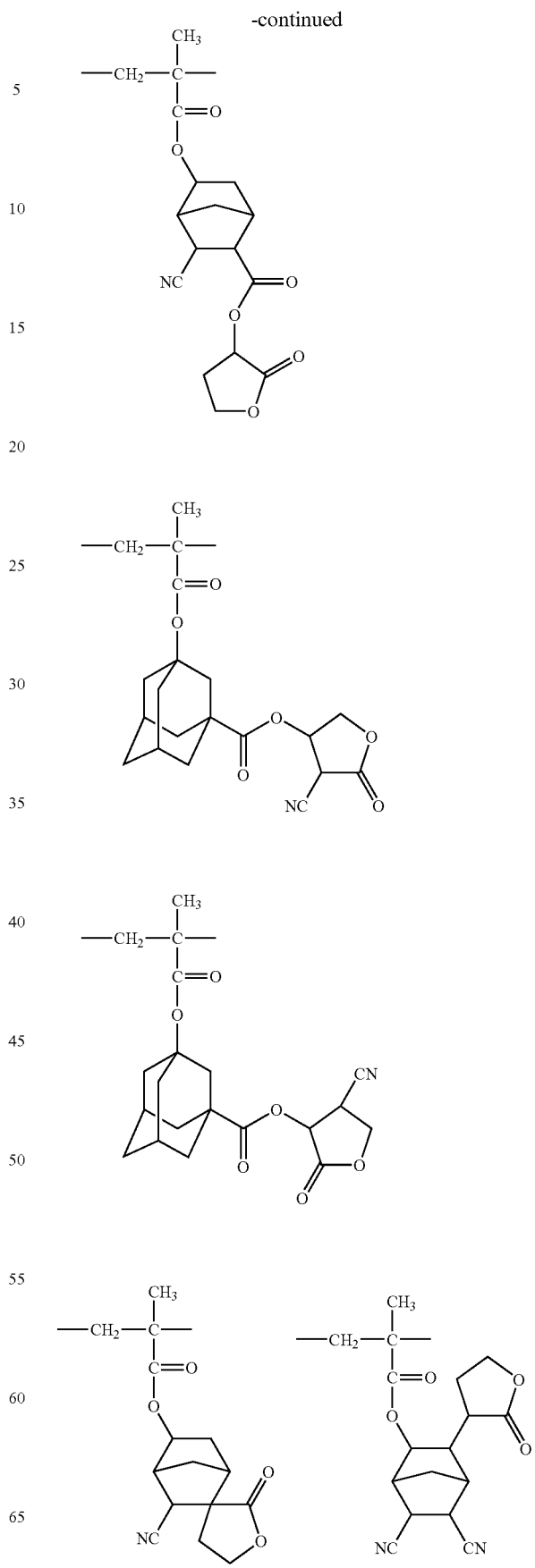

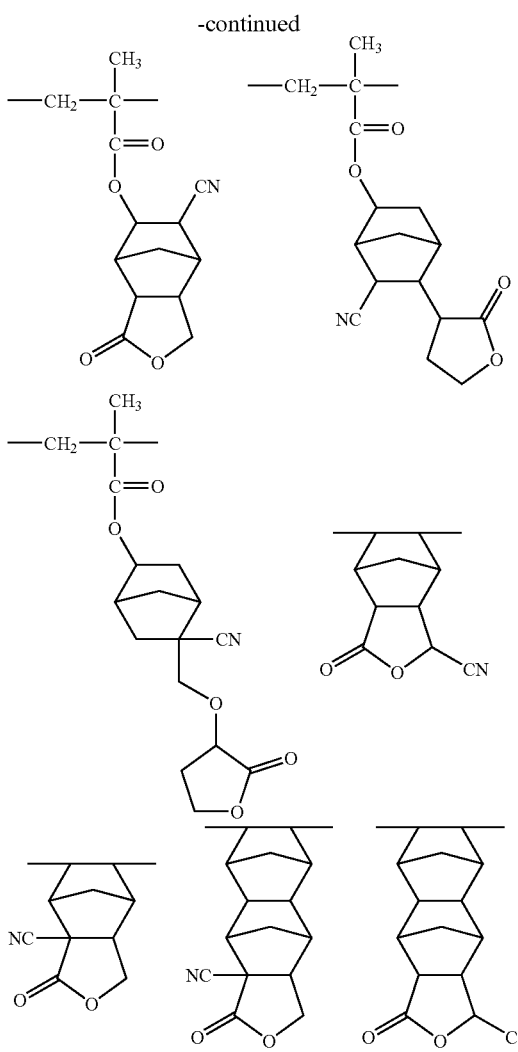

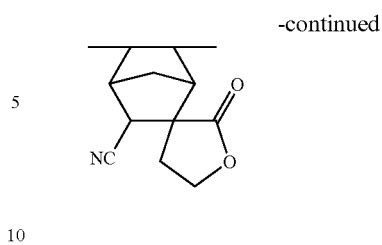

A synthesis method of a monomer corresponding to the repeating unit (A1) is not particularly limited, and methods of synthesizing the monomer through an alkenylcarboxylic acid (Intermediate I) or a ester thereof (Intermediate II) according to Scheme 1 or Scheme 2 shown below are preferable. The epoxidation in Scheme 1 may be carried out by a conventional method using mCPBA, dimethyl dioxylane or the like to synthesize an epoxycarboxylic acid. In case of starting from Intermediate II, after the epoxidation, the ester group is hydrolyzed to obtain the epoxycarboxylic acid. The resulting epoxycarboxylic acid (epoxide) is treated under an acid condition to derive a hydroxylactone and to the hydroxy group formed is added a polymerizable group thereby efficiently synthesizing the monomer. The monomerization may be carried out using an appropriate esterification reaction.

The lactonation in Scheme 2 may be carried out using a conventional lactonation reaction. For instance, a halo-lactonation reaction, preferably a iodo-lactonation reaction is exemplified. The iodine atom of the resulting iodo-lactone is substituted with a substituent having a polymerizable group to derive the monomer.

Scheme 1

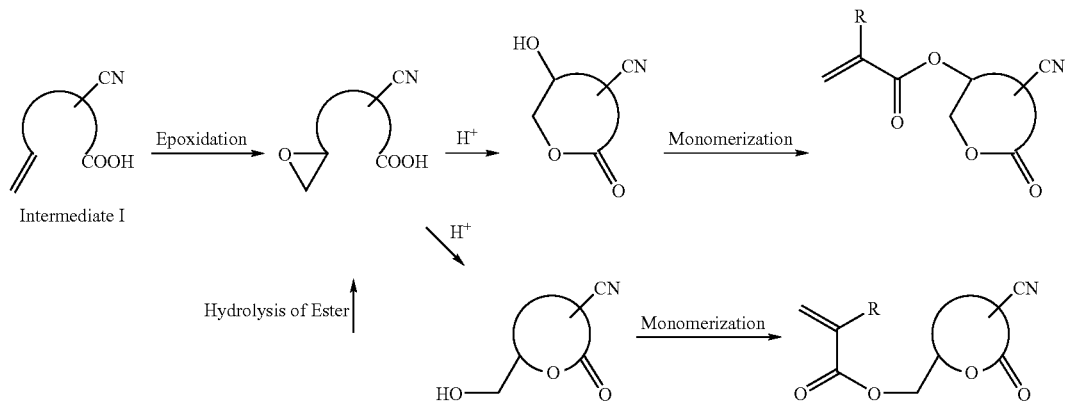

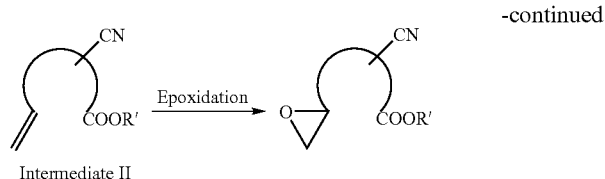

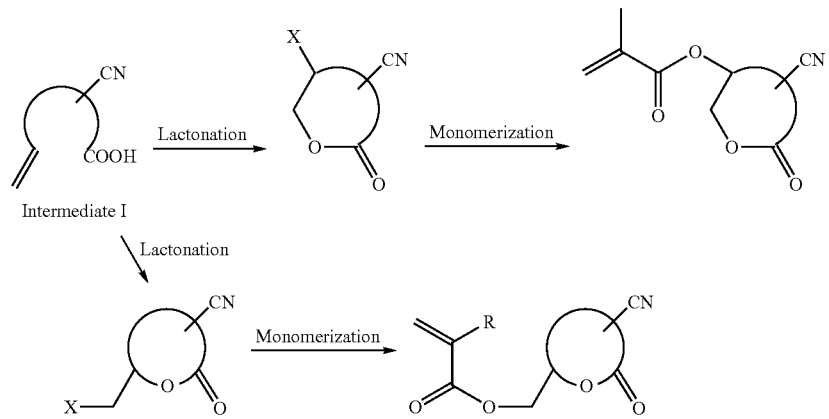

The resin (A) is a resin which increases solubility in an alkali developing solution by an action of an acid and contains a group (hereinafter also referred to as an "acid-decomposable group"), which is decomposed with an acid to generate an alkali-soluble group, in the main chain or side chain thereof, or both the main chain and side chain thereof. Among them, a resin having the acid-decomposable group in the side chain thereof is more preferable.

The acid-decomposable group preferably includes a group in which a hydrogen atom of the alkali-soluble group, for example, a —COOH group or an —OH group is substituted with a group capable of being released with an acid.

The group capable of being released with an acid includes, for example, —C($R_{36}$)($R_{37}$)($R_{38}$), —C($R_{36}$)($R_{37}$)(O$R_{39}$) and —C($R_{01}$)($R_{02}$)(O$R_{39}$).

In the above formulae, $R_{36}$ to $R_{39}$ each independently represents an alkyl group, a cycloalkyl group, an aryl group, an aralkyl group or an alkenyl group. Alternatively, $R_{36}$ and $R_{37}$ or $R_{36}$ and $R_{39}$ may be connected with each other to from a ring.

$R_{01}$ and $R_{02}$ each independently represent a hydrogen atom, an alkyl group, a cycloalkyl group, an aryl group, an aralkyl group or an alkenyl group.

According to the invention, the acid-decomposable group is preferably an acetal group or a tertiary ester group.

According to the invention, the first acid-decomposable group included in the resin (Aa) is different from the second acid-decomposable group included in the resin (Ab).

In order to be different in the acid-decomposable group, for example, the groups capable of being released with an acid in the acid-decomposable groups are different from each other.

In order to be different in the group capable of being released with an acid, for example, in the groups capable of being released with an acid represented by formula (pI) shown below, $R_{11}$ or Z is different from each other, or in the groups capable of being released with an acid represented by formula (pII) shown below, at least one of $R_{12}$, $R_{13}$ and $R_{14}$ is different from each other. It is preferred that one of the resin (Aa) and the resin (Ab) includes the group capable of being released with an acid represented by formula (pI) and the other includes the group capable of being released with an acid represented by formula (pII).

According to the invention, it is preferable that a number of the carbon atoms included in the group capable of being released with an acid is 10 or less in at least one of the resin (Aa) and the resin (Ab), and more preferable that numbers of the carbon atoms included in the groups capable of being released with an acid are 10 or less in both of the resin (Aa) and the resin (Ab), respectively.

In the case wherein the positive resist composition of the invention is used for irradiation with an ArF excimer laser beam, the resin (A) is preferably a resin which is decomposed by the action of an acid to increase solubility in an alkali developing solution and includes a monocyclic or polycyclic aliphatic hydrocarbon structure.

As the resin which is decomposed by the action of an acid to increase solubility in an alkali developing solution and includes a monocyclic or polycyclic aliphatic hydrocarbon structure, resins containing at least one repeating unit selected from the group consisting of a repeating unit having a partial structure including an alicyclic hydrocarbon represented by any one of formulae (pI) to (pV) shown below and a repeating unit represented by formula (II-AB) shown below are preferable.

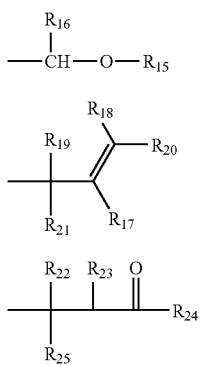

(pIII)

(pIV)

(pV)

In formulae (pI) to (pV), $R_{11}$ represents an alkyl group having from 1 to 8 carbon atoms or a cycloalkyl group having from 3 to 8 carbon atoms, and Z represents an atomic group necessary for forming a cycloalkyl group together with the carbon atom.

$R_{12}$ to $R_{16}$ each independently represents a straight chain or branched alkyl group having from 1 to 4 carbon atoms or a cycloalkyl group, provided that at least one of $R_{12}$ to $R_{14}$, or either $R_{15}$ or $R_{16}$ represents a cycloalkyl group.

$R_{17}$ to $R_{21}$ each independently represents a hydrogen atom, a straight chain or branched alkyl group having from 1 to 4 carbon atoms or a cycloalkyl group, provided that at least one of $R_{17}$ to $R_{21}$ represents a cycloalkyl group and either $R_{19}$ or $R_{21}$ represents a straight chain or branched alkyl group having from 1 to 4 carbon atoms or a cycloalkyl group.

$R_{22}$ to $R_{25}$ each independently represents a hydrogen atom, a straight chain or branched alkyl group having from 1 to 4 carbon atoms or a cycloalkyl group, provided that at least one of $R_{22}$ to $R_{25}$ represents a cycloalkyl group. Alternatively, $R_{23}$ and $R_{24}$ may be combined with each other to form a ring.

Of the structures represented by formulae (pI) to (pV), structures shown below are particularly preferable.

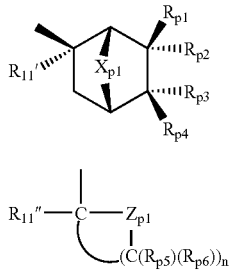

In formula (pI'), $R_{11'}$ represents an alkyl group having from 1 to 8 carbon atoms.

$X_{p1}$ represents an oxygen atom or a methylene group which may have a substituent.

$R_{p1}$ to $R_{p4}$, which may be the same or different, each represents a hydrogen atom or an alkyl group having from 1 to 8 carbon atoms. Alternatively, $R_{p1}$ to $R_{p4}$ may be combined with each other to form a ring.

In formula (pI''), $R_{11''}$ represents an alkyl group having from 1 to 8 carbon atoms or a cycloalkyl group having from 3 to 8 carbon atoms, and preferably a cycloalkyl group having from 3 to 8 carbon atoms.

$Z_{p1}$ represents a single bond or $-C(R_{p7})=C(R_{p8})-$.

$R_{p5}$ to $R_{p8}$, which may be the same or different, each represents a hydrogen atom or an alkyl group having from 1 to 8 carbon atoms. Alternatively, $R_{p5}$ to $R_{p8}$ may be combined with each other to form a ring.

n represents an integer of 2 to 8.

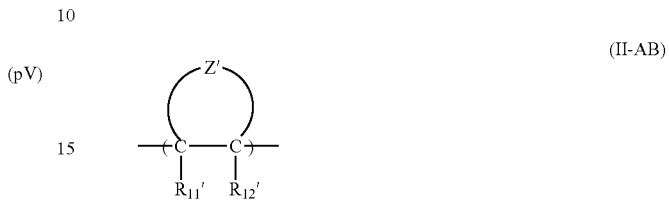

In formula (II-AB), $R_{11}'$ and $R_{12}'$ each independently represents a hydrogen atom, a cyano group, a halogen atom or an alkyl group.

Z' represents an atomic group necessary for forming an alicyclic structure together with the connected two carbon atoms (C—C).

Of the repeating units represented by formula (II-AB), those represented by formulae (II-AB1) and (II-AB2) shown below are more preferable.

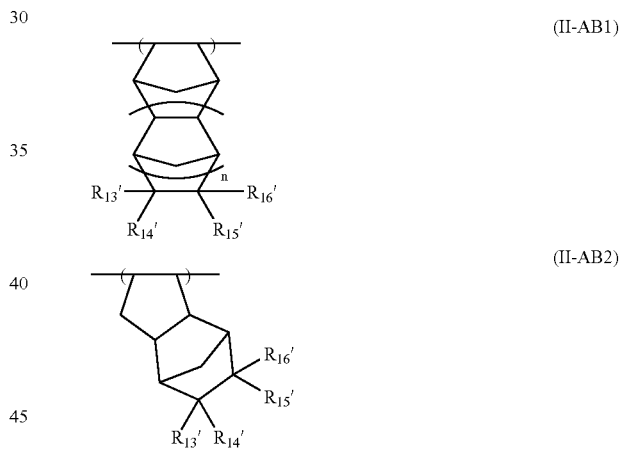

In formulae (II-AB1) and (II-AB2), $R_{13}'$ to $R_{16}'$ each independently represents a hydrogen atom, a halogen atom, a cyano group, a hydroxy group, —COOH, —COOR$_5$, a group capable of being decomposed by the action of an acid, —C(=O)—X-A'—R$_{17}'$, an alkyl group or a cycloalkyl group.

$R_5$ represents an alkyl group, a cycloalkyl group or a group including a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, a cyano group, a hydroxy group, an alkoxy group, —CO—NH—R$_6$, —CO—NH—SO$_2$—R$_6$ or a group including a lactone structure.

$R_6$ represents an alkyl group or a cycloalkyl group.

Alternatively, at least two of $R_{13}'$ to $R_{16}'$ may be combined with each other to form a ring.

n represents 0 or 1.

In formulae (pI) to (pV), the alkyl group for $R_{12}$ to $R_{25}$ represents a straight chain or branched alkyl group having from 1 to 4 carbon atoms. Examples of the alkyl group include a methyl group, an ethyl group, a propyl group, a n-butyl group, a sec-butyl group and a tert-butyl group.

The cycloalkyl group for $R_{11}$ to $R_{25}$ or the cycloalkyl group formed by Z and the carbon atom may be a monocyclic group or a polycyclic group. Specifically, a group having 5 or more carbon atoms and including, for example, a monocyclo, bicyclo, tricyclo or tetracyclo structure is exemplified. A number of the carbon atoms included is preferably from 6 to 30, and particularly preferably from 7 to 25. The cycloalkyl group may have a substituent.

Preferable examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Further, an adamantyl group, a norbornyl group, a cyclohexyl group, a cycloheptyl group, a tetracyclododecanyl group and a tricyclododecanyl group are more preferable.

The alkyl group or cycloalkyl group may have a substituent. Examples of the substituent for the alkyl group or cycloalkyl group include an alkyl group (preferably having from 1 to 4 carbon atoms), a halogen atom, a hydroxy group, an alkoxy group (preferably having from 1 to 4 carbon atoms), a carboxyl group and an alkoxycarbonyl group (preferably having from 2 to 6 carbon atoms). The alkyl group, alkoxy group or alkoxycarbonyl group described above may further have a substituent. Examples of the substituent which the alkyl group, alkoxy group or alkoxycarbonyl group described above may further have include a hydroxy group, a halogen atom and an alkoxy group.

The structure represented by any one of formulae (pI) to (pV) in the resin can be used for protecting an alkali-soluble group to form the acid-decomposable group. The alkali-soluble group includes various groups known in the field of art.

Specifically, structures wherein a hydrogen atom of a carboxylic acid group, a sulfonic acid group, a phenol group or a thiol group is substituted with the structure represented by any one of formulae (pI) to (pV) are exemplified, and preferably structures wherein a hydrogen atom of a carboxylic acid group or a sulfonic acid group is substituted with the structure represented by any one of formulae (pI) to (pV) are preferably exemplified.

As the repeating unit including the alkali-soluble group protected by the structure represented by any one of formulae (pI) to (pV), a repeating unit represented by formula (pA) shown below is preferable.

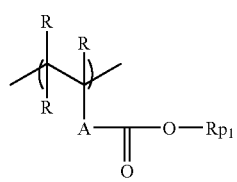

(pA)

In formula (pA), R represents a hydrogen atom, a halogen atom or a straight chain or branched alkyl group having from 1 to 4 carbon atoms. The plural Rs may be the same or different from each other.

A represents a single bond, an alkylene group, an ether group, a thioether group, a carbonyl group, an ester group, an amido group, a sulfonamido group, a urethane group, a urea group or a combination of two or more thereof. A is preferably a single bond.

Rp1 represents any one of the structures represented by formulae (pI) to (pV).

Of the repeating units represented by formula (pA), repeating units derived from 2-alkyl-2-adamantyl(meth)acrylate and dialkyl(1-adamantyl)methyl (meth)acrylate are most preferable.

Specific examples of the repeating unit represented by formula (pA) are set forth below, but the invention should not be construed as being limited thereto.

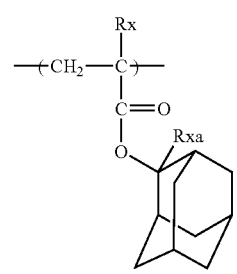

1

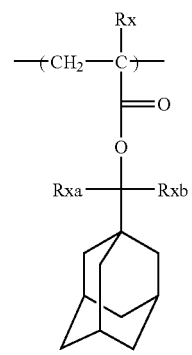

2

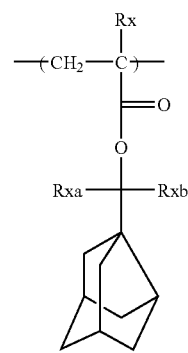

3

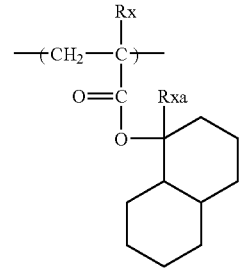

4

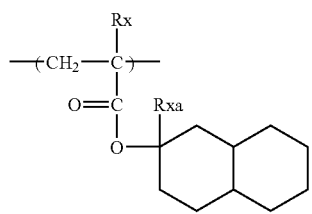
5
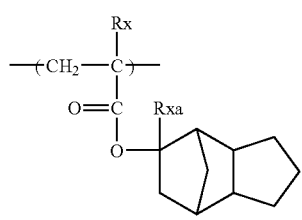
6
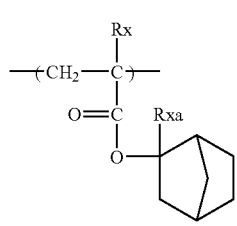
7
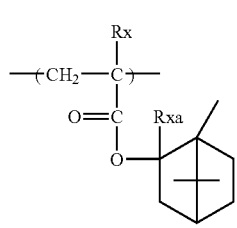
8
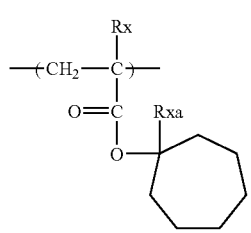
9
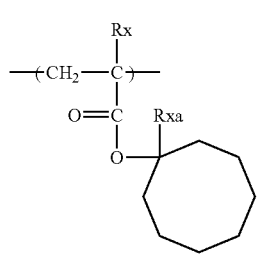
10
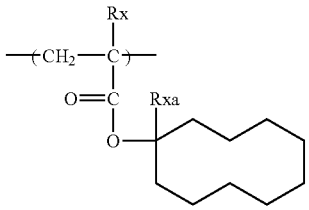
11
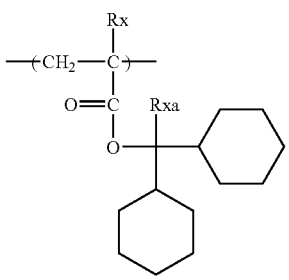
12
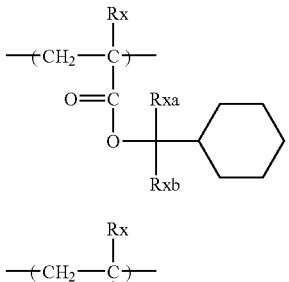
13
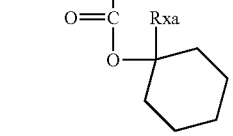
14
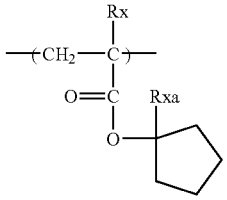
15
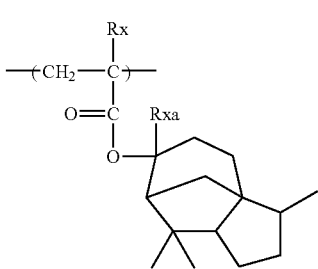
16
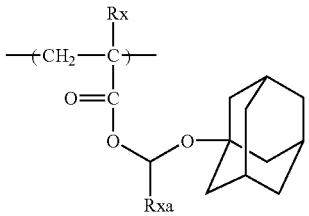
17

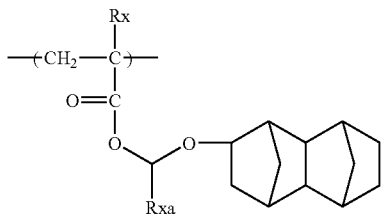
(18)

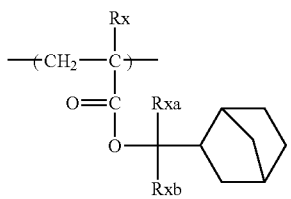
(19)

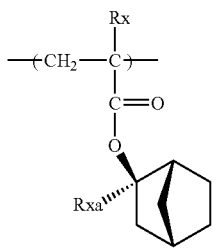
(20)

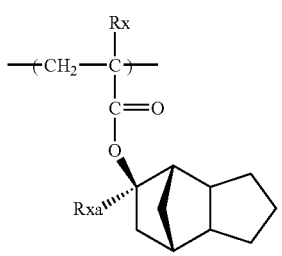
(21)

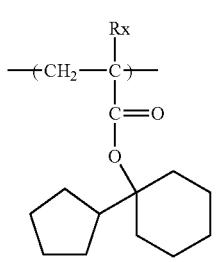
(22)

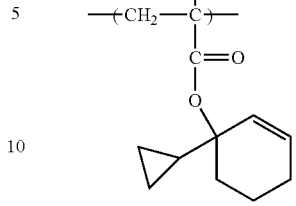
(23)

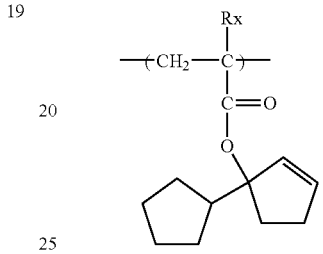
(24)

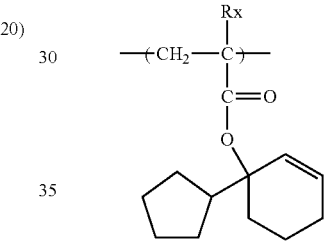
(25)

In the structural formulae above, Rx represents H, CH$_3$, CF$_3$ or CH$_2$OH, and Rxa and Rxb each independently represents an alkyl group having from 1 to 4 carbon atoms.

In formula (II-AB), the halogen atom for $R_{11}'$ or $R_{12}'$ includes, for example, a chlorine atom, a bromine atom, a fluorine atom and an iodine atom.

The alkyl group for each of $R_{11}'$ and $R_{12}'$ includes preferably a straight chain or branched alkyl group having from 1 to 10 carbon atoms, for example, a methyl group, an ethyl group, a n-propyl group, an isopropyl group or straight chain or branched butyl, pentyl, hexyl or heptyl groups.

The atomic group necessary for forming an alicyclic structure represented by Z' is an atomic group necessary for forming a repeating unit of alicyclic hydrocarbon moiety which may have a substituent. In particular, an atomic group necessary for forming a bridged alicyclic structure, by which a repeating unit of the bridged alicyclic hydrocarbon is completed, is preferable.

The skeleton of the alicyclic hydrocarbon formed includes the same as described regarding the cycloalkyl group for each of $R_{12}$ to $R_{25}$ in formulae (pI) to (pV).

The skeleton of the above-described alicyclic hydrocarbon may have a substituent. Examples of the substituent include the atoms and groups represented by $R_{13}'$ to $R_{16}'$ in formula (II-AB1) or (II-AB2).

In the resin (A) according to the invention, the group which is decomposed by the action of an acid may be incorporated into at least one repeating unit selected from the repeating unit having a partial structure including an alicyclic hydrocarbon represented by any one of formulae (pI) to (pV), the repeating unit represented by formula (II-AB) and a repeating unit of a copolymerization component described hereinafter.

Various substituents represented by $R_{13}'$ to $R_{16}'$ in formulae (II-AB1) and (II-AB2) may constitute substituents for the atomic group necessary for forming an alicyclic structure or the atomic group necessary for forming an bridged alicyclic structure represented by Z' in formula (II-AB).

Specific examples of the repeating unit represented by formula (II-AB1) or (II-AB2) are set forth below, but the invention should not be construed as being limited thereto.

[II-1]
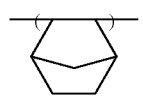

[II-2]
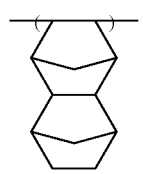

[II-3]
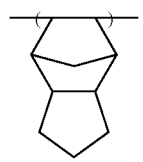

[II-4]
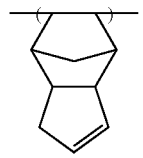

[II-5]
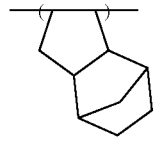

[II-6]
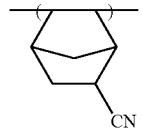

[II-7]
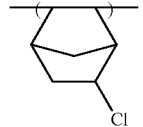

[II-8]
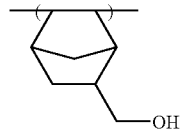

-continued

[II-9]
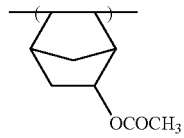

[II-10]
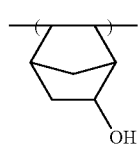

[II-11]
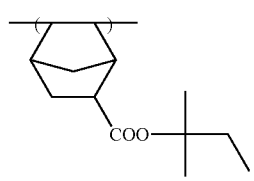

[II-12]
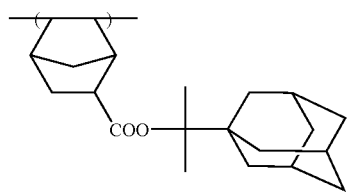

[II-13]
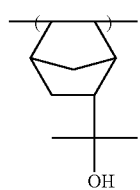

[II-14]
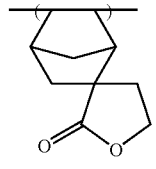

[II-15]
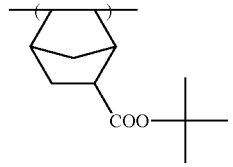

[II-16]
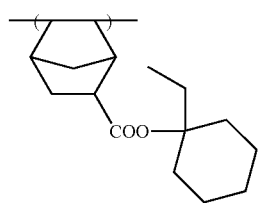

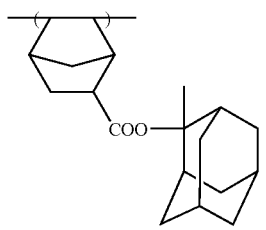 [II-17]
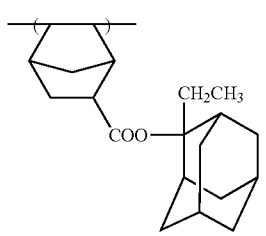 [II-18]
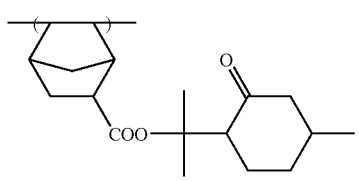 [II-19]
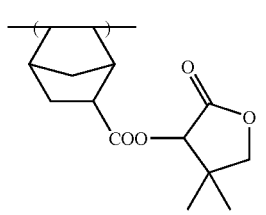 [II-20]
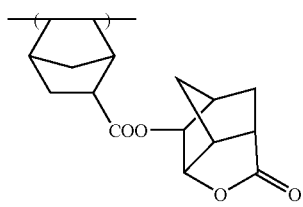 [II-21]
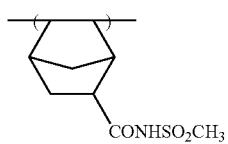 [II-22]
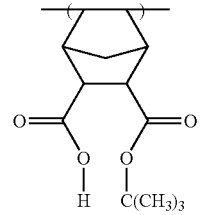 [II-23]
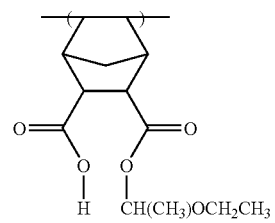 [II-24]
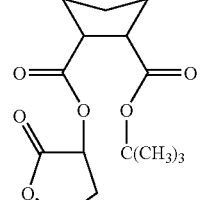 [II-25]
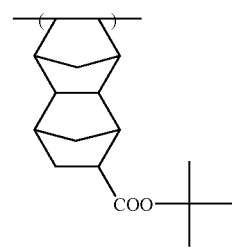 [II-26]
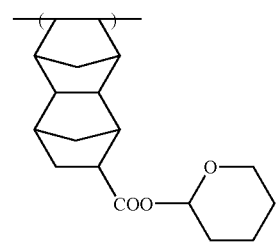 [II-27]
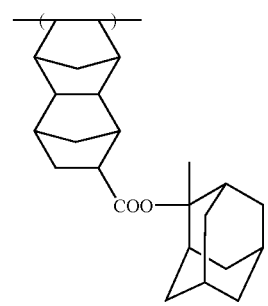 [II-28]

-continued

[II-29]
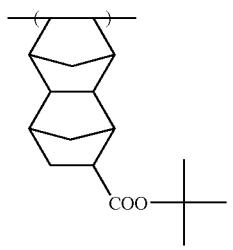

[II-30]
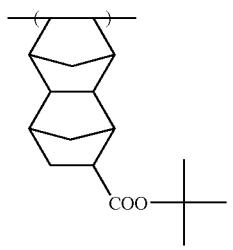

[II-31]
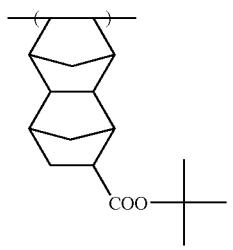

[II-32]
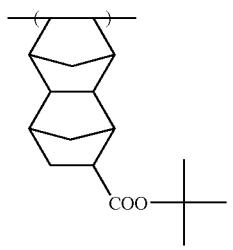

The resin (A) according to the invention may contain a repeating unit which includes a lactone group but does not include a cyano group. As the lactone group, any group may be used as long as it includes a lactone structure. A group including a 5-membered to 7-membered lactone structure is preferable and a group including a 5-membered to 7-membered lactone structure to which other cyclic structure is condensed to form a bicycle structure or a spiro structure is more preferable. The resin (A) according to the invention more preferably contains a repeating unit having a group including a lactone structure represented by any one of formulae (LC1-1) to (LC1-16) shown below. The group including a lactone structure may be directly bonded to the main chain. Preferable examples of the lactone structure include (LC1-1), (LC1-4), (LC1-5), (LC1-6), (LC1-13) and (LC1-14). By using a specific lactone structure, line edge roughness and development defect are improved.

LC1-1
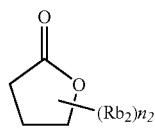

LC1-2
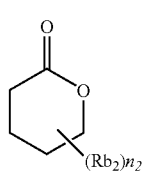

LC1-3
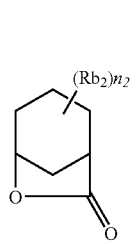

LC1-4
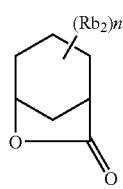

LC1-5
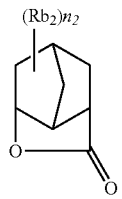

LC1-6
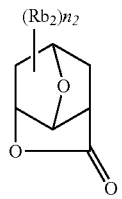

LC1-7
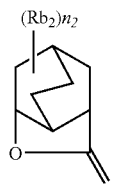

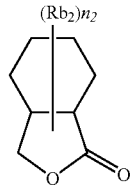

-continued

LC1-8

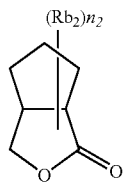

LC1-9

LC1-10

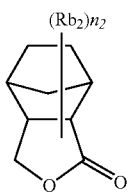

LC1-11

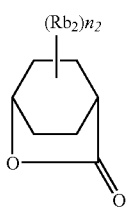

LC1-12

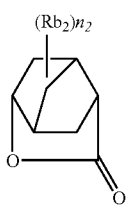

LC1-13

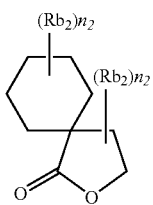

LC1-14

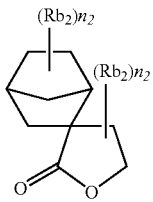

LC1-15

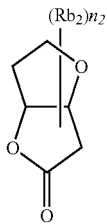

LC1-16

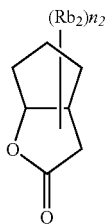

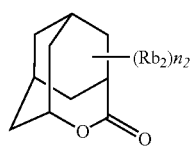

The lactone structure may or may not have the substituent ($Rb_2$). Preferable examples of the substituent ($Rb_2$) include an alkyl group having from 1 to 8 carbon atoms, a cycloalkyl group having from 4 to 7 carbon atoms, an alkoxy group having from 1 to 8 carbon atoms, an alkoxycarbonyl group having from 1 to 8 carbon atoms, a carboxyl group, a halogen atom, a hydroxy group, a cyano group and an acid-decomposable group. $n_2$ represents an integer of 0 to 4. When $n_2$ is 2 or more, the plural $Rb_2$s may be the same or different from each other, or the plural $Rb_2$s may be combined with each other to form a ring.

Examples of the repeating unit having a group including a lactone structure represented by any one of formulae (LC1-1) to (LC1-16) include a repeating unit in which at least one of $R_{13}'$ to $R_{16}'$ in formulae (II-AB1) and (II-AB2) shown above has the group represented by any one of formulae (LC1-1) to (LC1-16) (for example, $R_5$ in —$COOR_5$ represents the group represented by any one of formulae (LC1-1) to (LC1-16)) and a repeating unit represented by formula (AI) shown below.

$$\text{(AI)}$$

In formula (AI), $R_{b0}$ represents a hydrogen atom, a halogen atom or an alkyl group having from 1 to 4 carbon atoms.

Examples of the alkyl group represented by $R_{b0}$ include a methyl group, an ethyl group, a propyl group, a n-butyl group, a sec-butyl group and a tert-butyl group. The alkyl group represented by $R_{b0}$ may have a substituent. Preferable examples of the substituent for the alkyl group represented by $R_{b0}$ include a hydroxy group and a halogen atom.

Examples of the halogen atom represented by $R_{b0}$ include a fluorine atom, a chlorine atom, a bromine atom and an iodine atom. $R_{b0}$ is preferably a hydrogen atom or a methyl group.

Ab represents an alkylene group, a divalent connecting group including a monocyclic or polycyclic alicyclic hydrocarbon structure, a single bond, an ether group, an ester group, a carbonyl group, a carboxyl group or a divalent group formed by combining these groups. Ab is preferably a single bond or a connecting group represented by -$Ab_1$—$CO_2$—.

Ab$_1$ represents a straight chain or branched alkylene group or a monocyclic or polycyclic cycloalkylene group, preferably a methylene group, an ethylene group, a cyclohexyl residue, an adamantyl residue and a norbornyl residue.

V represents a group represented by any one of formulae (LC1-1) to (LC1-16).

The repeating unit containing a lactone structure ordinarily includes optical isomers and any optical isomer can be used. One kind of the optical isomers may be used alone or plural kinds of the optical isomers may be used in mixture. When one kind of the optical isomers is mainly used, the optical purity (ee) thereof is preferably 90 or more, more preferably 95 or more.

Specific examples of the repeating unit having a group including a lactone structure are set forth below, but the invention should not be construed as being limited thereto.

In the formulae below, R$_x$ represents H, CH$_3$, CH$_2$OH or CF$_3$.

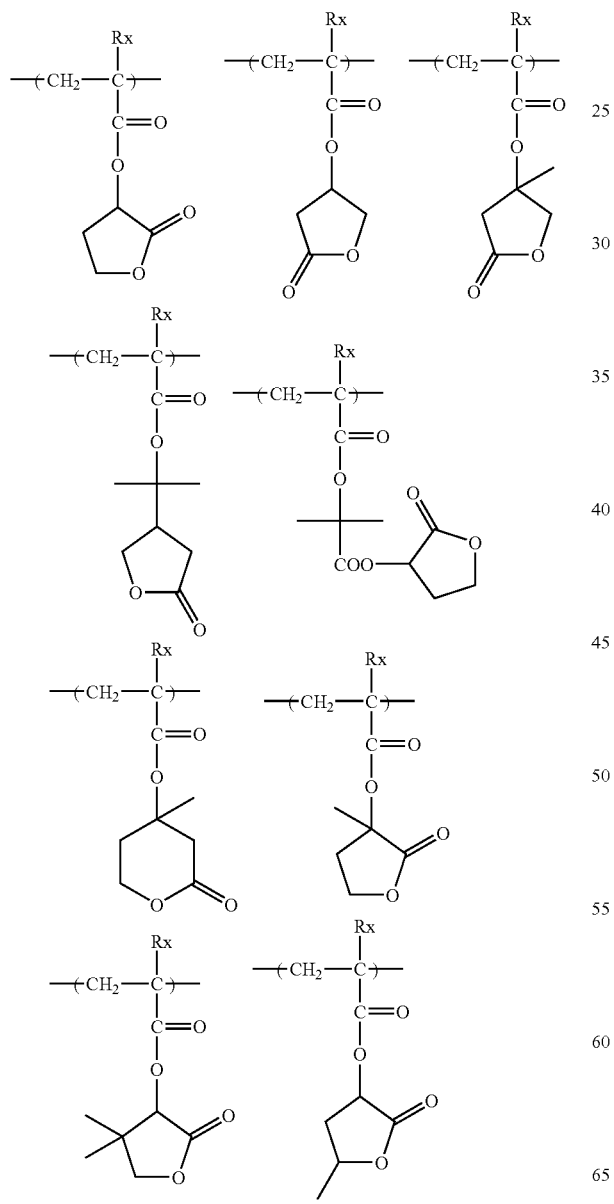

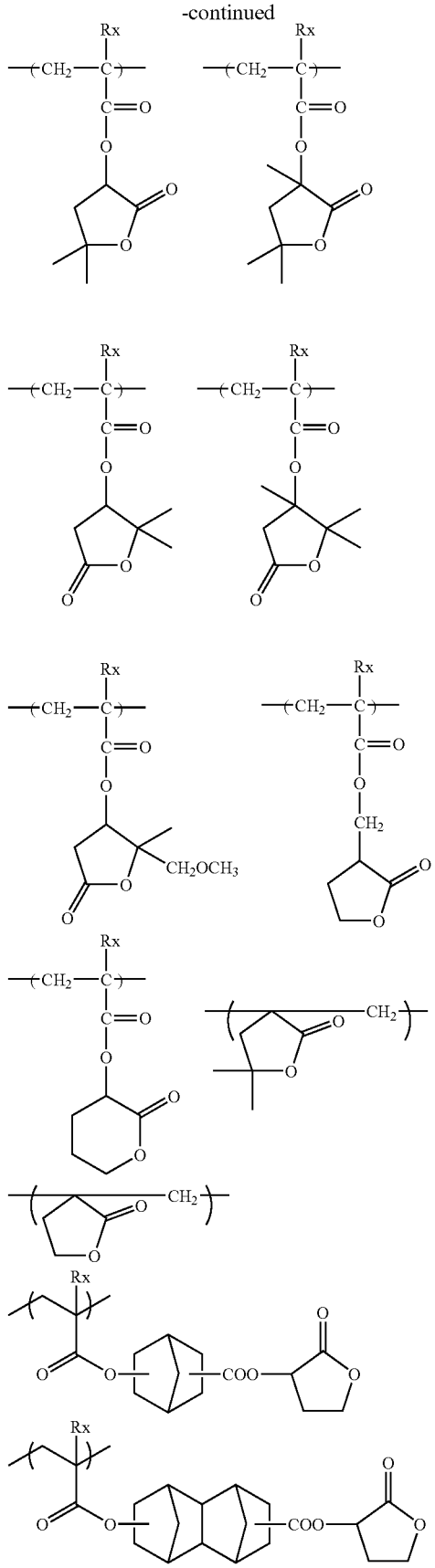

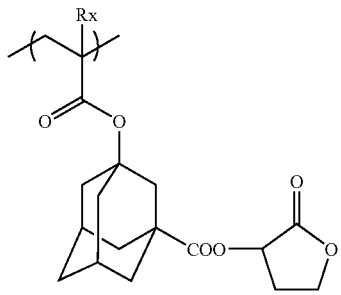
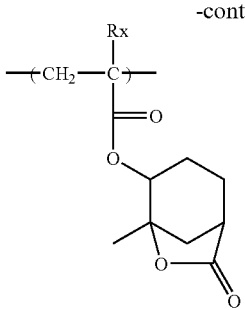

-continued
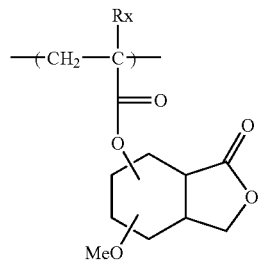
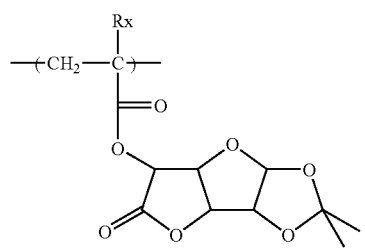
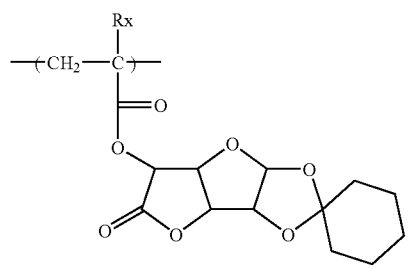
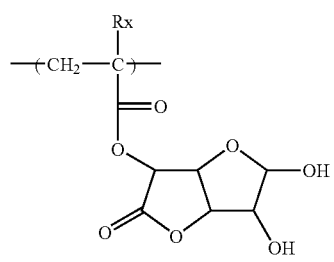
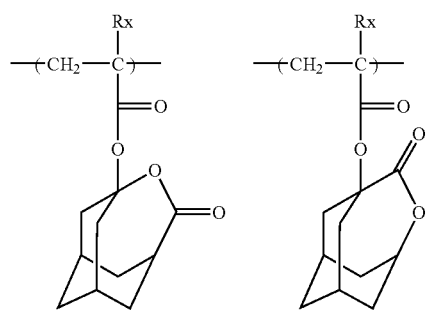
-continued
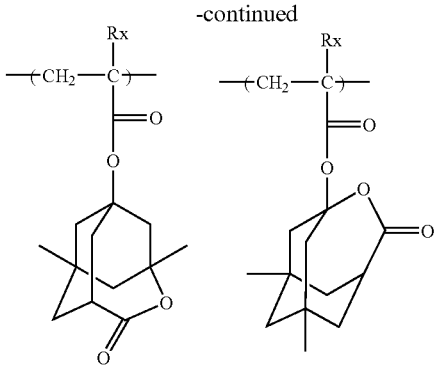
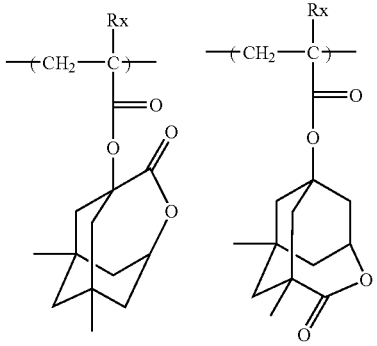
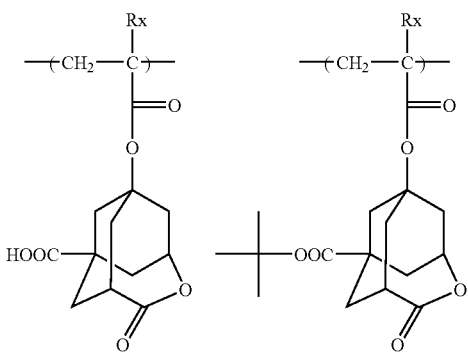
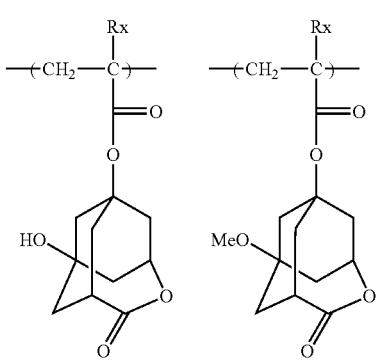

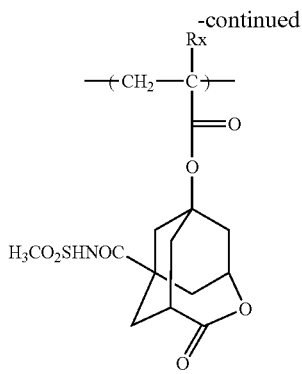

The resin (A) according to the invention preferably contains a repeating unit including an alicyclic hydrocarbon structure substituted with a polar group. The introduction of such a repeating unit increases adhesion property to substrate and affinity for developing solution. Preferable examples of the polar group include a hydroxy group and a cyano group.

As the alicyclic hydrocarbon structure substituted with a polar group, for example, structures represented by any one of formulae (VIIa) and (VIIb) shown below are exemplified.

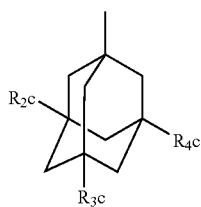

In formula (VIIa), $R_{2c}$ to $R_{4c}$ each independently represents a hydrogen atom, a hydroxy group or a cyano group, provided that at least one of $R_{2c}$ to $R_{4c}$ represents a hydroxy group or a cyano group. Preferably, one or two of $R_{2c}$ to $R_{4c}$ represents hydroxy group(s) and the remainder represents hydrogen atom(s), and more preferably, two of $R_{2c}$ to $R_{4c}$ each represents a hydroxy group and the remainder represents a hydrogen atom.

The group represented by formula (VIIa) is preferably a dihydroxy-substituted group or a monohydroxy-substituted group, and more preferably a dihydroxy-substituted group.

Examples of the repeating unit containing a group represented by formula (VIIa) or (VIIb) include a repeating unit in which at least one of $R_{13}'$ to $R_{16}'$ in formulae (II-AB1) and (II-AB2) shown above has the group represented by formula (VIIa) or (VIIb) (for example, $R_5$ in —$COOR_5$ represents the group represented by formula (VIIa) or (VIIb)) and a repeating unit represented by formula (AIIa) or (AIIb) shown below.

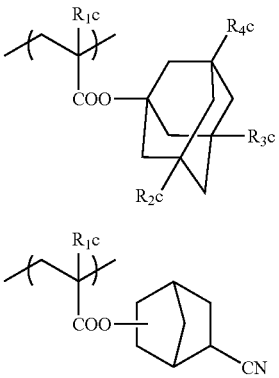

In formulae (AIIa) and (AIIb), $R_{1c}$ represents a hydrogen atom, a methyl group, a trifluoromethyl group or a hydroxymethyl group. $R_{2c}$ to $R_{4c}$ have the same meanings as $R_{2c}$ to $R_{4c}$ defined in formula (VIIa) respectively.

Specific examples of the repeating unit including an alicyclic hydrocarbon structure substituted with a polar group represented by formula (AIIa) or (AIIb) are set forth below, but the invention should not be construed as being limited thereto.

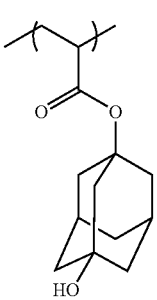 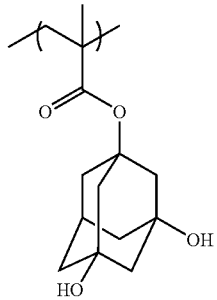

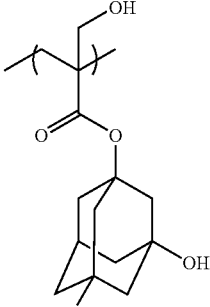 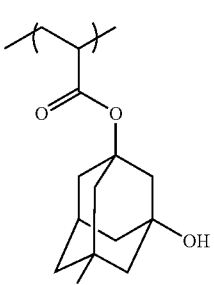

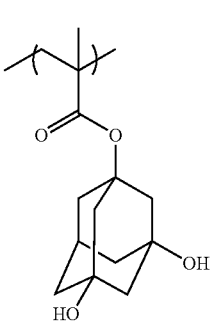 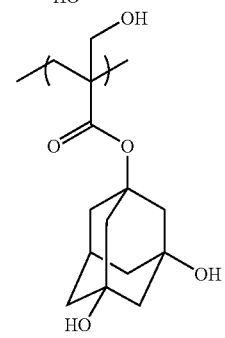

-continued

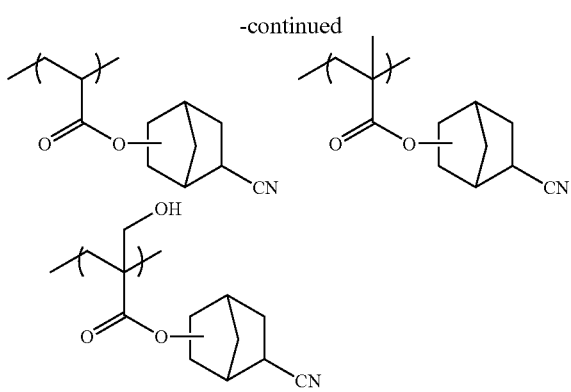

The resin (A) according to the invention may contain a repeating unit represented by formula (VIII) shown below.

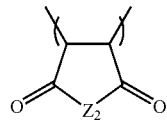
(VIII)

In formula (VIII), $Z_2$ represents —O— or —N($R_{41}$)—. $R_{41}$ represents a hydrogen atom, a hydroxy group, an alkyl group, or —OSO$_2$—$R_{42}$. $R_{42}$ represents an alkyl group, a cycloalkyl group or a camphor residue. The alkyl group represented by $R_{41}$ or $R_{42}$ may be substituted, for example, a halogen atom (preferably a fluorine atom).

Specific examples of the repeating unit represented by formula (VIII) are set forth below, but the invention should not be construed as being limited thereto.

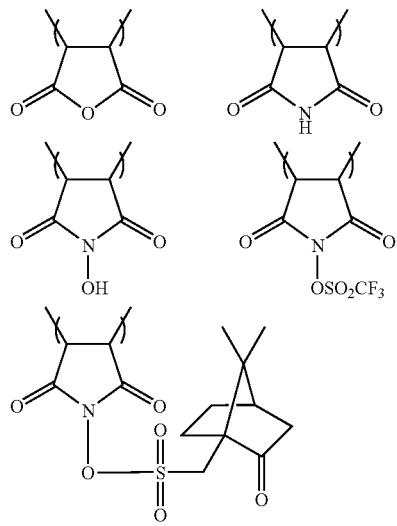

The resin (A) according to the invention preferably contains a repeating unit including an alkali-soluble group, more preferably a repeating unit including a carboxyl group. The introduction of such a repeating unit increases resolution in the application to forming contact holes. As the repeating unit including a carboxyl group, any of a repeating unit in which the carboxyl group is directly connected to the main chain of resin, for example, a repeating unit based on acrylic acid or methacrylic acid and a repeating unit in which the carboxyl group is connected to the main chain of resin through a connecting group is preferable. The connecting group may include a monocyclic or polycyclic alicyclic hydrocarbon structure. The repeating unit based on acrylic acid or methacrylic acid is most preferable.

The resin (A) according to the invention may contain a repeating unit including one to three groups represented by formula (F1) shown below. The introduction of such a repeating unit increases line edge roughness.

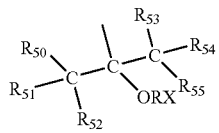
(F1)

In formula (F1), $R_{50}$ to $R_{55}$ each independently represents a hydrogen atom, a fluorine atom or an alkyl group, provided that at least one of $R_{50}$ to $R_{55}$ represents a fluorine atom or an alkyl group in which at least one of the hydrogen atoms is substituted with a fluorine atom.

$R_x$ represents a hydrogen atom or an organic group (preferably an acid-decomposable protective group, an alkyl group, a cycloalkyl group, an acyl group or an alkoxycarbonyl group).

The alkyl group represented by any one of $R_{50}$ to $R_{55}$ may be substituted, for example, with a halogen atom, for example, a fluorine atom or a cyano group. The alkyl group preferably includes an alkyl group having from 1 to 3 carbon atoms, for example, a methyl group and a trifluoromethyl group.

All of $R_{50}$ to $R_{55}$ are preferably fluorine atoms.

The organic group represented by $R_x$ may include an acid-decomposable protective group or a substituent. The organic group preferably includes an alkyl group, a cycloalkyl group, an acyl group, an alkylcarbonyl group, an alkoxycarbonyl group, an alkoxycarbonylmethyl group, an alkoxymethyl group and a 1-alkoxyethyl group.

As the repeating unit including the group represented by formula (F1), a repeating unit represented by formula (F2) shown below is preferably exemplified.

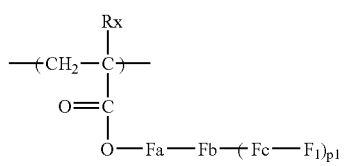
(F2)

In formula (F2), $R_x$ represents a hydrogen atom, a halogen atom or an alkyl group having from 1 to 4 carbon atoms. The alkyl group represented by $R_x$ may have a substituent, for example, preferably a hydroxy group or a halogen atom.

$F_a$ represents a single bond or a straight chain or branched alkylene group, preferably a single bond.

$F_b$ represents a monocyclic or polycyclic cyclic hydrocarbon group.

$F_c$ represents a single bond or a straight chain or branched alkylene group, preferably a single bond or a methylene, group.

$F_1$ represents a group represented by formula (F1) above.

$p_1$ represents 1 to 3.

The cyclic hydrocarbon group represented by $F_b$ preferably includes a cyclopentyl group, a cyclohexyl group and a norbornyl group.

Specific examples of the repeating unit including the group represented by formula (F1) are set forth below, but the invention should not be construed as being limited thereto.

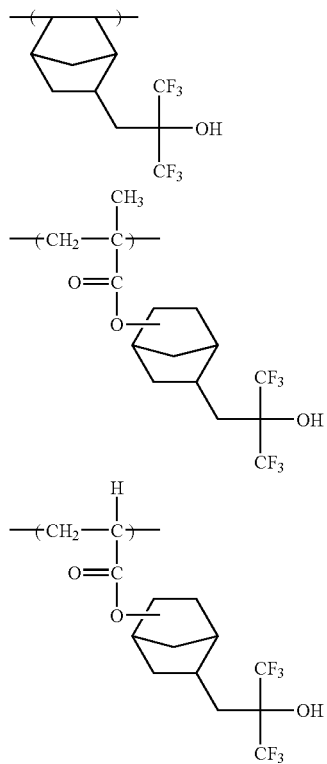

The resin (A) according to the invention may contain various repeating structural units in addition to the repeating structural units described above for the purposes of adjusting dry etching resistance, standard developing solution aptitude, adhesion property to substrate, resist profile, and other characteristics ordinarily required for resist, for example, resolution, heat resistance and sensitivity.

Examples of such repeating structural units include repeating structural units corresponding to monomers described below, but the invention should not be construed as being limited thereto.

The introduction of additional repeating structural unit makes possible the minute control of characteristics required for the resin (A), particularly (1) solubility in a coating solvent, (2) film forming property (glass transition point), (3) developing property with alkali, (4) decrease in film thickness (hydrophobicity, selection of alkali-soluble group), (5) adhesion property of the unexposed area to a substrate, and (6) dry etching resistance.

Examples of the monomer include compounds having one addition-polymerizable unsaturated bond, for example, those selected from acrylates, methacrylates, acrylamides, methacrylamides, allyl compounds, vinyl ethers and vinyl esters.

In addition, any addition-polymerizable unsaturated compounds copolymerizable with monomers corresponding to the various repeating structural units described above may be employed.

A molar ratio of each repeating structural unit in the resin (A) can be appropriately determined taking the adjustment of many factors including dry etching resistance, standard developing solution aptitude and adhesion property to substrate of resist, resist profile, and other characteristics ordinarily required for resist, for example, resolution, heat resistance and sensitivity into consideration.

Preferable embodiments of the resin (A) according to the invention include the following:

(1) a resin (side chain type) containing a repeating unit having a partial structure including an alicyclic hydrocarbon represented by any one of formulae (pI) to (pV), preferably, a resin containing a repeating unit based on a (meth)acrylate including a structure represented by any one of formulae (pI) to (pV).

(2) a resin (main chain type) containing a repeating unit represented by formula (II-AB). The resin of (2) includes the following resin of (3).

(3) a resin (hybrid type) containing a repeating unit represented by formula (II-AB), a maleic anhydride derivative structure and a (meth)acrylate structure.

A content of the repeating unit including an acid-decomposable group is preferably from 10 to 60% by mole, more preferably from 20 to 50% by mole, and still more preferably from 25 to 40% by mole based on the total repeating structural units in the resin (A).

A content of the repeating unit (A1) is preferably from 10 to 90% by mole, more preferably from 20 to 80% by mole, and still more preferably from 30 to 70% by mole based on the total repeating structural units in the resin (A).

A content of the repeating unit having a partial structure including an alicyclic hydrocarbon represented by any one of formulae (pI) to (pV) is preferably from 25 to 70% by mole, more preferably from 35 to 65% by mole, and still more preferably from 40 to 60% by mole based on the total repeating structural units in the resin (A).

A content of the repeating unit represented by formula (II-AB) is preferably from 10 to 60% by mole, more preferably from 15 to 55% by mole, and still more preferably from 20 to 50% by mole based on the total repeating units in the resin (A).

A content of the repeating structural unit based on a monomer corresponding to the additional copolymerization component described above in the resin can be appropriately determined depending on the desired performance of resist. In general, the content is preferably 99% by mole or less, more preferably 90% by mole or less, and still more preferably 80% by mole or less based on the sum total molar amount of the repeating structural unit having a partial structure including an alicyclic hydrocarbon represented by any one of formulae (pI) to (pV) and the repeating unit represented by formula (II-AB).

In the case wherein the resist composition of the invention is used for exposure with ArF laser beam, it is preferred that the resin (A) does not contain an aromatic group in order to ensure transparency to the ArF laser beam.

As the resin (A) for use in the invention, a resin in which all repeating units are composed of (meth)acrylate repeating units is preferable. In such a case, any of case in which all repeating units are composed of acrylate repeating units, case in which all repeating units are composed of (meth)acrylate repeating units and case in which all repeating units are composed of mixture of acrylate repeating unit and (meth)acrylate repeating unit can be used, but it is preferred that the acrylate repeating unit is 50% by mole or less based on the total repeating units in the resin (A).

The resin (A) for use in the invention can be synthesized according to a conventional method, for example, radical polymerization. For instance, as an ordinary synthesis method, a batch polymerization method in which polymerization is performed by dissolving monomers and a polymerization initiator in a solvent and heating and a dropwise addition polymerization method in which a solution of monomers and a polymerization initiator is dropwise added to a heated solvent over a period of 1 to 10 hours are exemplified. The dropwise addition polymerization method is preferable. Examples of the reaction solvent include an ether, for example, tetrahydrofuran, 1,4-dioxane or diisopropyl ether, a ketone, for example, methyl ethyl ketone or methyl isobutyl ketone, an ester solvent, for example, ethyl acetate, an amide solvent, for example, dimethylformamide or dimethylacetamide, or a solvent dissolving the resist composition of the invention as described hereinafter, for example, propylene glycol monomethyl ether acetate, propylene glycol monomethyl ether or cyclohexane. It is preferable to conduct the polymerization using the solvent same as that used in the resist composition of the invention. This makes it possible to restrain the generation of particles during preservation of the resist composition.

The polymerization reaction is preferably conducted under inert gas atmosphere, for example, nitrogen or argon. The polymerization is initiated using a commercially available radical initiator (for example, an azo initiator or a peroxide) as the polymerization initiator. As the radical initiator, an azo initiator is preferable and an azo initiator having an ester group, a cyano group or a carboxyl group is more preferable. Examples of the preferable initiator includes azobisisobutyronitrile, azobisdimethylvaleronitrile and dimethyl 2,2'-azobis(2-methylpropionate). The initiator is further added or added in a divided manner, if desired. After the completion of the reaction, the desired polymer is recovered, for example, by pouring the reaction mixture into a solvent to collect the resulting powder or solid. The concentration of reaction is ordinarily from 5 to 50% by weight, and preferably from 10 to 30% by weight. The reaction temperature is ordinarily from 10 to 150° C., preferably from 30 to 120° C., and more preferably from 50 to 100° C.

When the resist composition of the invention is used as an upper layer resist of multilayer resist, it is preferred that the resin (a) contains a silicon atom.

As the resin which is decomposed by the action of an acid to increase solubility in an alkali developing solution and contains a silicon atom, a resin containing a silicon atom in at least one of the main chain and side chain thereof can be used. As the resin containing a silicon atom in the side chain thereof, for example, a copolymer comprising an olefinic monomer having a silicon atom in its side chain, maleic anhydride and a (meth)acrylic acid monomer having an acid-decomposable group in its side chain is exemplified.

As the resin containing a silicon atom, a resin containing a trialkylsilyl structure or a monocyclic or polycyclic siloxane structure is preferable, a resin containing a repeating unit including a structure represented by any one of formulae (SS-1) to (SS-4) shown below is more preferable, and a resin containing a (meth)acrylate repeating unit, vinyl repeating unit or allyl repeating unit including a structure represented by any one of formulae (SS-1) to (SS-4) is still more preferable.

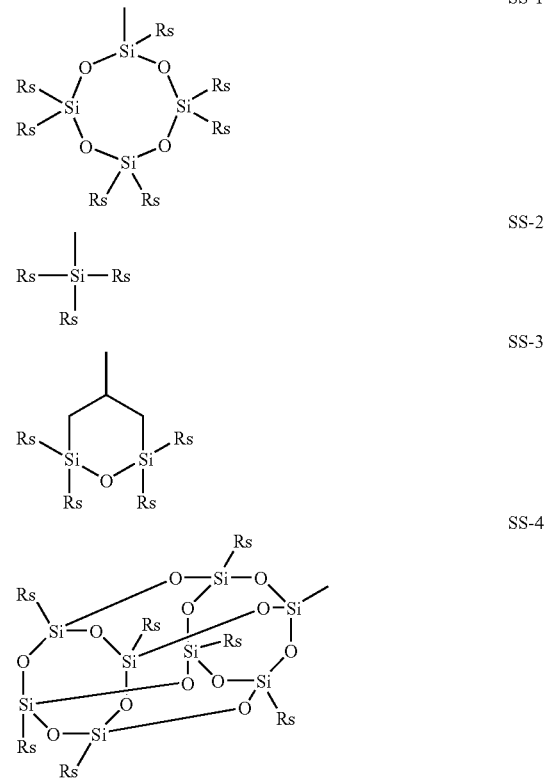

In formulae (SS-1) to (SS-4), Rs represents an alkyl group having from 1 to 5 carbon atoms, and is preferably a methyl group or an ethyl group.

The resin containing a silicon atom is preferably a resin containing two or more different repeating units including a silicon atom, more preferably a resin containing both a repeating unit (Sa) including 1 to 4 silicon atoms and a repeating unit (Sb) including 5 to 10 silicon atoms, and still more preferably a resin containing at least one repeating unit including a structure represented by any one of formulae (SS-1) to (SS-3) and a repeating unit including a structure represented by formulae (SS-4).

A weight average molecular weight of the resin (A) is preferably from 2,000 to 200,000, when measured by a GPC method and calculated in terms of polystyrene. When the weight average molecular weight is 2,000 or more, heat resistance, dry etching resistance and exposure latitude can be increased. On the other hand, when the weight average molecular weight is 200,000 or less, effect of improving development defect due to increase of developing property can be achieved and film-forming property can be improved because of decrease in viscosity. The weight average molecular weight is more preferably from 5,000 to 50,000, still more preferably from 7,000 to 30,000, and most preferably from 8,000 to 16,000.

The dispersion degree (Mw/Mn) of the resin (A) is preferably from 1.0 to 3.0, more preferably from 1.0 to 2.5, and still more preferably from 1.0 to 2.0. By controlling the dispersion degree to an appropriate range, line edge roughness can be improved.

A content of the resin (A) in the positive resist composition of the invention is preferably from 40 to 99.9% by weight, more preferably from 50 to 99% by weight, still more preferably from 80 to 96% by weight, based on the total solid content of the resist composition.

In the resist composition, a ratio (weight ratio) of the resin (Aa) to the resin (Ab) is preferably from 10:90 to 90:10, more preferably from 15:85 to 85:15, and still more preferably from 20:80 to 80:20.

[2] (B) Compound which generates an acid upon irradiation of an actinic ray or radiation The compound which generates an acid upon irradiation of an actinic ray or radiation (hereinafter also referred to as an "acid generator") for use in the positive resist composition of the invention will be described below.

The acid generator for use in the invention can be selected from compounds ordinarily used as acid generators.

Specifically, the acid generator can be appropriately selected from photoinitiators for photo-cationic polymerization, photoinitiators for photo-radical polymerization, photo-achromatic agents for dyes, photo-discoloring agents, known compounds generating an acid upon irradiation of an actinic ray or radiation, for example, a far ultraviolet ray or an X ray, used for a microresist and mixtures thereof.

Examples of the acid generator include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, polymer compounds in which a group or compound generating an acid upon irradiation of an actinic ray or radiation is introduced into the main chain or side chain thereof, for example, compounds described, for example, in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 may be used.

Further, compounds generating an acid by light described, for example, in U.S. Pat. No. 3,779,778 and European Patent 126,712 may be used.

Preferable examples of the acid generator include compounds represented by the following formulae (ZI), (ZII) and (ZIII).

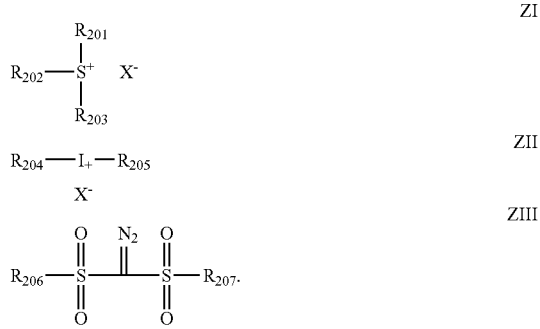

In formula (ZI), $R_{201}$, $R_{202}$ and $R_{203}$ each independently represents an organic group.

$X^-$ represents a non-nucleophilic anion.

A number of carbon atoms included in the organic group represented by any one of $R_{201}$, $R_{202}$ and $R_{203}$ is ordinarily from 1 to 30, and preferably from 1 to 20.

Alternatively, two of $R_{201}$ to $R_{203}$ may be combined with each other to from a ring structure, and the ring structure may include an oxygen atom, a sulfur atom, an ester bond, an amido bond or a carbonyl group.

A group formed by combining two of $R_{201}$ to $R_{203}$ includes an alkylene group (for example, a butylene group or a pentylene group).

Specific examples of the organic group represented by any one of $R_{201}$, $R_{202}$ and $R_{203}$ include the corresponding groups in Compounds (ZI-1), (ZI-2) and (ZI-3) described below.

Compounds having two or more of the structures represented by formula (ZI) may also be used. For example, a compound having a structure in which at least one of $R_{201}$ to $R_{203}$ in one compound represented by formula (ZI) is connected to at least one of $R_{201}$ to $R_{203}$ in another compound represented by formula (ZI).

As more preferable compounds of the compounds represented by formula (ZI), Compounds (ZI-1), (ZI-2) and (ZI-3) described below are exemplified.

Compound (ZI-1) is an arylsulfonium compound wherein at least one of $R_{201}$ to $R_{203}$ in formula (ZI) is an aryl group, that is, a compound including an arylsulfonium as a cation.

In the arylsulfonium compound, all of $R_{201}$ to $R_{203}$ may be aryl groups, or a part of $R_{201}$ to $R_{203}$ may be an aryl group and the remainder may be an alkyl group or a cycloalkyl group.

Examples of the arylsulfonium compound include triarylsulfonium compounds, diarylalkylsulfonium compounds, aryldialkylsulfonium compounds, diarylcycloalkylsulfonium compounds and aryldicycloalkylsulfonium compounds.

As the aryl group in the arylsulfonium compound, a phenyl group or a naphthyl group is preferable and a phenyl group is more preferable. The aryl group may be an aryl group including a heterocyclic structure containing, for example, an oxygen atom, a nitrogen atom or a sulfur atom. Examples of the aryl group including a heterocyclic structure includes a pyrrole residue (a group formed by eliminating one hydrogen atom from pyrrole), a furan residue (a group formed by eliminating one hydrogen atom from furan), a thiophene residue (a group formed by eliminating one hydrogen atom from thiophene), an indole residue (a group formed by eliminating one hydrogen atom from indole), a benzofuran residue (a group formed by eliminating one hydrogen atom from benzofuran) and a benzothiophene residue (a group formed by eliminating one hydrogen atom from benzothiophene. When the arylsulfonium compound includes two or more aryl groups, the two or more aryl groups may be the same or different from each other.

The alkyl group, which is included in the arylsulfonium compound, if desired, is preferably a straight chain or branched alkyl group having from 1 to 15 carbon atoms and includes, for example, a methyl group, an ethyl group, a propyl group, a n-butyl group, a sec-butyl group and a tert-butyl group.

The cycloalkyl group, which is included in the arylsulfonium compound, if desired, is preferably a cycloalkyl group having from 3 to 15 carbon atoms and includes, for example, a cyclopropyl group, a cyclobutyl group and a cyclohexyl group.

The aryl group, alkyl group or cycloalkyl group represented by any one of $R_{201}$ to $R_{203}$ may have as a substituent, for example, an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxy group or a phenylthio group. Preferable examples of the substituent include a straight chain or branched alkyl group having from 1 to 12 carbon atoms, a cycloalkyl group having from 3 to 12 carbon atoms and an alkoxy group having from 1 to 12 carbon atoms. An alkyl group having from 1 to 4 carbon atoms and an alkoxy group having from 1 to 4 carbon atoms are most preferred. The substituent may be substituted on any one of $R_{201}$ to $R_{203}$ or the substituents may be substituted on all of $R_{201}$ to $R_{203}$. When any one of $R_{201}$ to $R_{203}$ represents an aryl group, the substituent is preferably substituted on the p-position of the aryl group.

The non-nucleophilic anion represented by $X^-$ includes, for example, a sulfonic acid anion, a carboxylic acid anion, a sulfonylimido anion, a bis(alkylsulfonyl)imido anion and a tris(alkylsulfonyl)methyl anion.

The non-nucleophilic anion means an anion having an extremely low ability for causing a nucleophilic reaction and an anion capable of restraining decomposition with the lapse of time by an intramolecular nucleophilic reaction. By means of the non-nucleophilic anion, preservation stability of the resist composition is improved.

Examples of the sulfonic acid anion include an aliphatic sulfonic acid anion, an aromatic sulfonic acid anion and camphorsulfonic acid anion.

Examples of the carboxylic acid anion include an aliphatic carboxylic acid anion, an aromatic carboxylic acid anion and an aralkylcarboxylic acid anion.

The aliphatic group in the aliphatic sulfonic acid anion includes, for example, an alkyl group having from 1 to 30 carbon atoms, specifically, a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group or an eicosyl group, and a cycloalkyl group having from 3 to 30 carbon atoms, specifically, a cyclopropyl group, a cyclopentyl group, a cyclohexyl group, an adamantyl group, a norbornyl group or a bornyl group.

The aromatic group in the aromatic sulfonic acid anion is preferably an aryl group having from 6 to 14 carbon atoms, for example, a phenyl group, a tolyl group or a naphthyl group.

The alkyl group, cycloalkyl group and aryl group in the aliphatic sulfonic acid anion and aromatic sulfonic acid anion may have a substituent.

Examples of the substituent include a nitro group, a halogen atom (for example, a fluorine atom, a chlorine atom, a bromine atom or an iodine atom), a carboxyl group, a hydroxy group, an amino group, a cyano group, an alkoxy group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), an alkoxycarbonyloxy group (preferably having from 2 to 7 carbon atoms) and an alkylthio group (preferably having from 1 to 15 carbon atoms). The aryl group and ring structure included in each of these groups may further have a substituent, for example, an alkyl group (preferably having from 1 to 15 carbon atoms).

The aliphatic moiety in the aliphatic carboxylic acid anion is same as the aliphatic group in the aliphatic sulfonic acid anion.

The aromatic group in the aromatic carboxylic acid anion is same as the aromatic group in the aromatic sulfonic acid anion.

The aralkyl group in the aralkylcarboxylic acid anion is preferably an aralkyl group having from 6 to 12 carbon atoms, for example, a benzyl group, a phenethyl group, a naphthylmethyl group, a naphthylethyl group or a naphthylmethyl group.

The aliphatic group, aromatic group and aralkyl group in the aliphatic carboxylic acid anion, aromatic carboxylic acid anion and aralkylcarboxylic acid anion may have a substituent. Examples of the substituent include those described for the aliphatic sulfonic acid anion, for example, a halogen atom, an alkyl group, a cycloalkyl group, an alkoxy group or an alkylthio group.

Examples of the sulfonylimido anion include saccharin anion.

The alkyl group in the bis(alkylsulfonyl)imido anion or tris(alkylsulfonyl)methyl anion preferably includes an alkyl group having from 1 to 5 carbon atoms, for example, a methyl group, an ethyl group, a propyl group, an isopropyl group, a n-butyl group, an isobutyl group, a sec-butyl group, a pentyl group or a neopentyl group. The alkyl group may have a substituent and examples of the substituent include a halogen atom, an alkyl group substituted with a halogen atom, an alkoxy group and an alkylthio group. Of the substituents, an alkyl group substituted with a fluorine atom is preferable.

Other examples of the non-nucleophilic anion include phosphorus fluoride, boron fluoride and antimony fluoride.

Of the non-nucleophilic anions represented by $X^-$, an aliphatic sulfonic acid anion wherein the α-position of the sulfonic acid is substituted with a fluorine atom, an aromatic sulfonic acid anion substituted with a fluorine atom or a group having a fluorine atom, a bis(alkylsulfonyl)imido anion wherein the alkyl group is substituted with a fluorine atom and a tris(alkylsulfonyl)methyl anion wherein the alkyl group is substituted with a fluorine atom are preferable. As the non-nucleophilic anions for $X^-$, a perfluoroaliphatic sulfonic anion having from 4 to 8 carbon atoms and an aromatic sulfonic acid anion having a fluorine atom are particularly preferable, and nonafluorobutanesulfonic acid anion, perfluorooctanesulfonic acid anion, pentafluorobenzenesulfonic acid anion and 3,5-bis(trifluoromethyl)benzenesulfonic acid anion are most preferred.

Now, Compound (ZI-2) is described below.

Compound (ZI-2) is a compound wherein $R_{201}$ to $R_{203}$ in formula (ZI) each independently represents an organic group which does not include an aromatic ring. The term "aromatic ring" as used herein also includes an aromatic ring containing a hetero atom.

The organic group which does not include an aromatic ring represented by any one of $R_{201}$ to $R_{203}$ has ordinarily from 1 to 30 carbon atoms, and preferably from 1 to 20 carbon atoms.

$R_{201}$ to $R_{203}$ each independently preferably represents an alkyl group, a cycloalkyl group, an allyl group or a vinyl group, more preferably a straight chain, branched or cyclic 2-oxoalkyl group or an alkoxycarbonylmethyl group, and most preferably a straight chain or branched 2-oxoalkyl group.

The alkyl group represented by any one of $R_{201}$ to $R_{203}$ may be straight chain or branched and preferably includes a straight chain or branched alkyl group having from 1 to 10 carbon atoms, for example, a methyl group, an ethyl group, a propyl group, a butyl group or a pentyl group. More preferable examples of the alkyl group include a straight chain or branched 2-oxoalkyl group and an alkoxycarbonylmethyl group.

The cycloalkyl group represented by any one of $R_{201}$ to $R_{203}$ preferably includes a cycloalkyl group having from 3 to 10 carbon atoms, for example, a cyclopentyl group, a cyclohexyl group or a norbornyl group. More preferable examples of the cycloalkyl group include a 2-oxocycloalkyl group.

The 2-oxoalkyl group may be any one of straight chain, branched and cyclic 2-oxoalkyl groups, and preferably includes a 2-oxoalkyl group in which >C=O is present at the 2-position of each of the above-described alkyl group and cycloalkyl group.

The alkoxy group of the alkoxycarbonylmethyl group includes preferably an alkoxy group having from 1 to 5 carbon atoms (for example, a methoxy group, an ethoxy group, a propoxy group, a butoxy group or a pentoxy group).

The group represented by any one of $R_{201}$ to $R_{203}$ may further be substituted with a halogen atom, an alkoxy group (for example, an alkoxy group having from 1 to 5 carbon atoms), a hydroxy group, a cyano group or a nitro group.

Compound (ZI-3) is a compound represented by formula (ZI-3) shown below, and a compound containing a phenacyl-sulfonium salt structure.

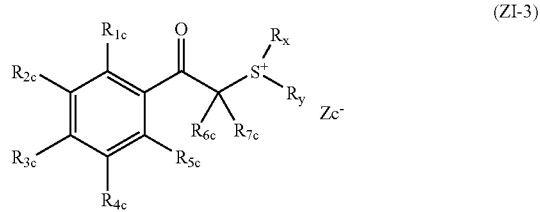

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more of $R_{1c}$ to $R_{7c}$, or $R_x$ and $R^y$ may be combined with each other to form a cyclic structure, and the cyclic structure may include an oxygen atom, a sulfur atom, an ester bond or an amido bond. A group formed by combining with any two or more of $R_{1c}$ to $R_{7c}$ or $R_x$ and $R_y$ includes, for example, a butylene group or a pentylene group.

$Zc^-$ represents a non-nucleophilic anion, and has the same meaning as the non-nucleophilic anion represented by $X^-$ in formula (ZI).

The alkyl group represented by any one of $R_{1c}$ to $R_{7c}$ preferably includes a straight chain or branched alkyl group having from 1 to 20 carbon atoms, for example, a methyl group, an ethyl group, a straight chain or branched propyl group, a straight chain or branched butyl group or a straight chain or branched pentyl group.

The cycloalkyl group represented by any one of $R_{1c}$ to $R_{7c}$ preferably includes a cyclic alkyl group having from 3 to 8 carbon atoms, for example, a cyclopentyl group or a cyclohexyl group.

The alkoxy group represented by any one of $R_{1c}$ to $R_{5c}$ may be any one of a straight chain, branched and cyclic alkoxy groups, and includes, for example, an alkoxy group having from 1 to 10 carbon atoms. Preferable examples thereof include a straight chain or branched alkoxy group having from 1 to 5 carbon atoms (for example, a methoxy group, an ethoxy group, a straight chain or branched propoxy group, a straight chain or branched butoxy group or a straight chain or branched pentoxy group) and a cyclic alkoxy group having from 3 to 8 carbon atoms (for example, a cyclopentyloxy group or a cyclohexyloxy group).

Preferably, any one of $R_{1c}$ to $R_{5c}$ represents a straight chain or branched alkyl group, a cycloalkyl group or a straight chain, branched or cyclic alkoxy group, and more preferably, the total number of carbon atoms included in $R_{1c}$ to $R_{5c}$ is from 2 to 15. This makes it possible to improve solubility in a solvent, whereby the generation of particles during preservation of the resist composition is restrained.

The alkyl group and cycloalkyl group for any one of $R_x$ and $R_y$ are same as the alkyl group and cycloalkyl group for any one of $R_{1c}$ to $R_{7c}$ respectively, and preferably includes a 2-oxoalkyl group, a 2-oxocycloalkyl group and an alkoxycarbonylmethyl group.

Examples of the 2-oxoalkyl group or 2-oxocycloalkyl group include those having >C=O at the 2-position of the alkyl group or cycloalkyl group for any one of $R_{1c}$ to $R_{7c}$.

The alkoxy group of the alkoxycarbonylmethyl group is same as the alkoxy group for any one of $R_{1c}$ to $R_{5c}$.

$R_x$ and $R_y$ each preferably represents an alkyl group having 4 or more carbon atoms, more preferably an alkyl group having 6 or more carbon atoms, and still more preferably an alkyl group having 8 or more carbon atoms.

In formulae (ZII) and (ZIII), $R_{204}$ to $R_{207}$ each independently represents an aryl group, an alkyl group or a cycloalkyl group.

The aryl group represented by any one of $R_{204}$ to $R_{207}$ is preferably a phenyl group or a naphthyl group, and more preferably a phenyl group. The aryl group represented by any one of $R_{204}$ to $R_{207}$ may be an aryl group including a heterocyclic structure containing, for example, an oxygen atom, a nitrogen atom or a sulfur atom. Examples of the aryl group including a heterocyclic structure includes a pyrrole residue (a group formed by eliminating one hydrogen atom from pyrrole), a furan residue (a group formed by eliminating one hydrogen atom from furan), a thiophene residue (a group formed by eliminating one hydrogen atom from thiophene), an indole residue (a group formed by eliminating one hydrogen atom from indole), a benzofuran residue (a group formed by eliminating one hydrogen atom from benzofuran) and a benzothiophene residue (a group formed by eliminating one hydrogen atom from benzothiophene.

The alkyl group represented by any one of $R_{204}$ to $R_{207}$ preferably includes a straight chain or branched alkyl group having from 1 to 10 carbon atoms, for example, a methyl group, an ethyl group, a propyl group, a butyl group or a pentyl group.

The cycloalkyl group represented by any one of $R_{204}$ to $R_{207}$ preferably includes a cyclic alkyl group having from 3 to 10 carbon atoms, for example, a cyclopentyl group, a cyclohexyl group or a norbornyl group.

The substituent which the group represented by any one of $R_{204}$ to $R_{207}$ may have includes an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxy group or a phenylthio group.

$X^-$ represents a non-nucleophilic anion, and has the same meaning as the non-nucleophilic anion represented by $X^-$ in formula (ZI).

Preferable examples of the acid generator further include compounds represented by the following formulae (ZIV), (ZV) and (ZVI).

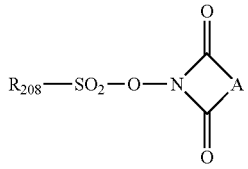

ZIV

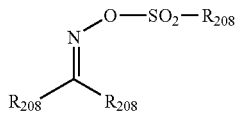

ZV

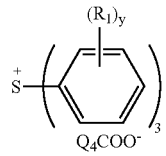

ZVI

In formulae (ZIV), two Ar₃s each independently represents an aryl group.

In formulae (ZV) to (ZVI), R₂₀₈s each independently represents an alkyl group, a cycloalkyl group or an aryl group. These groups have the same meanings as the alkyl group, cycloalkyl group and aryl group defined for $R_{204}$ to $R_{207}$ in formulae (Z1) to (ZIII) respectively.

A represents an alkylene group, an alkenylene group or an arylene group.

Of the acid generators, the compounds represented by formulae (Z1) to (ZIII) are more preferable.

Of the acid generators according to the invention, an acid generator which contains an anion structure including an alkyl group having 4 or less carbon atoms substituted with a fluorine atom, a cycloalkyl group substituted with a fluorine atom or an aromatic group substituted with a fluorine atom and a cationic structure of triarylsulfonium is particularly preferable. As such an acid generator, compounds represented by any one of formulae (B1) to (B3) shown below are exemplified.

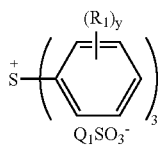

(B1)

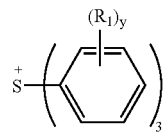

(B2)

(B3)

In formulae (B1) to (B3), $R_1$ represents an alkyl group, an alicyclic hydrocarbon group, a hydroxy group, a carboxyl group, an alkoxy group or a halogen atom.

y each independently represents an integer of 0 to 5. When y is 2 or more, two or more $R_1$s is may be the same or different from each other.

$Q_1$ to $Q_4$ each independently represents an alkyl group having from 1 to 8 carbon atoms substituted with a fluorine atom, a cycloalkyl group substituted with a fluorine atom, an aryl group substituted with a fluorine atom or an aryl group substituted with a fluorinated alkyl group.

In particular, compounds represented by formula (B2) wherein $Q_2$ and $Q_3$ are combined with each other to form a cyclic structure are preferable in view of the improvement in exposure latitude.

The alkyl group represented by $R_1$ is preferably a straight chain or branched alkyl group having from 1 to 15 carbon atoms and includes, for example, a methyl group, an ethyl group, a propyl group, a n-butyl group, a sec-butyl group and a tert-butyl group.

The alicyclic hydrocarbon group represented by $R_1$ is preferably a cycloalkyl group having from 3 to 15 carbon atoms and includes, for example, a cyclopropyl group, a cyclobutyl group, a cyclopentyl group, a cyclohexyl group, a norbornyl group and an adamantyl group.

The alkyl group substituted with a fluorine atom represented by any one of $Q_1$ to $Q_4$ includes, for example, —CF₃, —C₂F₅, -n-C₃F₇, -n-C₄F₉, -n-C₈F₁₇, —CF(CF₃)₂, —CH(CF₃)₂, —(CF₂)₂OCF₂CF₃, —(CF₂)₂O(CH₂)₃CH₃, —(CF₂)₂ O(CH₂)₃CH₃ and —(CF₂)₂O(CF₂)₂(CH₂)₃CH₃. The alkyl group having from 1 to 4 carbon atoms substituted with a fluorine atom represented by any one of $Q_1$ to $Q_4$ may further have a substituent, for example, an alkoxy group or a fluoroalkoxy group.

The aryl group substituted with a fluorine atom represented by any one of $Q_1$ to $Q_4$ includes, for example, a 2,3,4,5,6-pentafluorophenyl group, a 2,3,4-trifluorophenyl group, a 2,4-difluorophenyl group, a 4-fluorophenyl group and a 4-undecanyloxy-2,3,5,6-tetrafluorophenyl group.

The aryl group substituted with a fluorinated alkyl group includes, for example, a 3-trifluoromethylphenyl group, 3,5-bis(trifluoromethyl)phenyl group, a 4-trifluoromethylphenyl group and a 4-n-nonafluorobutylphenyl group.

Particularly preferable examples of the acid generator are specifically set forth below, but the invention should not be construed as being limited thereto.

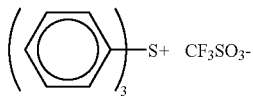

(z1)

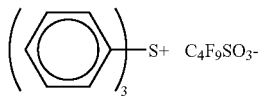

(z2)

-continued
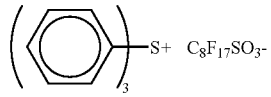 (z3)
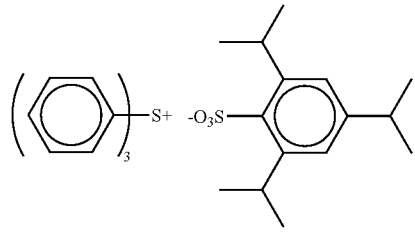 (z4)
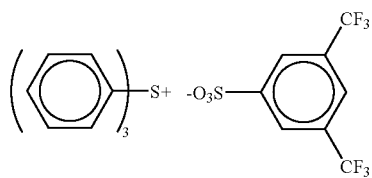 (z5)
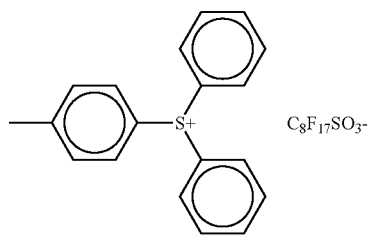 (z6)
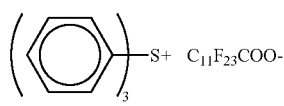 (z7)
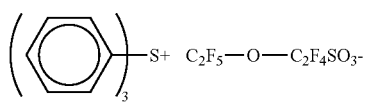 (z8)
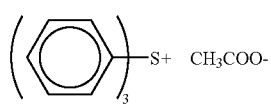 (z9)
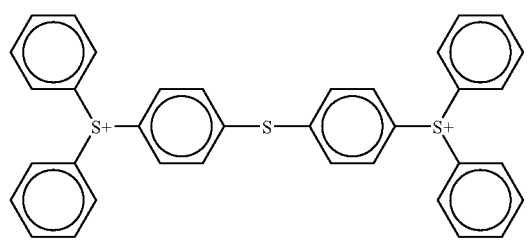 
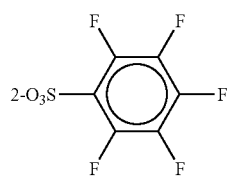 (z10)
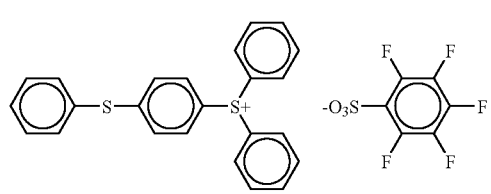 (z11)
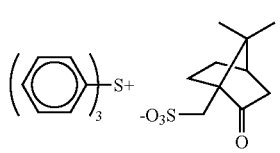 (z12)
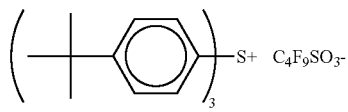 (z13)
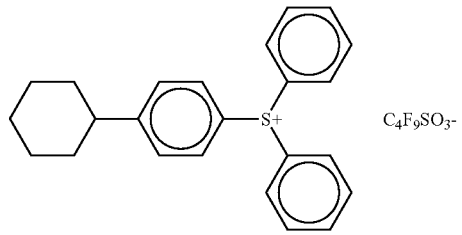 (z14)
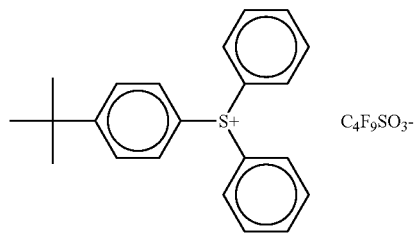 (z15)
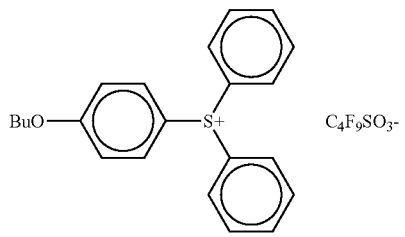 (z16)

-continued
(z17) 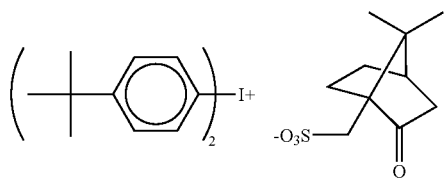
(z18) 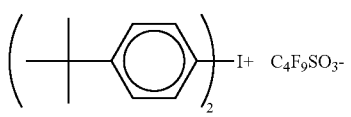
(z19) 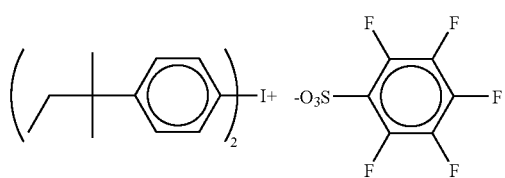
(z20) 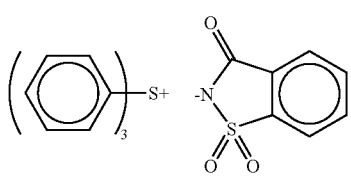
(z21) 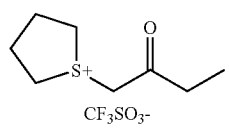
(z22) 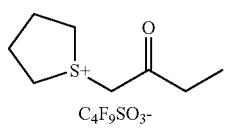
(z23) 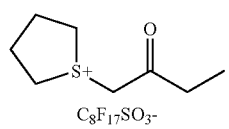
(z24) 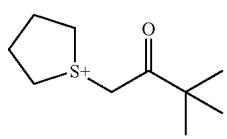
(z25) 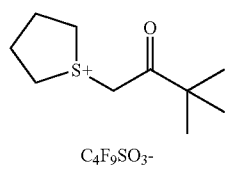
(z26) 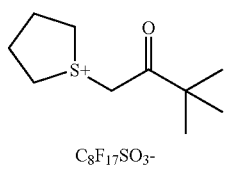
(z27) 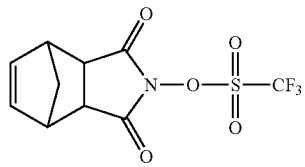
(z28) 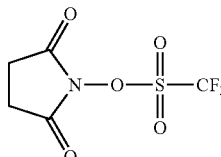
(z29) 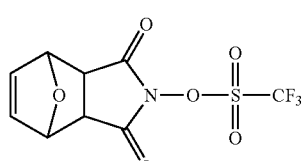
(z30) 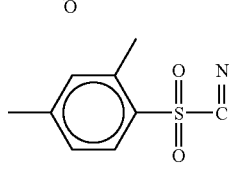
(z31) 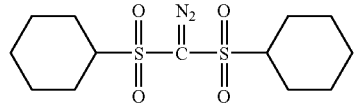
(z32) 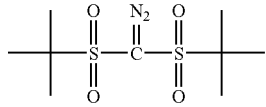
(z33) 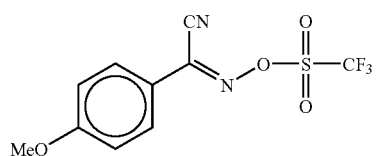
(z34) 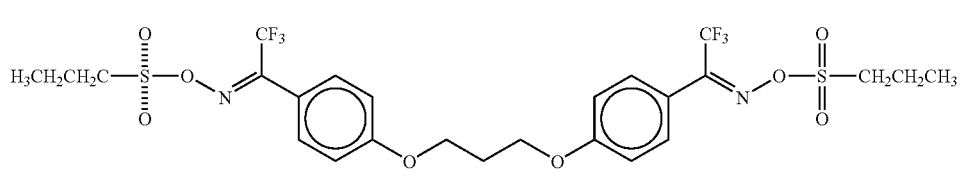

-continued
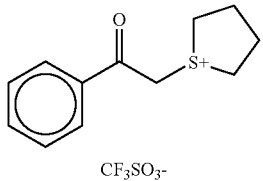 (z35)
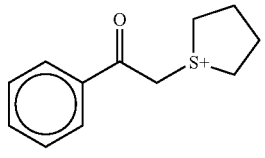 (z36)
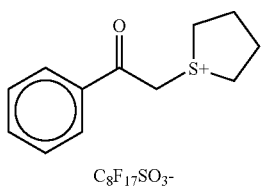 (z37)
(z38)
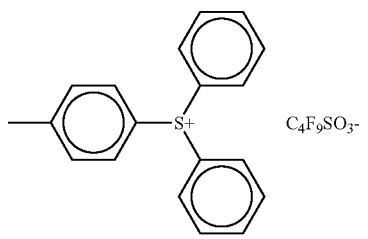
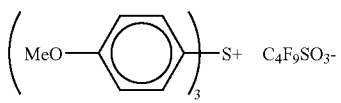 (z39)
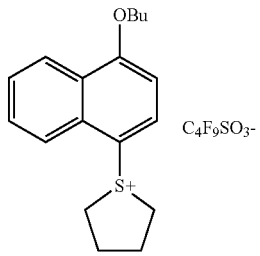 (z40)
 (z41)
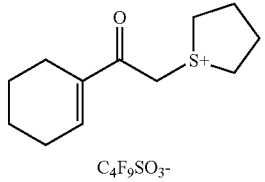 (z42)
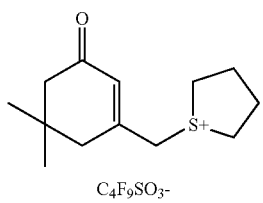 (z43)
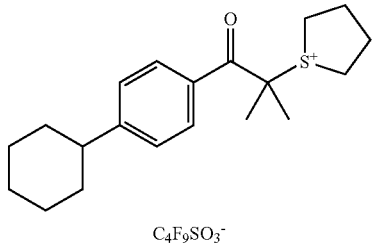 (z44)
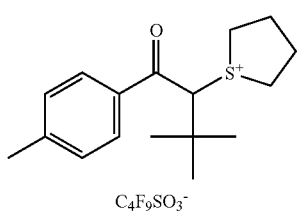 (z45)
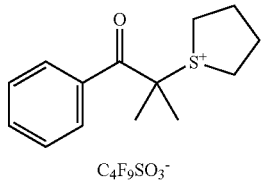 (z46)
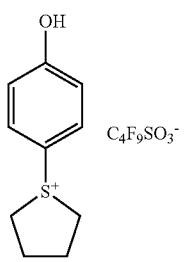 (z47)
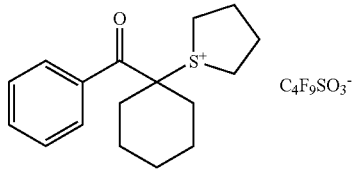 (z48)

-continued
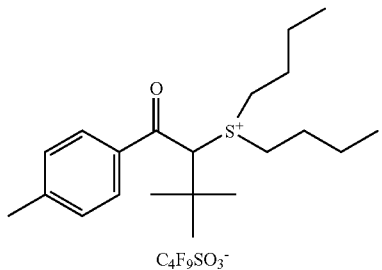 (z49)
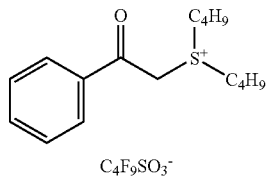 (z50)
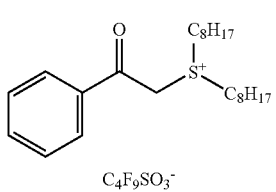 (z51)
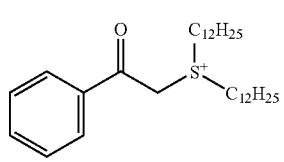 (z52)
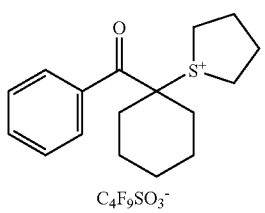 (z53)
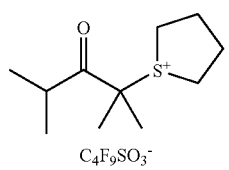 (z54)
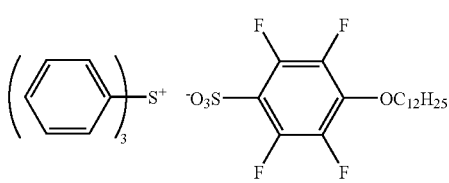 (z55)
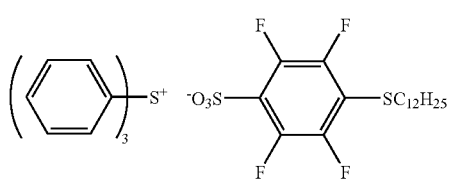 (z56)
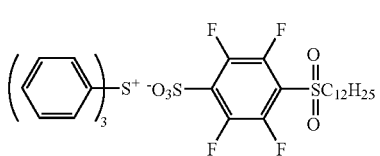 (z57)
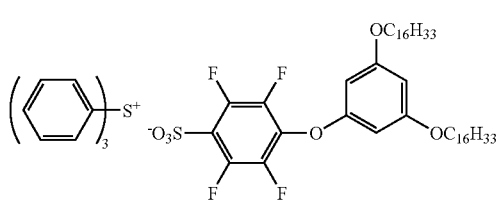 (z58)
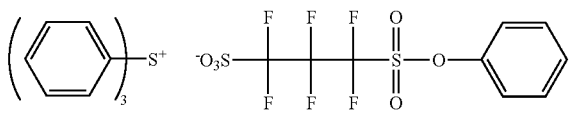 (z59)
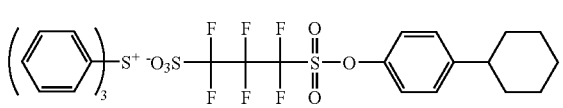 (z60)
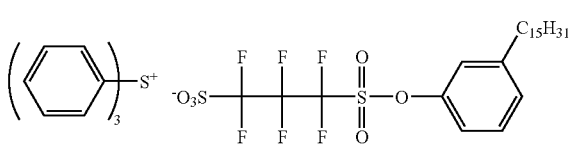 (z61)
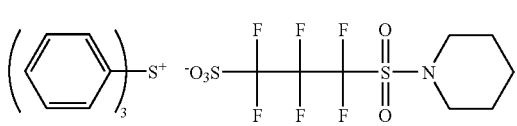 (z62)

-continued
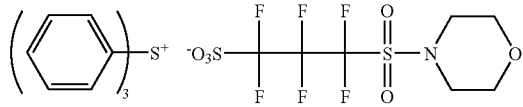
(z63)
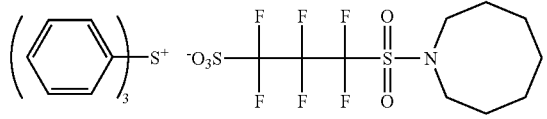
(z64)
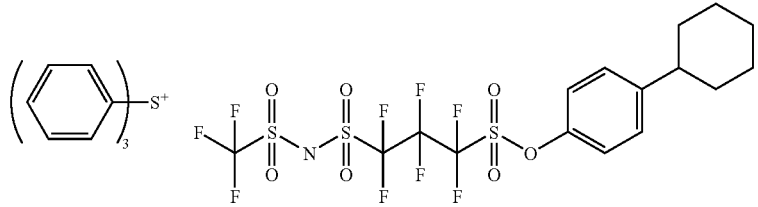
(z65)
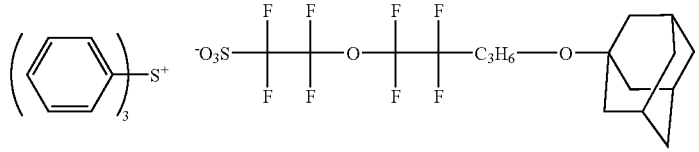
(z66)
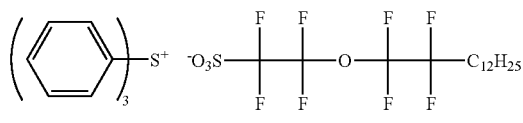
(z67)
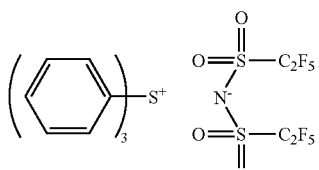
(z68)
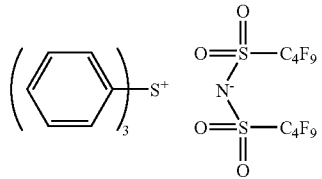
(z69)
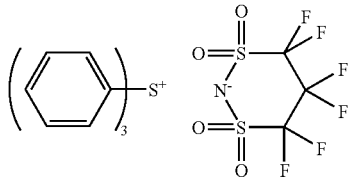
(z70)
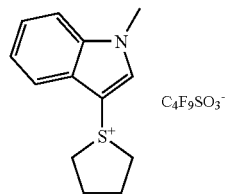
(z71)
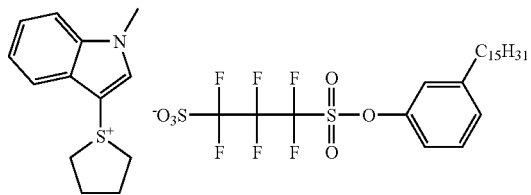
(z72)
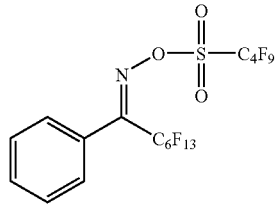
(z73)
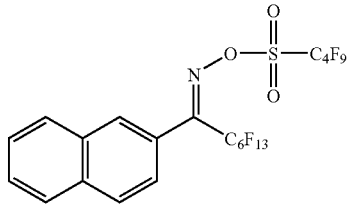
(z74)

-continued
(z75)
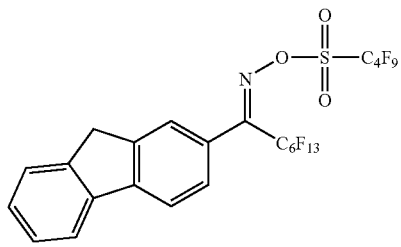
(z76)
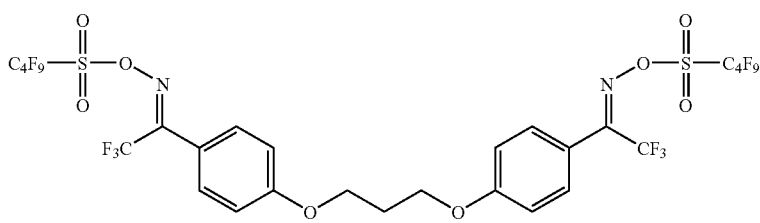
(z77)
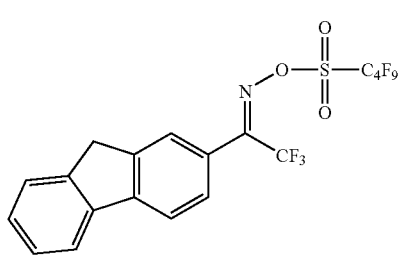
Ba-1
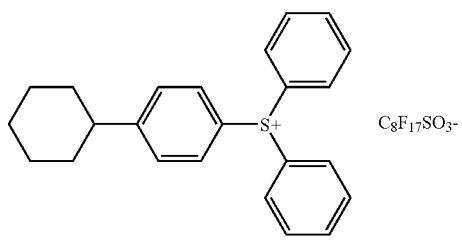
Ba-2
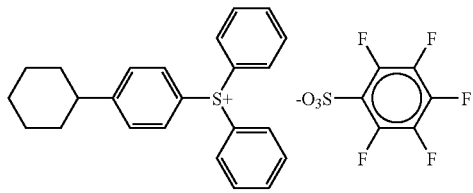
Ba-3
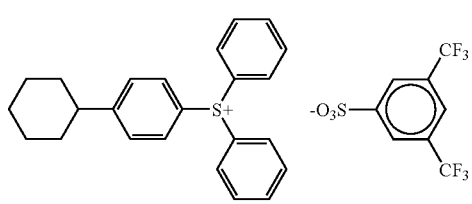
Ba-4
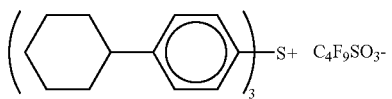
Ba-5
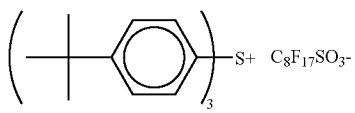
Ba-6
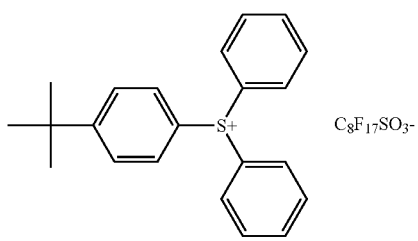
Ba-7
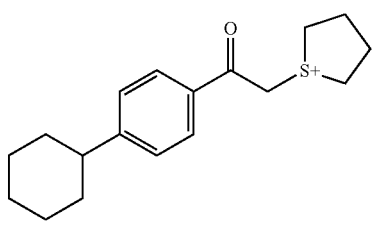
Ba-8
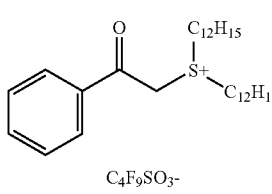
Ba-9
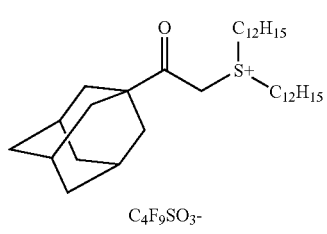

-continued
| | |
|---|---|
| Ba-10 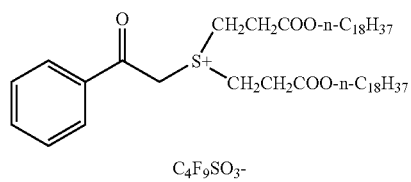 | Ba-11 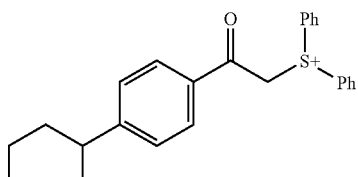 |
| Ba-12 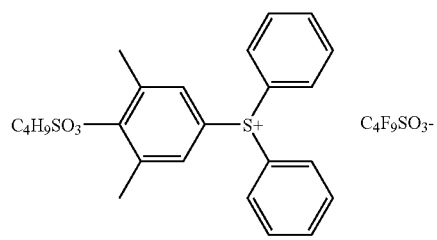 | Ba-13 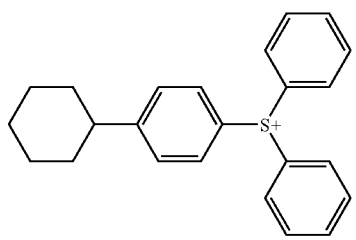 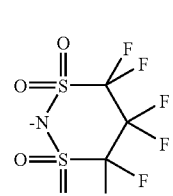 |
| Ba-14 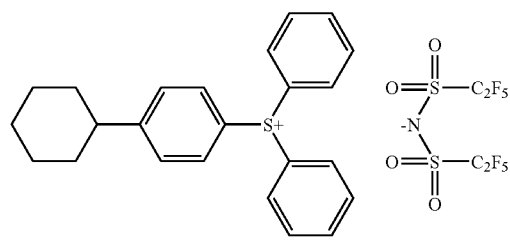 | Bb-1 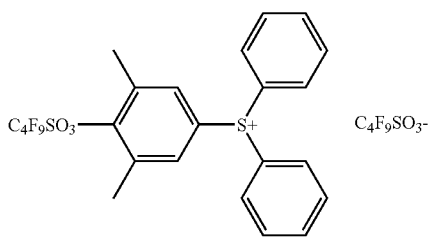 |
| Bb-2 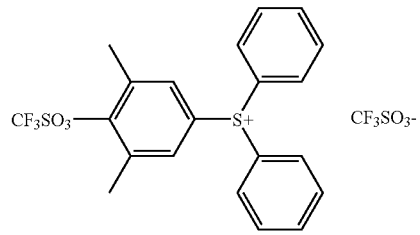 | Bb-3 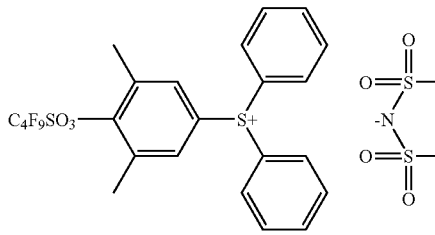 |
| Bb-4 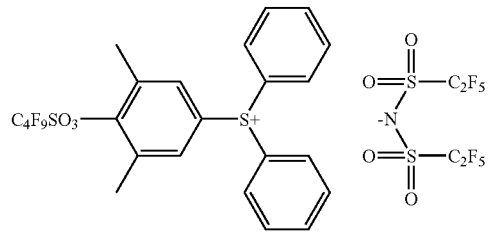 | Bb-5 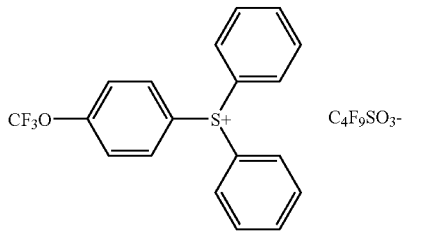 |
| Bb-6 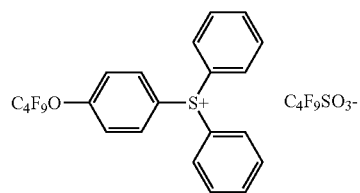 | Bb-7 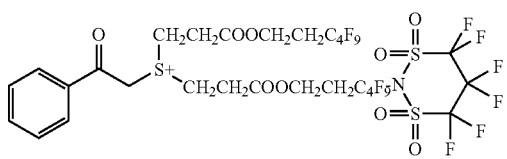 |
| Bb-8 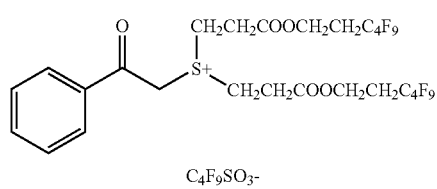 | Bc-1 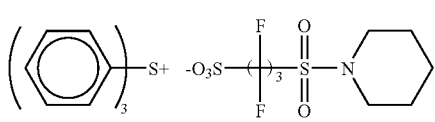 |

-continued
Bc-2
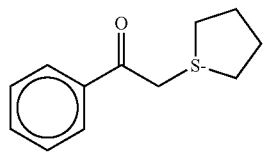
Bc-3
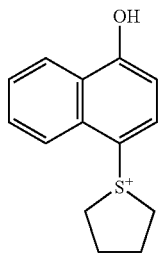
Bc-4
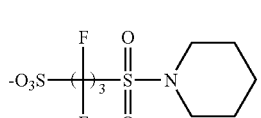
Bc-5
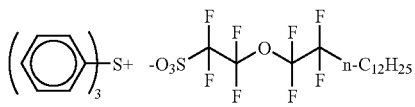
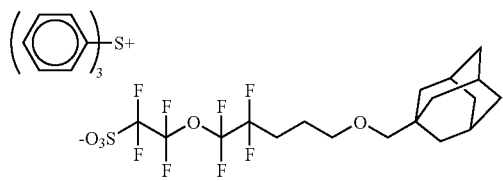
Bc-6
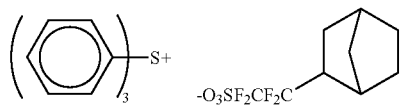
Bc-7
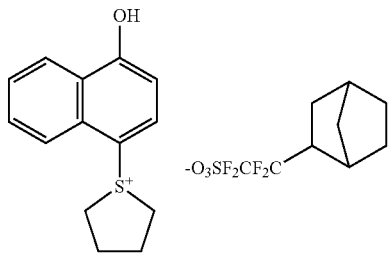
Bc-8
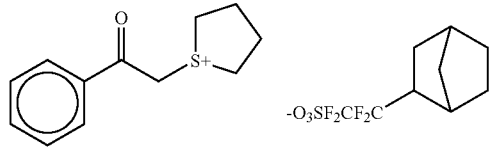
Bc-9
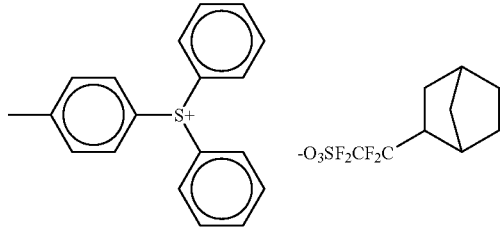
Bc-10
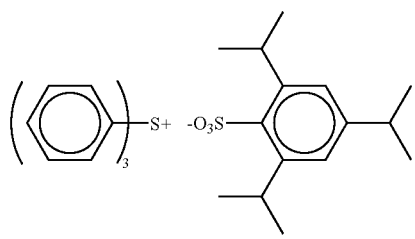
Bc-11
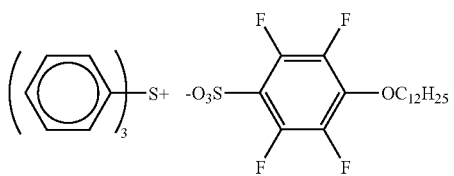
Bc-12
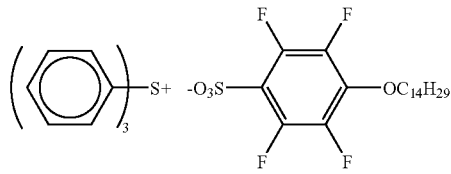
Bc-13
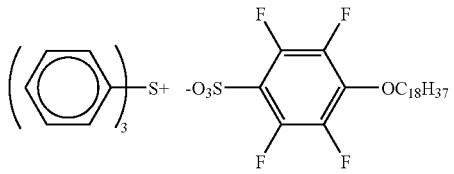
Bc-14
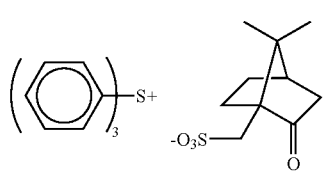
Bc-15
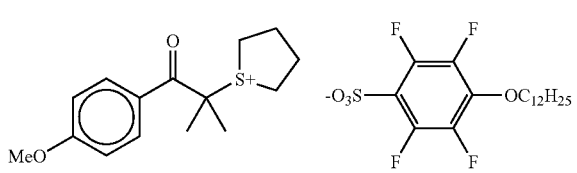

-continued
Bc-16
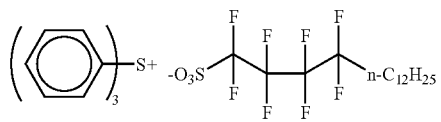
BaBc-1
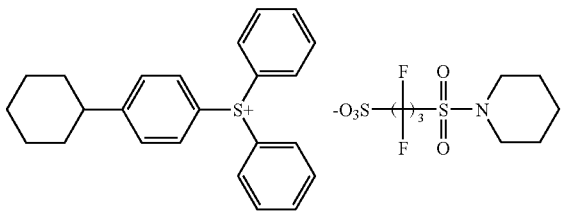
BaBc-2
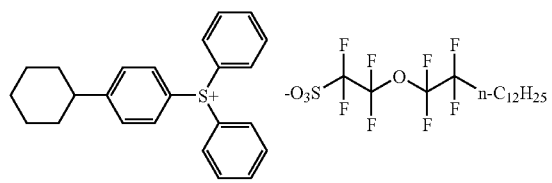
BaBc-3
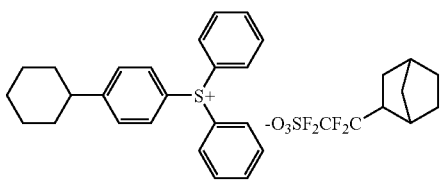
BaBc-4
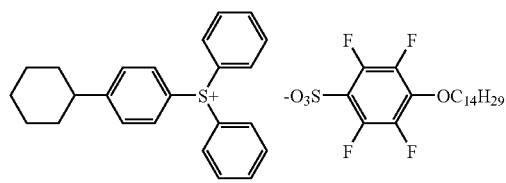
BaBc-5
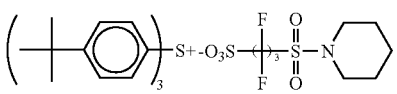
BaBc-6
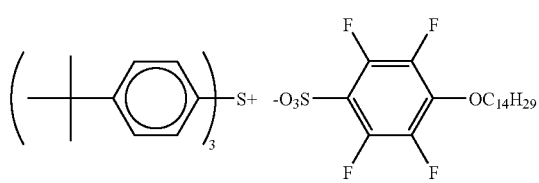
BaBc-7
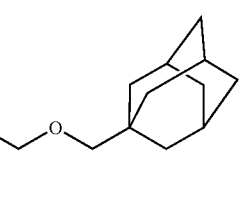
BaBc-8
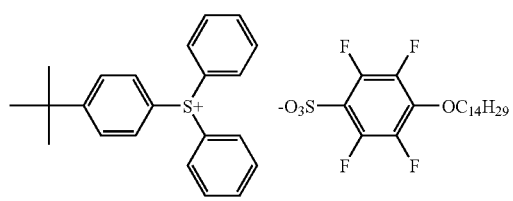
BaBc-9
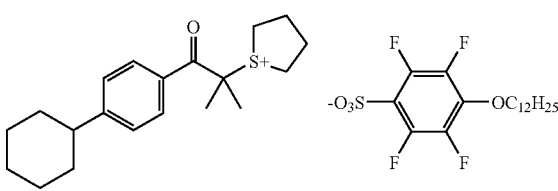
BaBc-10
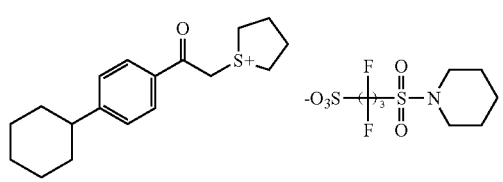
BaBc-11
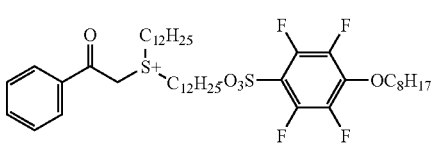

-continued
BaBc-12
BaBc-13
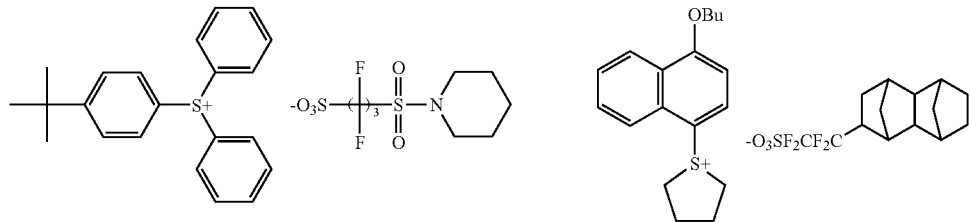
BbBc-1
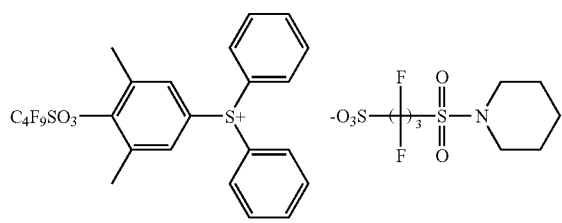
BbBc-2
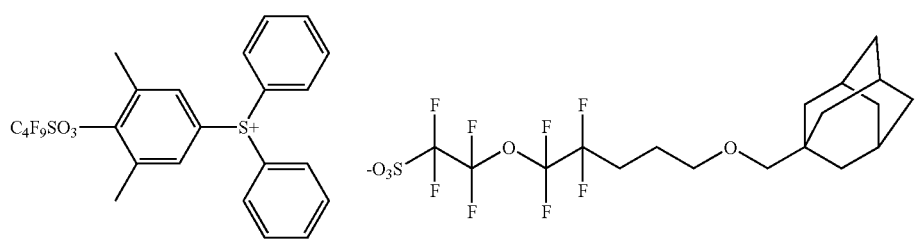
BbBc-3
BbBc-4
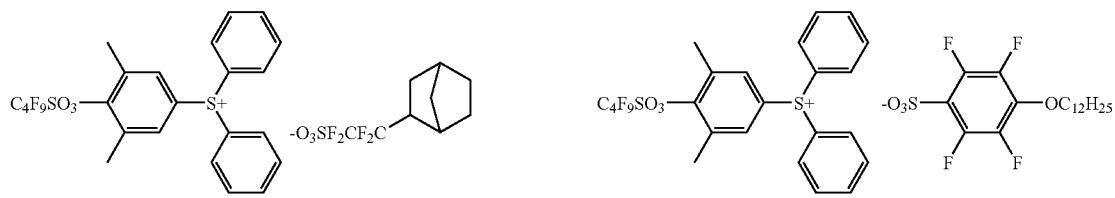
BbBc-5
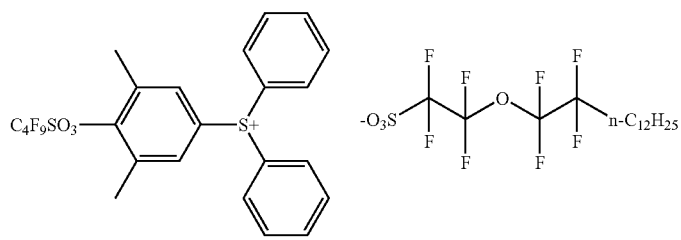
BbBc-6
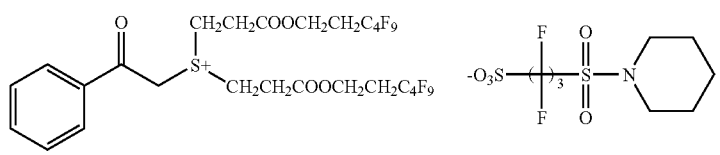
BbBc-7

-continued
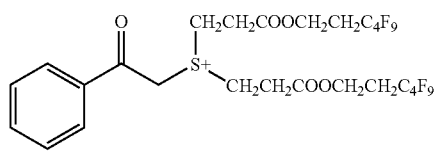 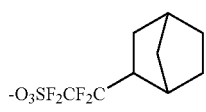
BbBc-8
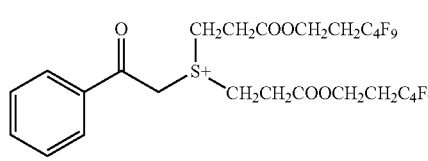 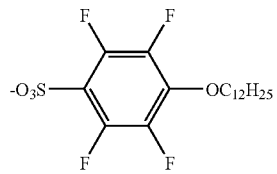
BbBc-9
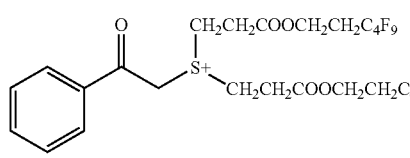 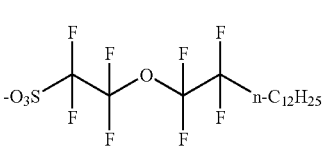
BbBc-10
BbBc-11 BbBc-12
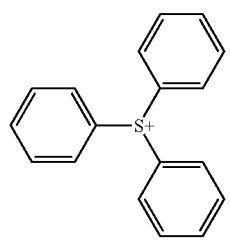 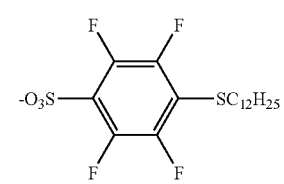 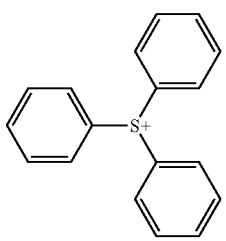 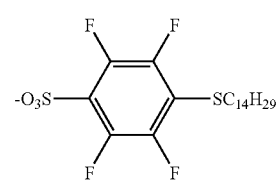
(PAG4-1) (PAG4-2)
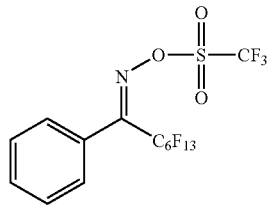 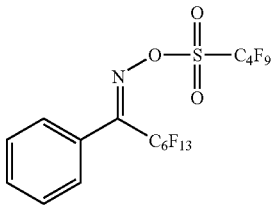
(PAG4-3) (PAG4-4)
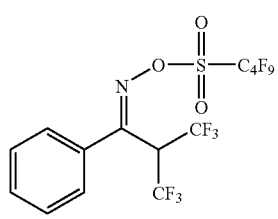 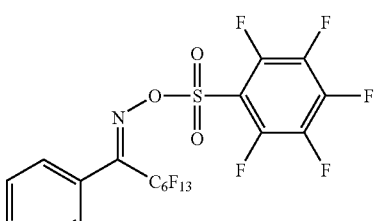
(PAG4-5) (PAG4-6)
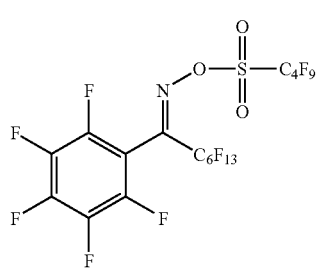 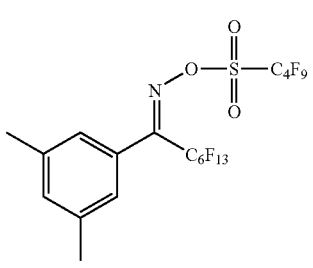

-continued
(PAG4-7)
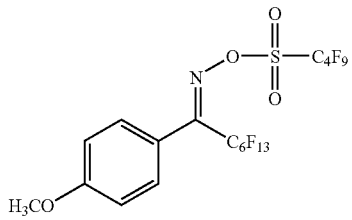
(PAG4-8)
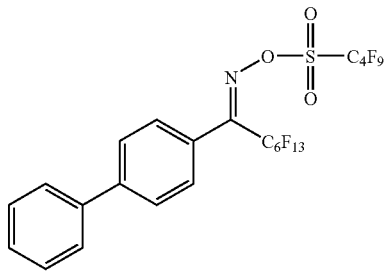
(PAG4-9)
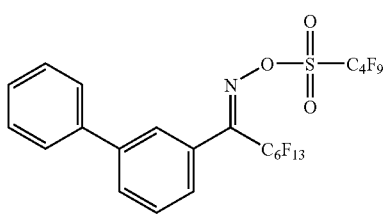
(PAG4-10)
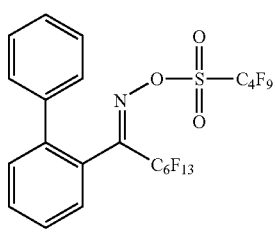
(PAG4-11)
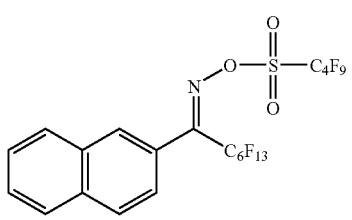
(PAG4-12)
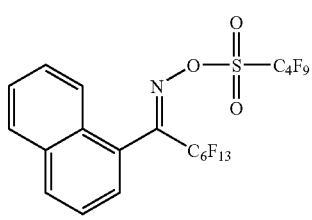
(PAG4-13)
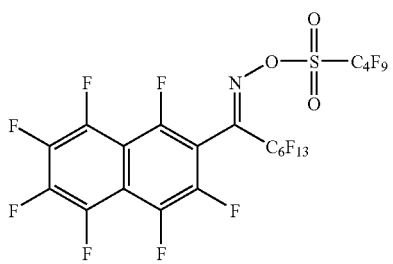
(PAG4-14)
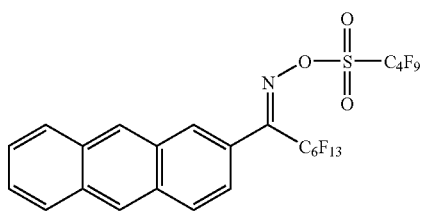
(PAG4-15)
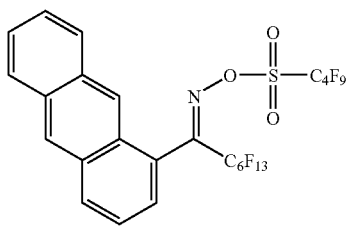
(PAG4-16)
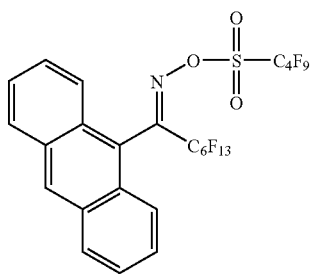
(PAG4-17)
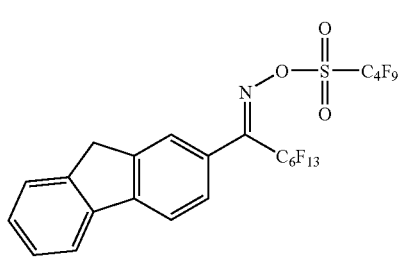
(PAG4-18)
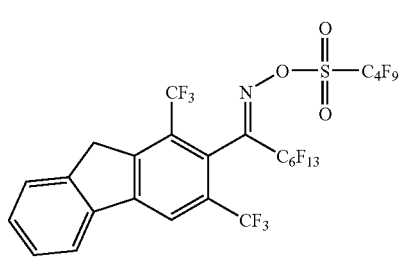

-continued

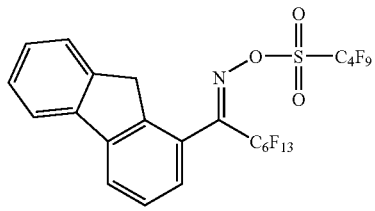
(PAG4-19)

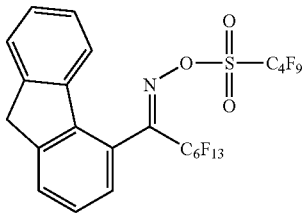
(PAG4-20)

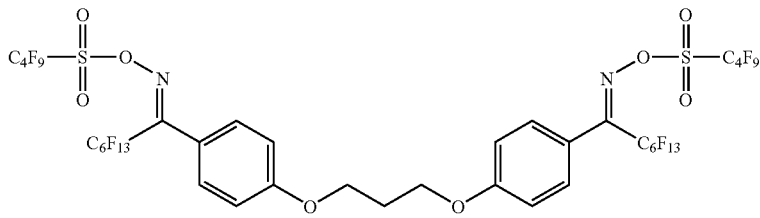
(PAG4-21)

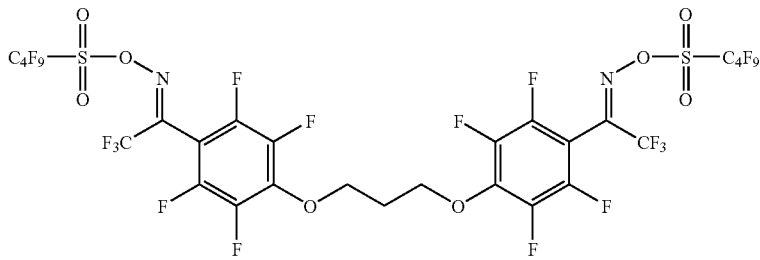
(PAG4-22)

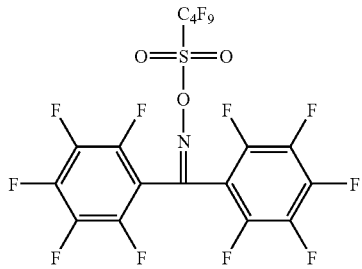
(PAG4-23)

The acid generators may be used individually or in combination of two or more thereof.

The content of the acid generator in the positive resist composition is preferably from 0.1 to 20% by weight, more preferably from 0.5 to 10% by weight, and still more preferably from 1 to 7% by weight, based on the total solid content of the positive resist composition.

[3] (C) Solvent

Examples of the solvent used in the positive resist composition of the invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

According to the invention, the solvents may be used individually or as a mixture thereof. It is preferred to use a mixed solvent comprises two or more kinds of solvents having different functional groups. As the mixed solvent comprising two or more kinds of solvents having different functional groups, a mixed solvent of a solvent having a hydroxy group in its structure and a solvent having no hydroxy group in its structure or a mixed solvent of a solvent having an ester structure and a solvent having a ketone structure is preferably used. This makes it possible to reduce the occurrence of particles during storage of the resist solution.

Examples of the solvent having a hydroxy group include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are more preferable.

Examples of the solvent having no hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Of these solvents, propylene glycol monomethyl ether acetate, ethyl ethoxypropionate, 2-heptanone, γ-butyrolactone, cyclohexanone and butyl acetate are more preferable, and propylene glycol monomethyl ether acetate, ethyl ethoxypropionate, 2-heptanone and cyclohexanone are particularly preferable.

The mixing ratio (by weight) of the solvent having a hydroxy group to the solvent having no hydroxy group is ordinarily from 1/99 to 99/1, preferably from 10/90 to 90/10, and more preferably from 20/80 to 60/40. A mixed solvent containing 50% by weight or more of the solvent having no hydroxy group is preferable in view of uniformity of coating.

In the mixed solvent of a solvent having an ester structure and a solvent having a ketone structure, the solvent having a ketone structure includes, for example, cyclohexanone and 2-heptanone, and preferably cyclohexanone. The solvent having an ester structure includes, for example, propylene glycol monomethyl ether acetate, ethyl ethoxypropionate, γ-butyrolactone and butyl acetate, and preferably propylene glycol monomethyl ether acetate.

The mixing ratio (by weight) of the solvent having an ester structure to the solvent having a ketone structure is ordinarily from 1/99 to 99/1, preferably from 10/90 to 90/10, and more preferably from 20/80 to 60/40. A mixed solvent containing 50% by weight or more of the solvent having an ester structure is particularly preferable in view of uniformity of coating.

[D] Basic Compound

The positive resist composition of the invention preferably contains a basic compound for the purpose, for example, of reduction of fluctuations in performances occurred with the passage of time from exposure to heating.

The basic compound preferably includes compounds having a structure represented by any one of formulae (A) to (E) shown below.

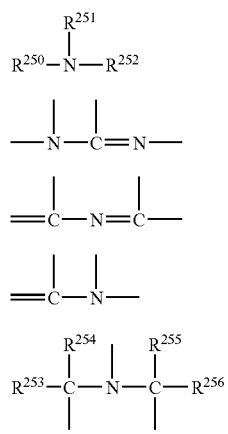

In the above formula, $R^{250}$, $R^{251}$ and $R^{252}$ each independently represent a hydrogen atom, an alkyl group having from 1 to 20 carbon atoms, a cycloalkyl group having from 3 to 20 carbon atoms or an aryl group having from 6 to 20 carbon atoms, or $R^{250}$ and $R^{251}$ may be combined with each other to form a ring. These groups may have a substituent. Preferable examples of the substituted alkyl group and substituted cycloalkyl group include an aminoalkyl group having from 1 to 20 carbon atoms, an aminocycloalkyl group having from 3 to 20 carbon atoms, a hydroxyalkyl group having from 1 to 20 carbon atoms and a hydroxycycloalkyl group having from 3 to 20 carbon atoms.

The alkyl chain described above may contain an oxygen atom, a sulfur atom or a nitrogen atom.

In the above formula, $R^{253}$, $R^{254}$, $R^{255}$ and $R^{256}$ each independently represent an alkyl group having from 1 to 20 carbon atoms or a cycloalkyl group having from 3 to 20 carbon atoms.

Preferable examples of the basic compound include guanidines, aminopyrrolidines, pyrazoles, pyrazolines, piperazines, aminomorpholines, aminoalkylmorpholines and piperidines each of which may have a substituent. More preferable examples of the basic compound include compounds having an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond.

The compound having an imidazole structure includes, for example, imidazole, 2,4,5-triphenylimidazole and benzimidazole. The compound having a diazabicyclo structure includes, for example, 1,4-diazabicyclo[2,2,2]octane, 1,5-diazabicyclo[4,3,0]non-5-ene and 1,8-diazabicyclo[5,4,0]undec-7-ene. The compound having an onium hydroxide structure includes, for example, a triarylsulfonium hydroxide, phenacyl sulfonium hydroxide and a 2-oxoalkyl group-containing sulfonium hydroxide, specifically, triphenylsulfonium hydroxide, tris(tert-butylphenyl)sulfonium hydroxide, bis(tert-butylphenyl)iodonium hydroxide, phenacyl thiophenium hydroxide or 2-oxopropyl thiophenium hydroxide. The compound having an onium carboxylate structure includes, for example, a compound wherein an anion portion of the compound having an onium hydroxide structure is replaced by a carboxylate, e.g., acetate, adamantane-1-carboxylate or a perfluoroalkyl carboxylate. The compound having a trialkylamine structure includes, for example, tri(n-butyl)amine and tri(n-octyl)amine. The compound having an aniline structure includes, for example, 2,6-diisopropylaniline and N,N-dimethylaniline. The alkylamine derivative having a hydroxy group and/or an ether bond includes, for example, ethanolamine, diethanolamine, triethanolamine and tris(methoxyethoxyethyl)amine. The aniline derivatives having a hydroxy group and/or an ether bond includes, for example, N,N-bis(hydroxyethyl)aniline.

The basic compounds may be used individually or in combination of two or more thereof in the positive resist composition of the invention. The amount of the basic compound used is ordinarily from 0.001 to 10% by weight, preferably from 0.01 to 5% by weight, based on the total solid content of the positive resist composition. From the standpoint of obtaining the sufficient effect of addition of basic compound, the amount is preferably 0.001% by weight or more and it is preferably 10% by weight or less in view of sensitivity and developing property of the unexposed area.

[5] (E) Dissolution inhibiting compound (hereinafter also referred to as component (E) or a "dissolution inhibiting compound") having a molecular weight of 3,000 or less, which is decomposed by the action of an acid to increase solubility in an alkali developing solution.

As the dissolution inhibiting compound (E), which is decomposed by the action of an acid to increase solubility in an alkali developing solution and has a molecular weight of 3,000 or less, an alicyclic or aliphatic compound containing an acid-decomposable group, for example, a cholic acid derivative containing an acid-decomposable group described in *Proceeding of SPIE*, 2724, 355 (1966) is preferable, for the purpose of preventing deterioration in transmittance in a wavelength range of 220 nm or shorter. Examples of the acid-decomposable group and alicyclic structure are same as those described hereinbefore with respect to the alicyclic hydrocarbon type acid-decomposable resin.

In the case wherein the positive resist composition of the invention is exposed with a KrF excimer laser or irradiated with an electron beam, it is preferred to use a phenol compound in which a phenolic hydroxy group included is substituted with an acid-decomposable group. The phenol compound is preferably that having from 1 to 9 phenol skeletons, and more preferably that having from 2 to 6 phenol skeletons.

The molecular weight of the dissolution inhibiting compound for use in the invention is 3,000 or less, preferably from 300 to 3,000, and more preferably from 500 to 2,500.

The amount of the dissolution inhibiting compound added is preferably from 3 to 50% by weight, more preferably from 5 to 40% by weight, based on the total solid content of the positive resist composition.

Specific examples of the dissolution inhibiting compound are set forth below, but the invention should not be construed as being limited thereto.

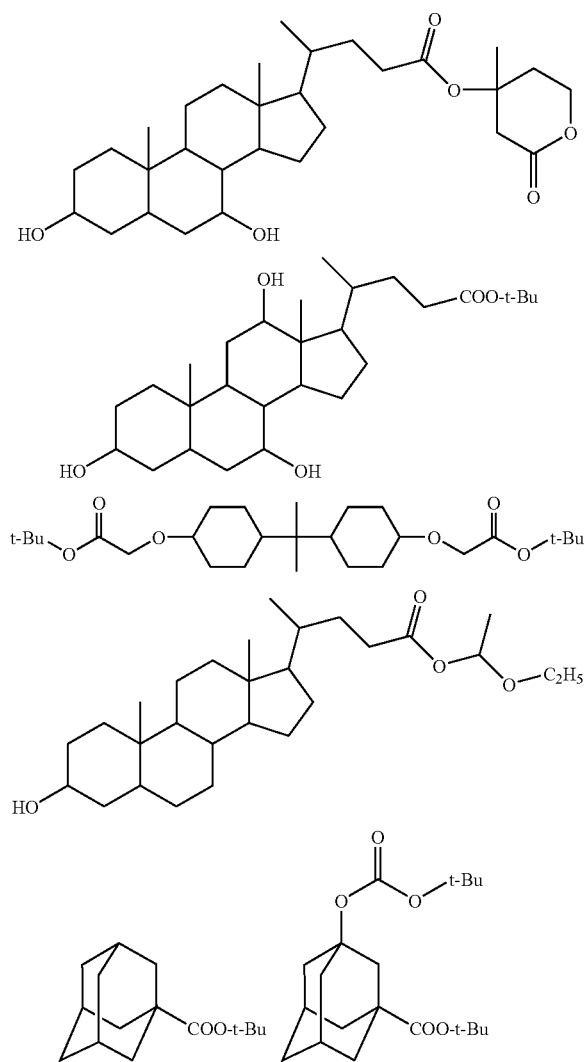

-continued

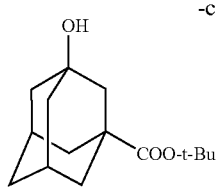

[6] (F) Surfactant

The positive resist composition of the invention preferably contains a surfactant, and more preferably one or more of fluorine-base and/or silicon-base surfactants (a fluorine-base surfactant, a silicon-base surfactant and a surfactant containing both a fluorine atom and a silicon atom).

By the incorporation of the fluorine-base and/or silicon-base surfactant, the positive resist composition of the invention can provide, with favorable sensitivity and resolution, resist patterns having good adhesion property and less development defect, when an exposure light source of 250 nm or shorter, especially 220 nm or shorter, is used.

Examples of the fluorine-base and/or silicon-base surfactant include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants as described below can also be used as they are.

Examples of the commercially available surfactant used include fluorine-base or silicon-base surfactants, for example, Eftop EF301 or EF303 (produced by Shin-Akita Kasei Co., Ltd.), Florad FC430, FC431 or FC4430 (produced by Sumitomo 3M Ltd.), Megafac F171, F173, F176, F189, F113, F110, F177, F120 and R08 (produced by Dainippon Ink and Chemicals, Inc.), Surflon S-382, SC101, SC102, SC103, SC104, SC105 and SC106 (produced by Asahi Glass Co., Ltd.), Troysol S-366 (produced by Troy Chemical Corp.), GF-300 and GF-150 (produced by Toagosei Co., Ltd.), Surflon S-393 (produced by Seimi Chemical Co., Ltd.), Eftop EF121, EF122A, EF 122B, RF122C, EF125M, EF135M, EF351, EF352, EF801, EF802 and EF601 (produced by Jemco Inc.), PF636, PF656, PF6320 and PF6520 (produced by OMNOVA Solutions, Inc.) and FTX-204D, 208G, 218G, 230G, 204D, 208D, 212D, 218D and 222D (produced by Neos Co., Ltd.). A polysiloxane polymer KP-341 (produced by Shin-Etsu Chemical Co., Ltd.) is also used as the silicon-base surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene))acrylate and/or (poly(oxyalkylene))methacrylate is preferable. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethyleneoxypropylene-oxyethylene block connecting) group or poly(oxyethylene-oxypropylene block connecting) group may be used. Further, the copolymer of a monomer having a fluoroaliphatic group with a (poly(oxyalkylene))acrylate (or methacrylate) may be not only a binary copolymer but also a ternary or more copolymer obtained by copolymerizing simultaneously two or more different monomers having a fluoroaliphatic group with two or more different (poly(oxyalkylene))acrylates (or methacrylates).

Examples of the polymer including a fluoroaliphatic group include commercially available surfactants, for example, Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene))acrylate (or methacrylate), copolymers of acrylate (or methacrylate) having a $C_6F_{13}$ group, (poly(oxyethylene))acrylate (or methacrylate) and (poly(oxypropylene))acrylate (or methacrylate), copolymers of acrylate (or methacrylate) having a $C_8F_{17}$ group and (poly(oxyalkylene))acrylate (or methacrylate), copolymers of acrylate (or methacrylate) having a $C_8F_{17}$ group, (poly(oxyethylene))acrylate (or methacrylate) and (poly(oxypropylene))acrylate (or methacrylate are exemplified.

A surfactant other than the fluorine-base and/or silicon-base surfactant may be used in the photosensitive composition according to the invention. Specific examples thereof include nonionic surfactants, for example, polyoxyethylene alkyl ethers, e.g., polyoxyethylene lauryl ether, polyoxyethylene stearyl ether, polyoxyethylene cetyl ether or polyoxyethylene oleyl ether, polyoxyethylene alkyl aryl ethers, e.g., polyoxyethylene octyl phenol ether or polyoxyethylene nonyl phenol ethers, polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate or sorbitan tristearate, and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surfactants may be used individually or in combination of two or more thereof.

The amount of the surfactant used is preferably from 0.0001 to 2% by weight, more preferably from 0.001 to 1% by weight, based on the total amount of the positive resist composition (exclusive of the solvent).

<Other Additives>

The positive resist composition of the invention may contain, if desired, other additives, for example, a dye, a light-absorbing agent, a plasticizer, a surfactant other than the component (F), a photosensitizer or a dissolution accelerating compound in a developing solution.

The dissolution accelerating compound in a developing solution for use in the invention is a low molecular weight compound having a molecular weight of 1,000 or less and containing at least two phenolic hydroxy groups or at least one carboxyl group. In case of containing a carboxyl group, the dissolution accelerating compound is preferably an alicyclic or aliphatic compound.

The amount of the dissolution accelerating compound added is preferably from 2 to 50% by weight, more preferably from 5 to 30% by weight, based on the resin (A). The amount is preferably 50% or less in view of restrain of development residue and prevention of deformation of pattern at the development.

Such a phenol compound having a molecular weight of 1,000 or less can be easily synthesized by one skilled in the art with reference to methods as described, for example, in JP-A-4-122938, JP-A-2-28531, U.S. Pat. No. 4,916,210 and European Patent 219,294.

Specific examples of the alicyclic or aliphatic compound containing a carboxy group include a carboxylic acid derivative having a steroid structure, for example, cholic acid, deoxycholic acid or lithocholic acid, an adamantanecarboxylic acid derivative, adamantanedicarboxylic acid, cyclohexanecarboxylic acid and cyclohexanedicarboxylic acid, but the invention should not be construed as being limited thereto.

As the plasticizer, as well as commercially available plasticizers, any compound having a molecular weight of 1,000 or less which is compatible with the polymer used and has an effect of decreasing a softening point of the layer can be used without particular limitation. From the standpoint of the compatibility, the molecular weight of the plasticizer is preferably 750 or less, and more preferably 500 or less. Also, the compound having a boiling point of 300° C. or higher and a melting point of 20° C. or lower at normal pressures is preferable. Specific examples of the plasticizer include diisobutyl phthalate, tricresyl phosphate, triethyleneglycol diphenyl ether, diethyleneglycol dibenzoate and triethyleneglycol diacetate.

As the light-absorbing agent, any compound which has absorption at the exposure wavelength and does not generate an acid upon exposure can be used without particular limitation. When the exposure wavelength is 193 nm, a compound including an aromatic ring is preferably used. Specific examples of the light-absorbing agent include a benzene derivative, a naphthalene derivative, an anthracene derivative, a furan derivative, a thiophene derivative and an indole derivative.

(Pattern Formation Method)

The positive resist composition of the invention is used by dissolving the above-described components in a solvent, preferably in the mixed solvent described above and coating on a desired substrate in the following manner.

Specifically, the positive resist composition is coated on a substrate (for example, silicon/silicon dioxide coating) as used for the production of a precise integrated circuit device by an appropriate coating method, for example, spinner or coater, and dried to form a resist film.

The resist film is irradiated with an actinic ray or radiation through a desired mask, preferably subjected to baking (heating) and then developed. Thus, good patterns can be obtained.

At the irradiation with an actinic ray or radiation, exposure (immersion exposure) may be carried out in the state of filling between the resist film and the lens with a liquid having a refractive index higher than air. This makes it possible to increase resolution.

The actinic ray or radiation for the exposure includes, for example, an infrared ray, visible light, an ultraviolet ray, a far ultraviolet ray, an X-ray and an electron beam, and it is preferably a far ultraviolet ray having a wavelength of 250 nm or less, more preferably 220 nm or less. Specific examples thereof include a KrF excimer laser (248 nm), an ArF excimer laser (193 nm), an $F_2$ excimer laser (157 nm), an X-ray and an electron beam. An ArF excimer laser, an $F_2$ excimer laser, EUV (13 nm) and an electron beam are preferable.

Prior to the formation of resist film, an anti-reflective coating may be previously provided on the substrate.

As the anti-reflective coating, any of an inorganic coating type, for example, titanium, titanium dioxide, titanium nitride, chromium oxide, carbon or amorphous silicon and an organic coating type comprising a light-absorbing agent and a polymer material can be used. Also, a commercially available organic anti-reflective coating, for example, DUV-30 Series and DUV-40 Series (produced by Brewer Science, Inc.) and AR-2, AR-3 and AR-5 (produced by Shipley Co., Ltd.) are employed as the organic anti-reflective coating.

In the development step, an alkali developing solution as described below is used. The alkali developing solution used for the resist composition of the invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A solution prepared by adding an appropriate amount of an alcohol or a surfactant to the alkali developing solution described above is also used.

The alkali concentration in the alkali developing solution is ordinarily from 0.1 to 20% by weight.

The pH of the alkali developing solution is ordinarily from 10.0 to 15.0.

EXAMPLES

The invention will be described in more detail with reference to the following examples, but the invention should not be construed as being limited thereto.

Synthesis Example 1

Synthesis of Resin (A-1)

Monomer-1, Monomer-2 and Monomer-3 represented by the structural formulae shown below in a molar ratio of 40/20/40 were dissolved in a mixture of PGMEA (propylene glycol monomethyl ether acetate and PGME (propylene glycol monomethyl ether) (7/3 in a weight ratio) to prepare 450 g of a solution having a solid concentration of 15% by weight. To the solution was added 1% by mole of a polymerization initiator (V-601 produced by Wako Pure Chemical Industries, Ltd.), and the solution was added dropwise to 50 g of a mixed solution of PGMEA (propylene glycol monomethyl ether acetate) and PGME (propylene glycol monomethyl ether) (7/3 in a weight ratio) heated at 100° C. under nitrogen atmosphere over a period of 6 hours. After the completion of the dropwise addition, the reaction solution was stirred for 2 hours. After the termination of the reaction, the reaction solution was cooled to room temperature and poured into 5 liters of a mixed solvent of n-heptane and ethyl acetate (9/1) to crystallize, and the white powder deposited was collected by filtration to recover the desired Resin (A-1).

A polymer composition ratio (by mole) of the resin determined by NMR was 40/20/40. A weight average molecular weight thereof measured by GPC method and calculated in terms of standard polystyrene was 8,300 and a dispersion degree was 1.95.

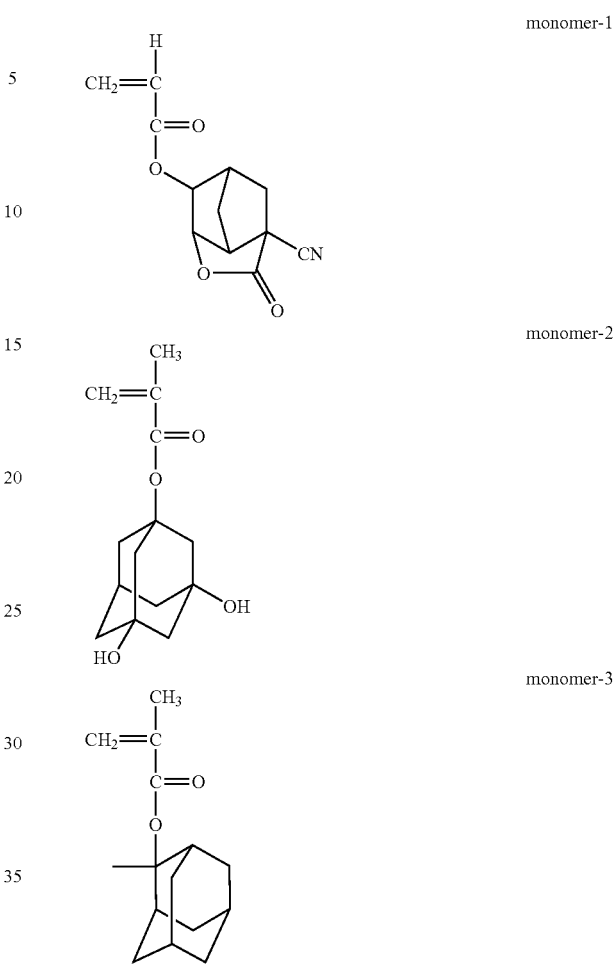

Examples 1 to 8 and Comparative Example 1

<Preparation of Resist>

Each solution having the composition shown in Table 1 below was prepared and filtered through a polytetrafluoroethylene filter or a polyethylene filter having a pore size of 0.1 μm to prepare a positive resist solution. The positive resist solution thus-prepared was evaluated according to the methods described below. The results obtained are shown in Table 1.

<Evaluation of Resist>

An organic anti-reflective coating (ARC29A, produced by Nissan Chemical Industries, Ltd.) was coated on a silicon wafer and baked at 205° C. for 60 seconds to form an anti-reflective coating having a thickness of 78 nm. The positive resist solution prepared above was coated on the anti-reflective coating and baked at 115° C. for 60 seconds to from a resist film having a thickness of 150 nm. The wafer obtained was subjected to pattern exposure using an ArF excimer laser scanner (PAS5500/1100, produced by ASML; NA= 0.75; σo/σi=0.85/0.55). The exposed wafer was heated at 110° C. for 60 seconds, developed with an aqueous tetramethylammonium hydroxide solution (2.38% by weight) for 30 seconds, rinsed with pure water and spin-dried to obtain a resist pattern.

Line Edge Roughness (LWR):

A distance from the standard line where the edge should be present was measured in 50 points in the area of a length of 5 μm in the longitudinal direction of the line pattern using a critical dimension scanning electron microscope (S-8840, produced by Hitachi, Ltd.), and after determining the standard deviation, 3σ was calculated. It is indicated that as the value is smaller, the performance is better.

Exposure Latitude (EL):

An exposure amount necessary for reproducing a mask pattern of line and space having a line width of 80 nm with the post-exposure baking just after the exposure was determined as an optimal exposure amount. While changing the exposure amount, a range of exposure amount in which the line width reproduced is present in the region of 80 nm±10% is determined. The value obtained was divided by the optimal exposure amount to obtain the exposure latitude which was expressed in percentage.

PEB Temperature Dependency:

An exposure amount necessary for reproducing line and space 1/1 having a mask size of 110 nm with the post-exposure baking at 120° C. for 90 seconds was determined as an optimal exposure amount. Then, the wafer was exposed with line and space 1/1 having a mask size of 110 nm in the optimal exposure amount and subjected to the post-exposure baking at two kinds of temperatures, that is, a temperature of the above post-exposure baking temperature+2° C. (122° C.) and a temperature of the above post-exposure baking temperature−2° C. (118° C.), respectively. The resulting line and spaces were subjected to length measurement to determine their line widths $L_1$ and $L_2$ respectively. The PEB temperature dependency was defined as fluctuation of the line width per temperature difference of 1° C. and calculated according to the following formula:

PEB Temperature Dependency $(nm/° C.)=(L_1-L_2)/4$

It is indicated that as the value is smaller, the fluctuation of performance due to the change in the post-exposure baking temperature is small which is more preferable.

Pattern Collapsing:

An exposure amount necessary for reproducing a mask pattern of line and space 1:1 having a line width of 110 nm was determined as an optimal exposure amount. With respect to a dense pattern of line and space 1:1, when exposed in the optimal exposure amount, a line width capable of being resolved without pattern collapsing in a finer mask size is determined as a marginal line width of pattern collapsing. It is indicated that as the value is smaller, finer pattern can be resolved without pattern collapsing and the pattern collapsing hardly occurs.

TABLE 1

| | Resin (Aa) | | | | | | Resin (Ab) | | | | | |
|---|---|---|---|---|---|---|---|---|---|---|---|---|
| | Compound No. | Mw | Mw/Mn | Composition Ratio | | | Part by Weight | Compound No. | Mw | Mw/Mn | Composition Ratio | | | Part by Weight |
| Example 1 | A-1 | 8,300 | 1.95 | 40 | 20 | 40 | 56.1 | A-2 | 8,200 | 1.88 | 45 | 15 | 40 | 40.0 |
| Example 2 | A-2 | 7,900 | 1.85 | 50 | 15 | 35 | 56.5 | A-3 | 8,100 | 1.81 | 35 | 20 | 45 | 40.0 |
| Example 3 | A-3 | 8,600 | 1.96 | 50 | 10 | 40 | 76.6 | A-4 | 7,900 | 1.79 | 30 | 20 | 50 | 20.0 |
| Example 4 | A-4 | 9,100 | 1.83 | 55 | 10 | 35 | 74.9 | A-5 | 8,800 | 1.81 | 55 | 15 | 30 | 20.0 |
| Example 5 | A-5 | 9,100 | 1.90 | 50 | 25 | 25 | 64.7 | A-6 | 8,100 | 2.06 | 40 | 20 | 40 | 30.0 |
| Example 6 | A-6 | 9,400 | 1.82 | 50 | 20 | 30 | 59.6 | A-7 | 7,700 | 1.77 | 50 | 15 | 35 | 35.0 |
| Example 7 | A-7 | 7,400 | 1.87 | 65 | 10 | 25 | 65.3 | A-8 | 8,100 | 2.06 | 45 | 20 | 35 | 30.0 |
| Example 8 | A-8 | 8,400 | 2.01 | 35 | 20 | 45 | 59.2 | A-4 | 9,100 | 1.96 | 50 | 10 | 40 | 35.0 |
| Comparative Example 1 | P-1 | 8,000 | 1.94 | 40 | 20 | 40 | 54.6 | P-2 | 8,200 | 1.82 | 40 | 20 | 40 | 40.0 |

| | Acid Generator 1 | | Acid Generator 2 | | Basic Compound 1 | | Basic Compound 2 | | Additive | | Surfactant | |
|---|---|---|---|---|---|---|---|---|---|---|---|---|
| | Compound No. | Part by Weight | Compound No. | Part by Weight | Compound No. | Part by Weight | Compound No. | Part by Weight | Compound No. | Part by Weight | Compound No. | Part by Weight |
| Example 1 | PAG-1 | 2.7 | PAG-3 | 0.5 | N-1 | 0.25 | — | — | — | — | W-1 | 0.50 |
| Example 2 | PAG-2 | 2.2 | — | — | N-2 | 0.30 | — | — | AD-1 | 0.5 | W-2 | 0.50 |
| Example 3 | PAG-7 | 2.2 | — | — | N-5 | 0.25 | — | — | AD-1 | 0.5 | W-2 | 0.50 |
| Example 4 | PAG-3 | 2.3 | PAG-7 | 1.5 | N-3 | 0.30 | — | — | AD-1 | 0.5 | W-2 | 0.50 |
| Example 5 | PAG-3 | 2.5 | PAG-8 | 1.5 | N-5 | 0.30 | — | — | AD-3 | 0.5 | W-2 | 0.50 |
| Example 6 | PAG-4 | 4.7 | — | — | — | — | — | — | AD-1 | 0.2 | W-1 | 0.50 |
| Example 7 | PAG-1 | 3.5 | PAG-5 | 0.2 | N-2 | 0.40 | N-1 | 0.10 | — | — | W-1 | 0.50 |
| Example 8 | PAG-5 | 4.5 | — | — | N-7 | 0.15 | — | — | AD-2 | 0.7 | W-4 | 0.50 |
| Comparative Example 1 | PAG-1 | 4.5 | — | — | N-8 | 0.40 | — | — | — | — | W-2 | 0.50 |

| | Solvent | | | | | | Evaluation Result of Performance | | | |
|---|---|---|---|---|---|---|---|---|---|---|
| | Solvent 1 | Part by Weight | Solvent 2 | Part by Weight | Solvent 3 | Part by Weight | LWR (nm) | EL (%) | PEB Temperature Dependency (nm/° C.) | Pattern Collapsing (nm) |
| Example 1 | SL-1 | 940 | SL-6 | 627 | — | — | 4.8 | 19.1 | 3.2 | 57.3 |
| Example 2 | SL-1 | 1021 | SL-5 | 531 | SL-8 | 15 | 4.4 | 19.5 | 2.7 | 54.5 |
| Example 3 | SL-1 | 1021 | SL-6 | 531 | SL-8 | 15 | 4.0 | 20.1 | 2.0 | 53.0 |

TABLE 1-continued

| Example 4 | SL-1 | 1036 | SL-4 | 531 | — | — | 4.5 | 21.1 | 2.6 | 51.5 |
| Example 5 | SL-1 | 1036 | SL-4 | 531 | — | — | 5.2 | 20.4 | 3.3 | 54.0 |
| Example 6 | SL-1 | 1323 | SL-6 | 244 | — | — | 4.6 | 19.5 | 2.8 | 55.1 |
| Example 7 | SL-1 | 1308 | SL-6 | 244 | SL-8 | 15 | 4.0 | 20.4 | 2.2 | 52.5 |
| Example 8 | SL-1 | 1105 | SL-6 | 442 | SL-7 | 20 | 4.0 | 19.0 | 2.1 | 55.2 |
| Comparative Example 1 | SL-1 | 1087 | SL-4 | 480 | — | — | 6.6 | 16.4 | 4.5 | 65.2 |

With respect to the resins (Aa) and (Ab) shown in Table 1, the compound numbers and structures thereof are set forth below.

The composition ratio of each of the resins (Aa) and (Ab) shown in Table 1 is indicated by a molar ratio and corresponds to each of the repeating units shown below in left to right order.

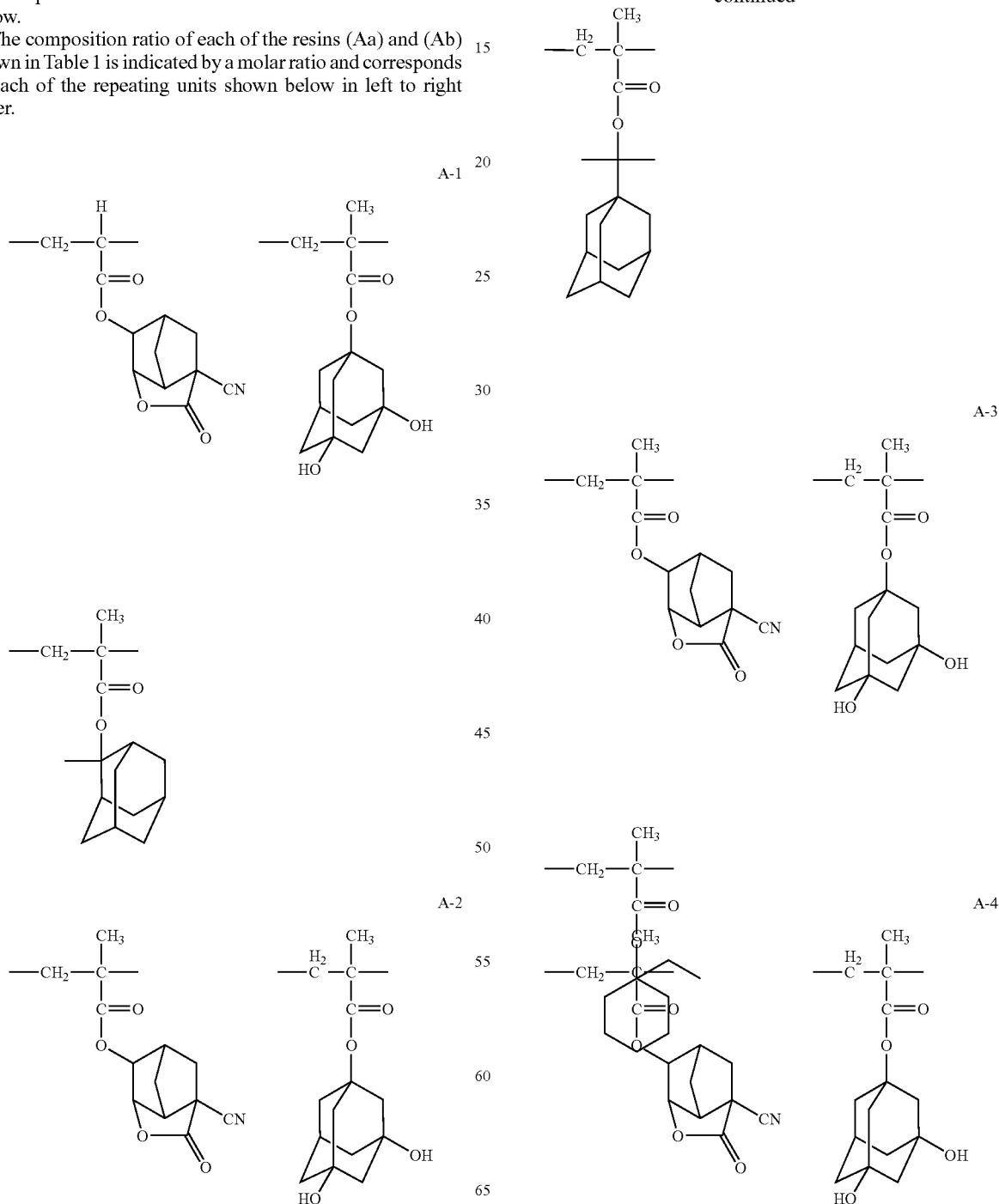

-continued
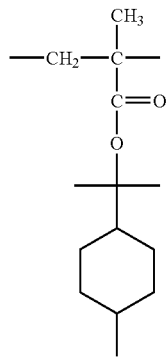
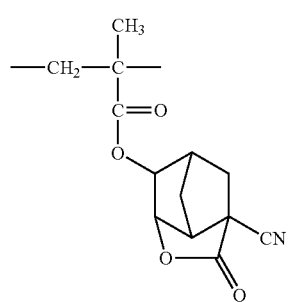
A-5
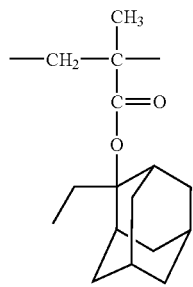
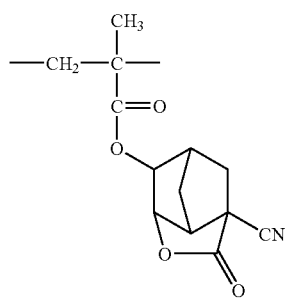
A-6
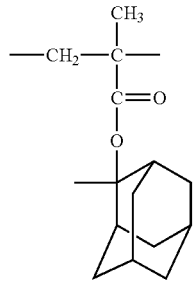
-continued
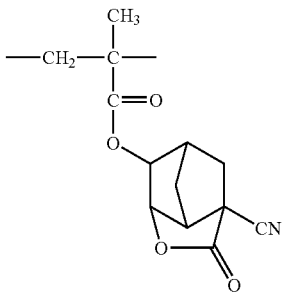
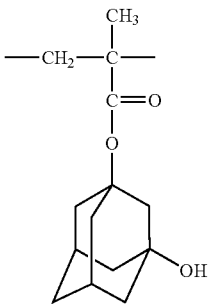
A-7
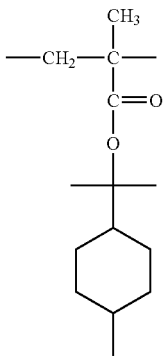
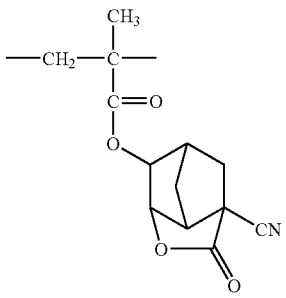
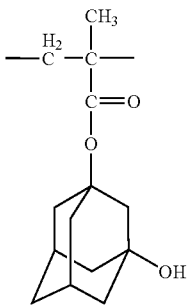
A-8
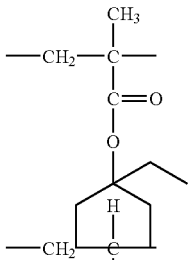
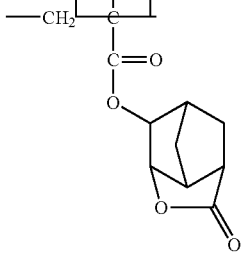
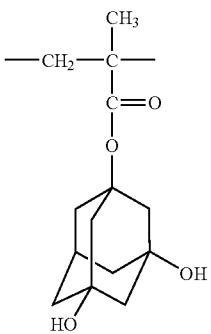
P-1

-continued
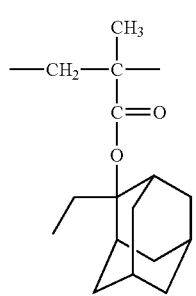
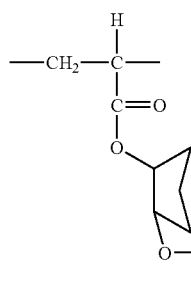
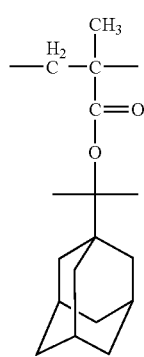
With respect to the acid generators shown in Table 1, the compound numbers and structures thereof are set forth below.
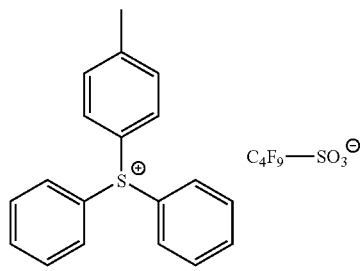
PAG-1
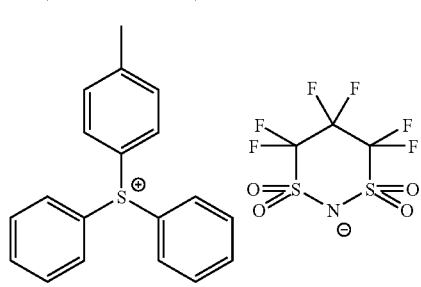
PAG-2
-continued
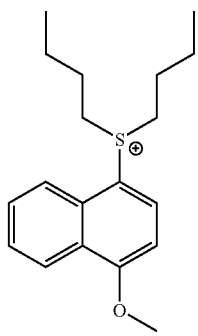
PAG-3
PAG-4
PAG-5
PAG-6
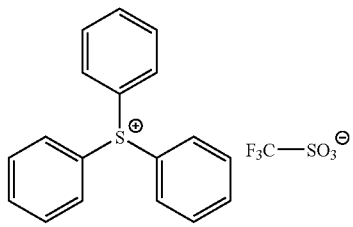
PAG-7
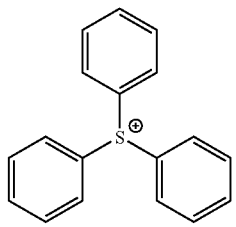
PAG-8

With respect to the additives shown in Table 1, the compound numbers and structures thereof are set forth below.

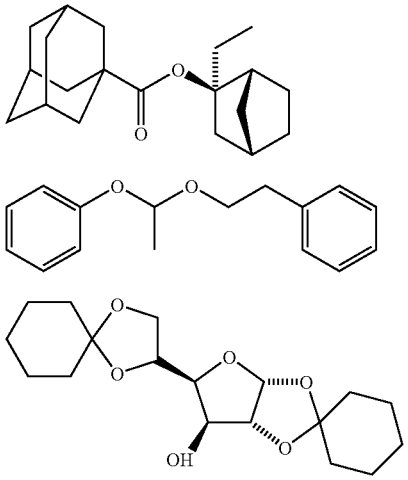

AD-1

AD-2

AD-3

With respect to the basic compounds shown in Table 1, the compounds corresponding to the compound numbers are set forth below.
N-1: N,N-Dibutylaniline
N-2: Trioctylamine
N-3: N,N-Dihydroxyethylaniline
N-4: 2,4,5-Triphenylimidazole
N-5: 2,6-Diisopropylaniline
N-6: Hydroxyantipyrine
N-7: Trismethoxymethoxyethylamine
N-8: Triethanolamine With respect to the surfactants shown in Table 1, the compounds corresponding to the compound numbers are set forth below.
W-1: Megafac F176 (produced by Dainippon Ink and Chemicals, Inc.) (fluorine-based)
W-2: Megafac R08 (produced by Dainippon Ink and Chemicals, Inc.) (fluorine- and silicon-based)
W-3: Polysiloxane polymer KP-341 (produced by Shin-Etsu Chemical Co., Ltd.) (silicon-based)
W-4: Troysol S-366 (produced by Troy Chemical Corp.)
W-5: KH-20 (produced by Asahi Kasei Corp.)

With respect to the solvents shown in Table 1, the compounds corresponding to the compound numbers are set forth below.
SL-1: Propylene glycol monomethyl ether acetate
SL-2: Propylene glycol monomethyl ether propionate
SL-3: 2-Heptanone
SL-4: Ethyl lactate
SL-5: Propylene glycol monomethyl ether
SL-6: Cyclohexanone
SL-7: γ-Butyrolactone
SL-8: Propylene carbonate It is apparent from the results shown in Table 1 that the positive resist composition of the invention is excellent in the line edge roughness (LWR), exposure latitude (EL), PEB temperature dependency and pattern collapsing.

[Immersion Exposure Evaluation]

<Preparation of Resist>
Each solution was prepared by dissolving the compositions of Examples 1 to 8 in the solvents as shown in Table 1 and filtered through a polyethylene filter having a pore size of 0.1 μm to prepare a positive resist solution. The positive resist solution thus-prepared was evaluated according to the methods described below.

<Evaluation of Resolution>
An organic anti-reflective coating (ARC29A, produced by Nissan Chemical Industries, Ltd.) was coated on a silicon wafer and baked at 205° C. for 60 seconds to form an anti-reflective coating having a thickness of 78 nm. The positive resist solution prepared above was coated on the anti-reflective coating and baked at 120° C. for 60 seconds to from a resist film having a thickness of 150 nm. The wafer obtained was subjected to two-beam interference exposure (wet exposure) using pure water as the immersion liquid. According to the two-beam interference exposure (wet exposure), the wafer 10 having the anti-reflective coating and resist film was exposed through a prism 8 and the immersion liquid (pure water) 9 using a laser 1, a diaphragm 2, a shutter 3, three reflecting millers 4, 5, 6 and condenser lens 7 as shown in FIG. 1. The wavelength of the laser 1 used was 193 nm. The prism 8 for forming a line and space pattern of 65 nm was used. Immediately after the exposure, the wafer was heated at 120° C. for 60 seconds, developed with an aqueous tetramethylammonium hydroxide solution (2.38% by weight) for 60 seconds, rinsed with pure water and spin-dried to obtain a resist pattern. The resist pattern was observed using a scanning electron microscope (S-9260, produced by Hitachi, Ltd.) and as a result, it was found that a line and space pattern of 65 nm was resolved.

The resist compositions of Examples 1 to 8 exhibited the excellent image-forming property even according to the exposure method through the immersion liquid.

Further, an organic anti-reflective coating (ARC29A, produced by Nissan Chemical Industries, Ltd.) was coated on a silicon wafer and baked at 205° C. for 60 seconds to form an anti-reflective coating having a thickness of 78 nm. The positive resist solution prepared above was coated on the anti-reflective coating and baked at 120° C. for 90 seconds to from a resist film having a thickness of 250 nm. The wafer obtained was subjected to pattern exposure using an ArF excimer laser immersion scanner (NA=0.85). As the immersion liquid, pure water containing 5 ppb or less impurity was used. Then, the exposed wafer was heated at 120° C. for 60 seconds, developed with an aqueous tetramethylammonium hydroxide solution (2.38% by weight) for 30 seconds, rinsed with pure water and spin-dried to obtain a resist pattern.

The positive resist composition of the invention could provide the excellent results same as in a conventional exposure even according to the immersion exposure.

This application is based on Japanese Patent application JP 2006-75068, filed Mar. 17, 2006, the entire content of which is hereby incorporated by reference, the same as if set forth at length.

What is claimed is:

1. A positive resist composition comprising:
a first resin which increases solubility in an alkali developing solution by an action of an acid and comprises a repeating unit containing a lactone structure and a cyano group and a repeating unit containing a first acid-decomposable group;
a second resin which increases solubility in an alkali developing solution by an action of an acid and comprises a repeating unit containing a lactone structure and a cyano group and a repeating unit containing a second acid-decomposable group which is different from the first acid-decomposable group;

a compound which generates an acid upon irradiation of an actinic ray or a radiation; and a solvent.

2. The positive resist composition as claimed in claim 1, wherein a weight ratio of the first resin to the second resin is from 10:90 to 90:10.

3. The positive resist composition as claimed in claim 1, which further comprises a basic compound.

4. The positive resist composition as claimed in claim 1, which further comprises a dissolution inhibiting compound having a molecular weight of 3,000 or less, which is decomposed by an action of an acid to increase solubility in an alkali developing solution.

5. The positive resist composition as claimed in claim 1, which further comprises a surfactant.

6. The positive resist composition as claimed in claim 1, wherein a number of carbon atoms included in a group capable of being released with an acid is 10 or less in at least one of the first and second resins.

7. The positive resist composition as claimed in claim 1, wherein a number of carbon atoms included in a group capable of being released with an acid is 10 or less in both of the first and second resins.

8. The positive resist composition as claimed in claim 1, wherein at least one of the first and second resins is a resin which is decomposed by an action of an acid to increase solubility in an alkali developing solution and includes a monocyclic or polycyclic aliphatic hydrocarbon structure.

9. A pattern formation method comprising:

forming a resist film with the positive resist composition as claimed in claim 1;

exposing the formed resist film; and developing the exposed resist film.

* * * * *